US011767414B2

(12) United States Patent
Stowell et al.

(10) Patent No.: US 11,767,414 B2
(45) **Date of Patent: *Sep. 26, 2023**

(54) COMPOSITE MATERIALS SYSTEMS

(71) Applicant: Lyten, Inc., San Jose, CA (US)

(72) Inventors: Michael W. Stowell, Sunnyvale, CA (US); Bryce H. Anzelmo, Mountain View, CA (US); Bruce Lanning, Littleton, CO (US); Daniel Cook, Woodside, CA (US); Elena Rogojina, San Jose, CA (US); Karel Vanheusden, Woodside, CA (US); Margaret Hines, San Jose, CA (US); John Baldwin, San Jose, CA (US); Chandra B. Kc, San Jose, CA (US)

(73) Assignee: Lyten, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/749,849

(22) Filed: May 20, 2022

(65) Prior Publication Data

US 2022/0275174 A1 Sep. 1, 2022

Related U.S. Application Data

(63) Continuation of application No. 16/784,146, filed on Feb. 6, 2020, now Pat. No. 11,352,481, which is a continuation-in-part of application No. 16/680,162, filed on Nov. 11, 2019, now Pat. No. 10,907,031, which is a continuation of application No. 16/284,764, filed on Feb. 25, 2019, now Pat. No. 10,472,497.

(60) Provisional application No. 62/711,016, filed on Jul. 27, 2018, provisional application No. 62/636,710, filed on Feb. 28, 2018, provisional application No. 62/937,147, filed on Nov. 18, 2019, provisional application No. 62/801,757, filed on Feb. 6, 2019.

(51) Int. Cl.

| | |
|---|---|
| ***C08K 9/02*** | (2006.01) |
| ***C01B 32/194*** | (2017.01) |
| ***C08K 3/04*** | (2006.01) |
| ***C08K 11/00*** | (2006.01) |
| ***C08K 13/08*** | (2006.01) |
| ***H01J 37/32*** | (2006.01) |

(52) U.S. Cl.

CPC .............. *C08K 9/02* (2013.01); *C01B 32/194* (2017.08); *C08K 3/04* (2013.01); *C08K 11/00* (2013.01); *C08K 13/08* (2013.01); *H01J 37/32229* (2013.01); *C01B 2204/02* (2013.01); *C01B 2204/04* (2013.01); *C01B 2204/30* (2013.01); *C01P 2004/24* (2013.01); *C08K 2201/011* (2013.01); *H01J 2237/338* (2013.01)

(58) Field of Classification Search

CPC ............ C08K 9/02; C08K 3/04; C08K 11/00; C08K 13/08; C08K 2201/011

See application file for complete search history.

(56) References Cited

U.S. PATENT DOCUMENTS

| | | | | |
|---|---|---|---|---|
| 5,143,709 | A | 9/1992 | Labes | |
| 6,156,114 | A | 12/2000 | Bell et al. | |
| 6,383,301 | B1 | 5/2002 | Bell et al. | |
| 8,034,321 | B2 | 10/2011 | Mauthner et al. | |
| 8,222,579 | B2 | 7/2012 | Taguchi et al. | |
| 8,632,633 | B2 | 1/2014 | Barker et al. | |
| 8,821,745 | B2 | 9/2014 | Luo et al. | |
| 9,051,185 | B2 | 6/2015 | Levendis et al. | |
| 10,756,334 | B2 | 8/2020 | Stowell et al. | |
| 11,352,481 | B2 * | 6/2022 | Stowell | C08K 11/00 |
| 2005/0123647 | A1 | 6/2005 | Harutyunyan | |
| 2009/0220767 | A1 | 9/2009 | Schlogl et al. | |
| 2010/0056819 | A1 | 3/2010 | Jang et al. | |
| 2010/0206363 | A1 | 8/2010 | Choi | |
| 2011/0206946 | A1 | 8/2011 | Schmidt et al. | |
| 2013/0310495 | A1 | 11/2013 | Kim et al. | |

(Continued)

FOREIGN PATENT DOCUMENTS

| | | |
|---|---|---|
| CN | 104528690 B | 8/2016 |
| CN | 106398802 A | 2/2017 |

(Continued)

OTHER PUBLICATIONS

Andrews, R. et al., "Carbon nanotube polymer composites", Current Opinion in Solid State and Materials Science, vol. 8, (2004), pp. 31-37.

Bakir, M. et al., "Novel metal-carbon nanomaterials: A review on covetics", Advanced Materials Letters, vol. 8, No. 9, pp. 884-890; 2017.

International Search Report and Written Opinion dated Apr. 11, 2019 for PCT Appl. No PCT/US2018/066271; 12 pages.

International Search Report and Written Opinion dated Jun. 12, 2019 for PCT Appl No. PCT/US2019/019812; 9 pages.

(Continued)

*Primary Examiner* — Edward J Cain

(74) *Attorney, Agent, or Firm* — Paradice & Li LLP

(57) ABSTRACT

Methods include producing tunable carbon structures and combining carbon structures with a polymer to form a composite material. Carbon structures include crinkled graphene. Methods also include functionalizing the carbon structures, either in-situ, within the plasma reactor, or in a liquid collection facility. The plasma reactor has a first control for tuning the specific surface area (SSA) of the resulting tuned carbon structures as well as a second, independent control for tuning the SSA of the tuned carbon structures. The composite materials that result from mixing the tuned carbon structures with a polymer results in composite materials that exhibit exceptional favorable mechanical and/or other properties. Mechanisms that operate between the carbon structures and the polymer yield composite materials that exhibit these exceptional mechanical properties are also examined.

14 Claims, 34 Drawing Sheets

(56) References Cited

U.S. PATENT DOCUMENTS

| | | | |
|---|---|---|---|
| 2014/0030181 | A1 | 1/2014 | Liu et al. |
| 2014/0313636 | A1 | 10/2014 | Tour et al. |
| 2015/0344643 | A1 | 12/2015 | Al-Harthi et al. |
| 2018/0073110 | A1 | 3/2018 | Balachandran et al. |
| 2018/0099871 | A1 | 4/2018 | Tanner et al. |
| 2019/0233611 | A1 | 8/2019 | Nosker et al. |
| 2019/0264004 | A1 | 8/2019 | Stowell et al. |
| 2020/0381708 | A1 | 12/2020 | Stowell et al. |

FOREIGN PATENT DOCUMENTS

| | | | |
|---|---|---|---|
| WO | 2015/099462 | A1 | 7/2015 |
| WO | 2016/135328 | A1 | 9/2016 |
| WO | 2019/126196 | A1 | 6/2019 |
| WO | 2019/168967 | A1 | 9/2019 |

OTHER PUBLICATIONS

Kowbel et al., Effect of carbon fabric whiskerization on mechanical properties of C-C composites, Composites Part A: Applied Science and Manufacturing, vol. 28, Issue 12, 1997, Available online May 20, 1998, 993-1000.

Mittal et al., A review on carbon nanotubes and graphene as fillers in reinforced polymer nanocomposites. Journal of Industrial and Engineering Chemistry, 21, 2015, Available online Mar. 18, 2014, pp. 11-25.

Tikhomirov et al., The chemical vapor infiltration of exfoliated graphite to produce carbon/carbon composites, Carbon, vol. 49, Issue 1, Jan. 2011, pp. 147-153.

Wang, H. et al., “Improvement of interfacial interaction and mechanical properties in copper matrix composites reinforced with copper coated carbon nanotubes”. Materials and Sci. Eng. A, vol. 715, pp. 163-173; Feb. 7, 2018.

* cited by examiner

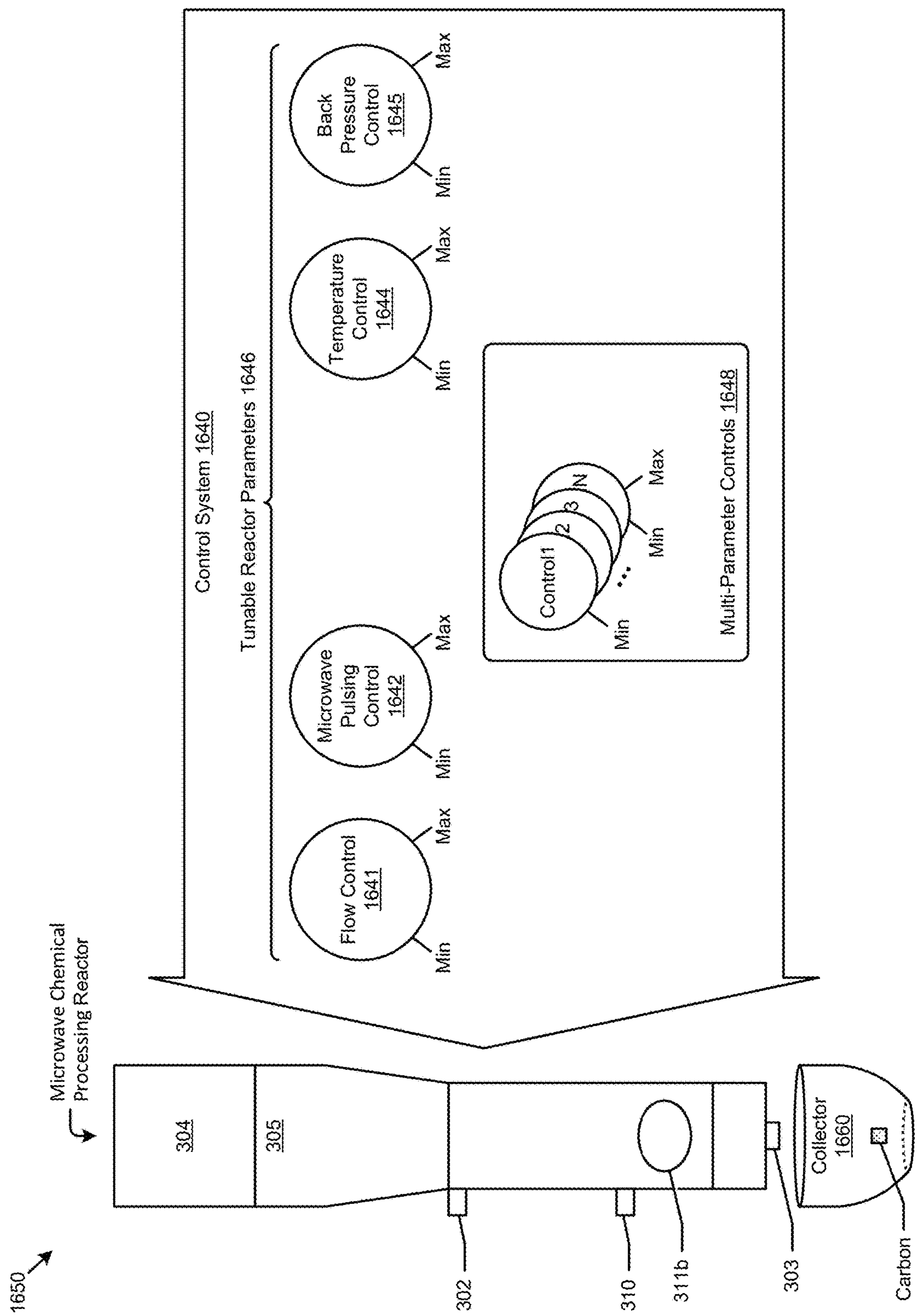
FIG. 16B1

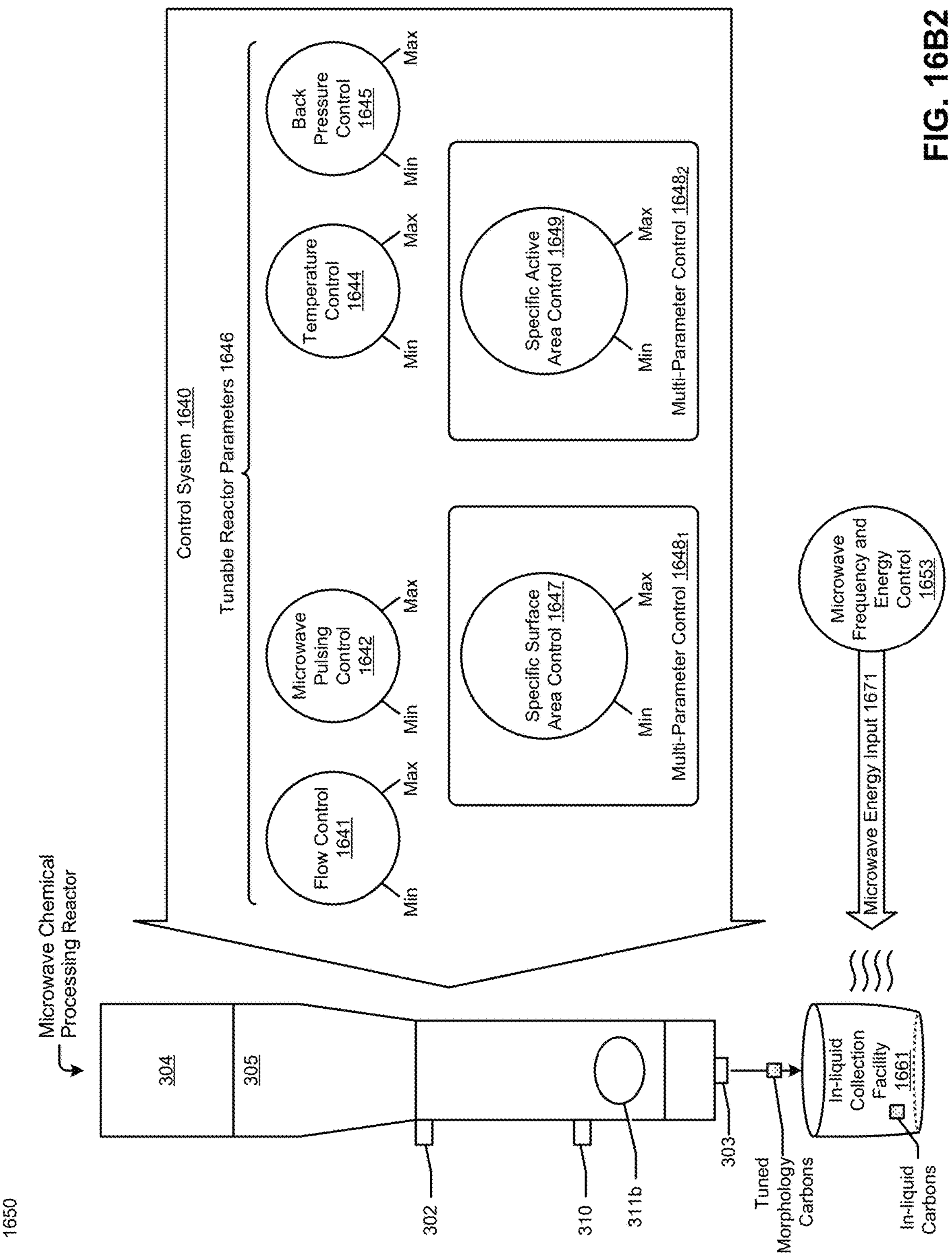
FIG. 16B2

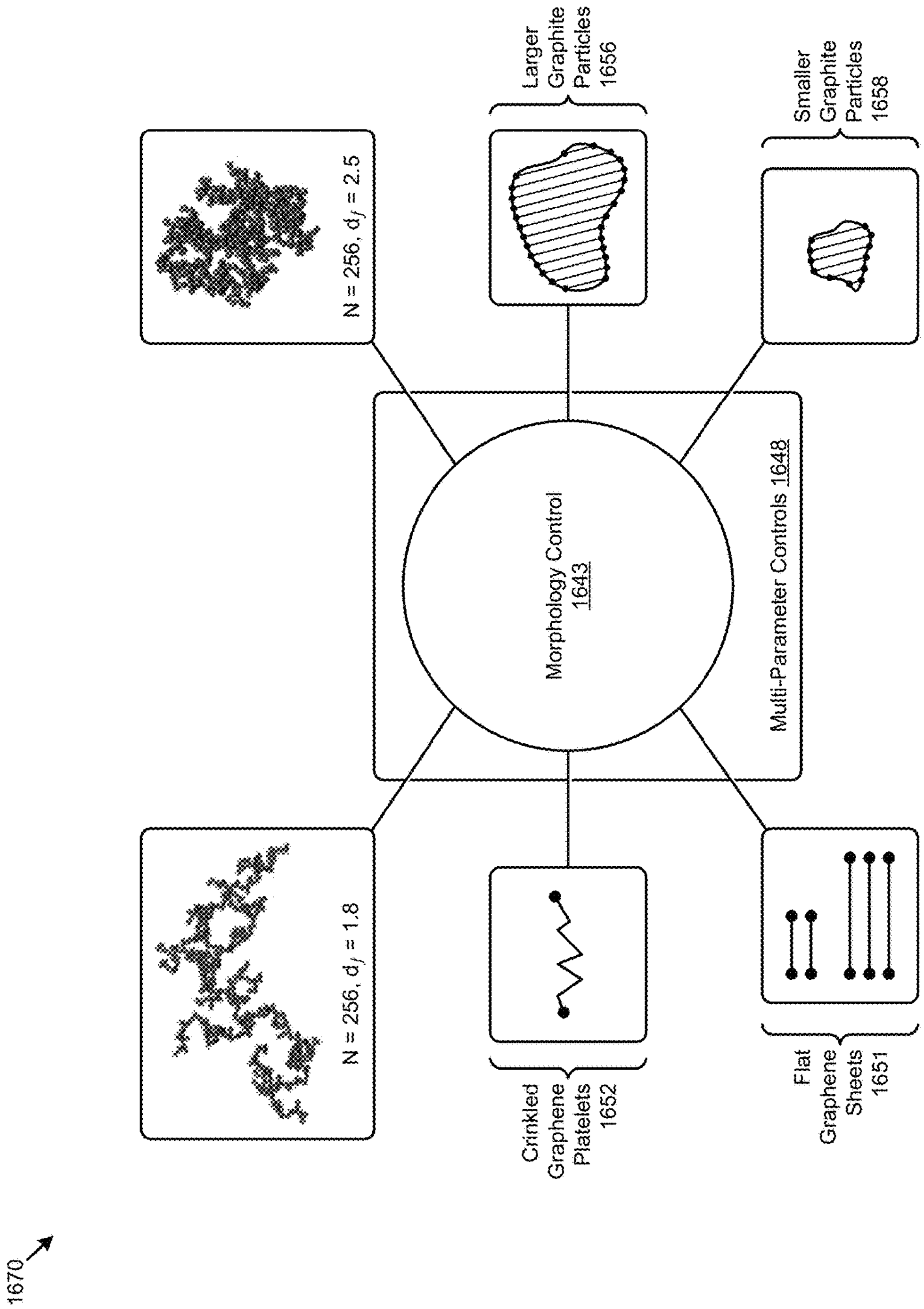
FIG. 16B3

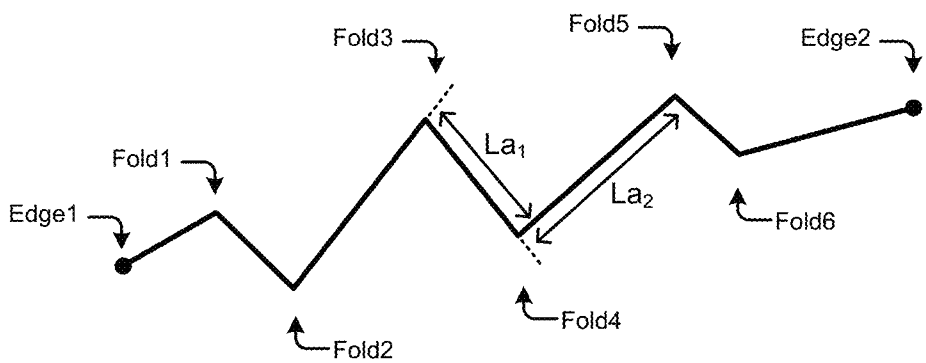
Legend
$La_X$ is the average Raman crystallite size between folds.
NOTE
D/G ratio (at peak intensities) is proportional to the number of folds.
FIG. 16B4

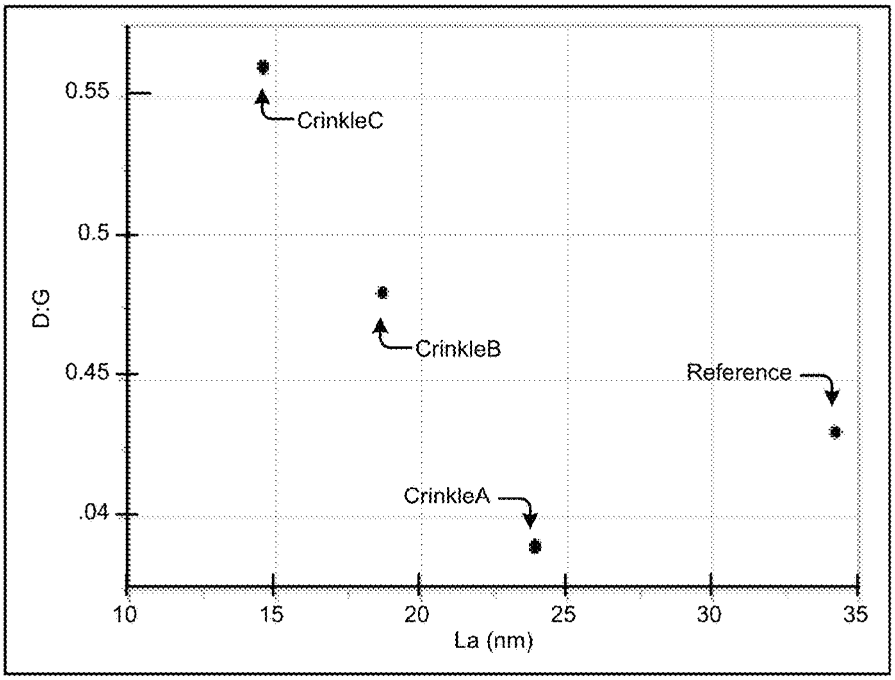
FIG. 16C1
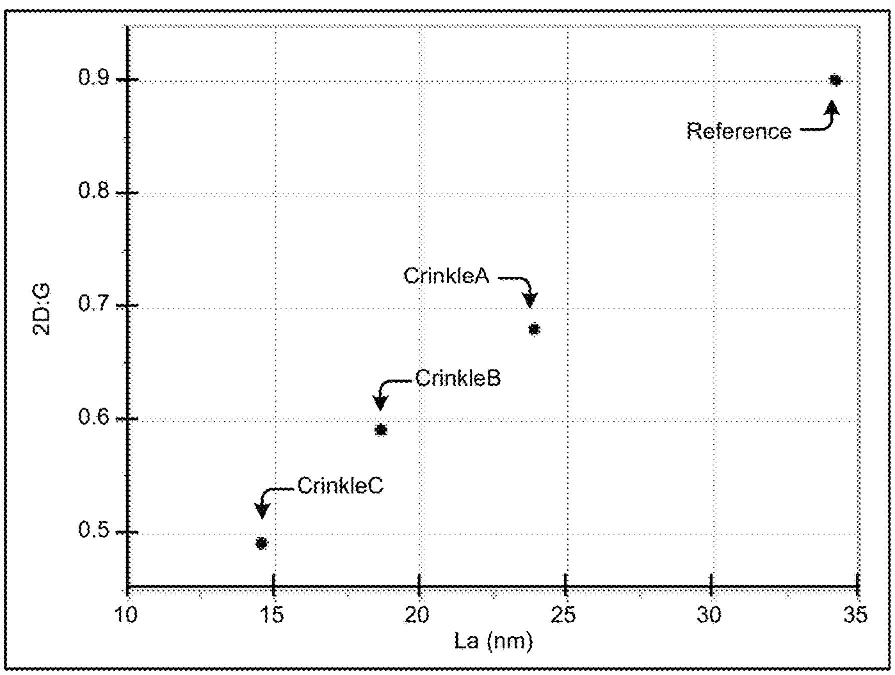
FIG. 16C2

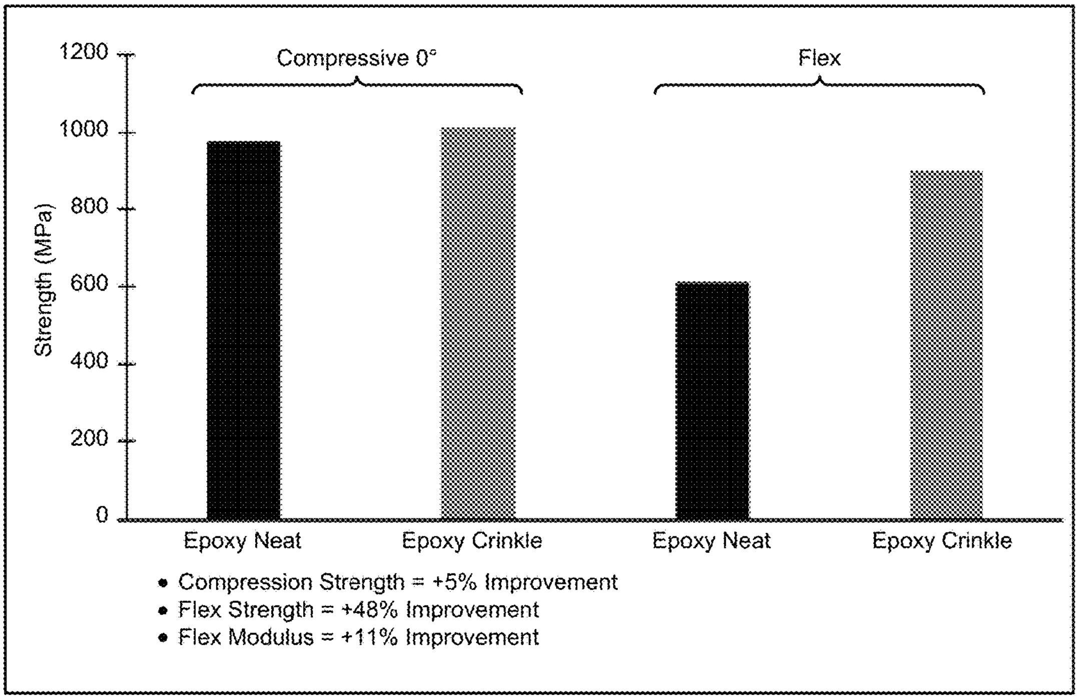
FIG. 18C1
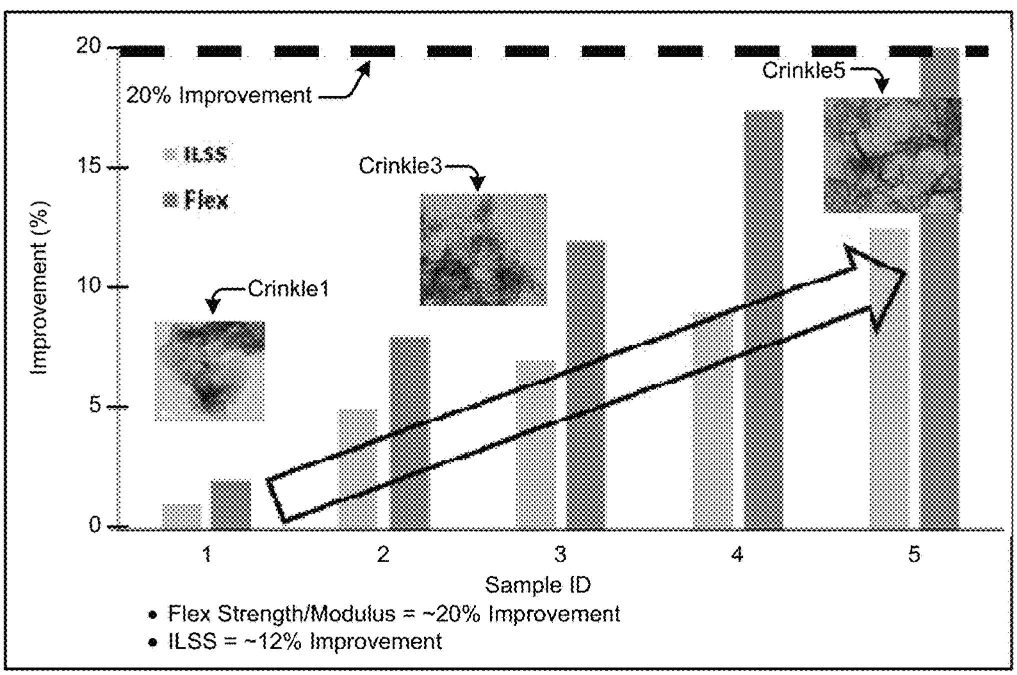
FIG. 18C2

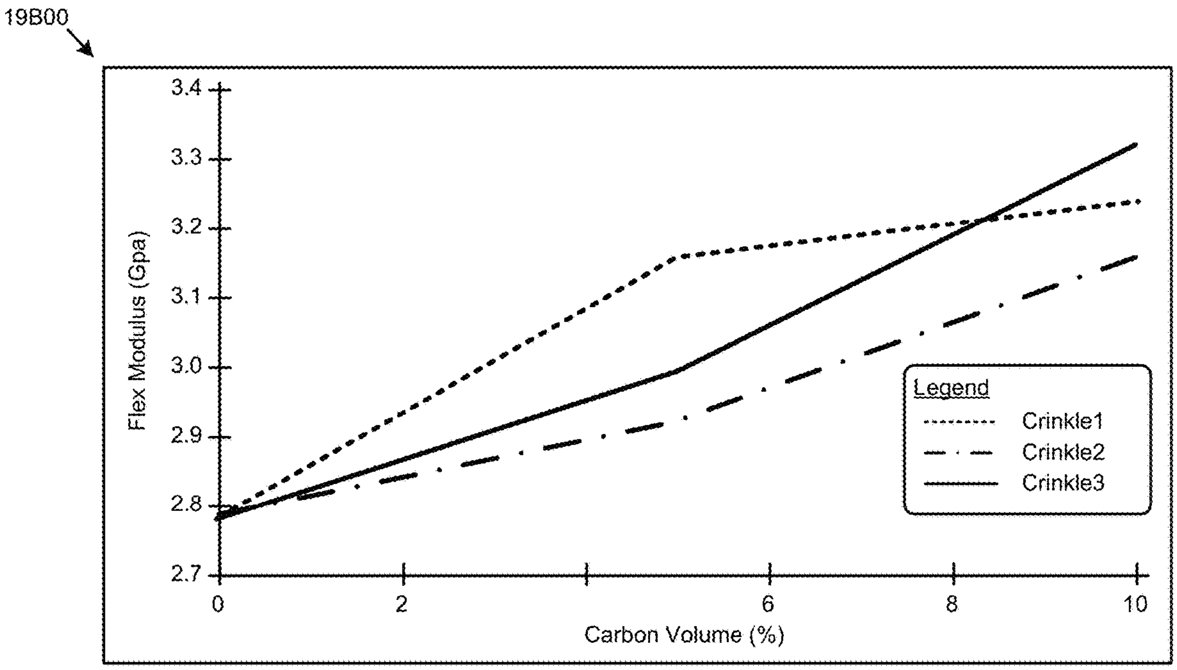
FIG. 19B1
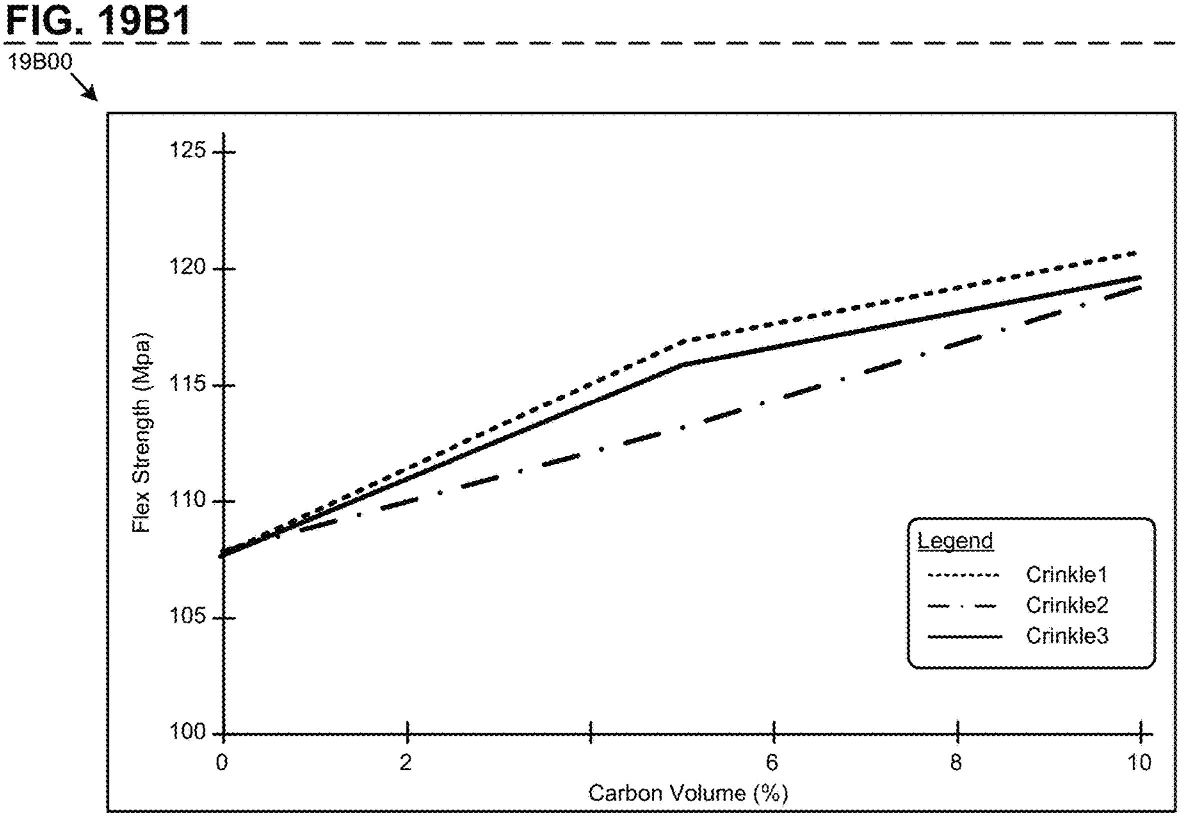
FIG. 19B2

COMPOSITE MATERIALS SYSTEMS

CROSS-REFERENCE TO RELATED APPLICATIONS

This application is a continuation application of U.S. patent application Ser. No. 16/784,146 entitled "Composite Materials Systems" and filed on Feb. 6, 2020, which is a continuation-in-part application of U.S. patent application Ser. No. 16/680,162 filed on Nov. 11, 2019 (now U.S. Pat. No. 10,907,031), which claims priority to and is a continuation of U.S. patent application Ser. No. 16/284,764 filed on Feb. 25, 2019 (now U.S. Pat. No. 10,472,497), which claims priority to U.S. Provisional Patent Application No. 62/636,710 entitled "Composite Materials" and filed on Feb. 28, 2018, which claims priority to U.S. Provisional Patent Application No. 62/711,016 entitled "Composite Materials" and filed on Jul. 27, 2018; the present application also claims priority to U.S. Provisional Patent Application No. 62/937,147 filed Nov. 18, 2019 and to U.S. Provisional Patent Application No. 62/801,757 filed Feb. 6, 2019, all of which are hereby incorporated by reference.

TECHNICAL FIELD

This disclosure relates to protective enclosures for electronic systems, and more particularly to techniques for tuning frequency selective surfaces of such protective enclosures.

BACKGROUND

Composite materials are commonly formed by mixing carbon materials and sometimes fibers with polymer resins to enhance the properties of a formed composite, such as enhance mechanical, electrical and other properties. For example, carbon can serve as a reinforcement material, providing high tensile strength to the formed composite while being lightweight. In another example, carbon can be used to increase electrical conductivity in an otherwise non-conductive polymer.

Extensive research has been performed on ways to improve the performance of polymer composite materials. Mixing techniques such as solution mixing and melt processing, with associated parameters such as types of solvents and varying viscosities, have been studied to improve the uniformity of dispersion of carbon material in the resin. Aligning carbon fibers and CNTs within a polymer melt, and the effects of alignment on resulting properties of the formed composite have also been studied. Chemical techniques to functionalize carbon have been utilized in an attempt to increase bonding interaction between carbon and polymers.

Unfortunately, graphene sheets or graphene-like carbon structures suffer from an inability to provide enough active sites for functionalization and bonding with the polymer, and unfortunately graphite particles or graphite-derived particles suffer from an inability to provide enough surface area for bonding with the polymer. What is needed is a way to make carbon structures that exhibit both high surface area as well as high active area. What is needed is a way to make and use carbons that exhibit a morphology that differs from either graphene sheets or graphite particles.

SUMMARY

Methods include producing tuned carbon structures in a plasma reactor and/or other reactors and combining the tuned carbon structures with a polymer to form a composite material. The tuned carbon structures include crinkled graphene. Methods also include functionalizing the tuned carbon structures, either in-situ within the plasma reactor, in a liquid collection facility, or in another post-processing facility. The plasma reactor has a first control for tuning the specific surface area of the resulting tuned carbon structures as well as a second, independent control for tuning the specific active area of the tuned carbon structures. The composite materials that result from mixing the tuned carbon structures with a polymer results in composite materials that exhibit exceptional mechanical properties. The physical and chemical mechanisms that operate between the crinkled graphene and the polymer are the cause of these exceptional mechanical properties.

BRIEF DESCRIPTION OF THE DRAWINGS

The drawings described below are for illustration purposes only. The drawings are not intended to limit the scope of the present disclosure.

FIG. 16B1 depicts a system for synthesizing 3D carbons that are tuned to correspond to a desired morphology, in accordance with some implementations.

FIG. 16B2 shows a reactor having a set of independently variable multi-parameter controls, in accordance with some implementations.

FIG. 16B3 shows a morphology selection technique that is implemented by multi-parameter controls, in accordance with some implementations.

FIG. 16B4 is a schematic showing a morphology of crinkled platelet composed of flat crystallites of various length ($La_1$, $La_2$, etc.) fused together at platelet folds, in accordance with some implementations.

FIG. 16C1 shows D:G intensities ratio of D- and G-bands in Raman spectra measured for several crinkle morphologies as compared to a reference, in accordance with some implementations.

FIG. 16C2 shows 2D:G intensities ratio of 2D- and G-bands in Raman spectra measured for several crinkle morphologies as compared to a reference, in accordance with some implementations.

FIG. 18C1 shows improvements in both compressive and flex strength over a reference, in accordance with some implementations.

FIG. 18C2 shows improvements in both interlaminar shear strength and flex strength over a reference sample, in accordance with some implementations.

FIG. 19B1 show improvements in flex modulus as the carbon loading volume is increased, in accordance with some implementations.

FIG. 19B2 show improvements in flex strength as the carbon loading volume is increased, in accordance with some implementations.

DETAILED DESCRIPTION

Figure 1A:
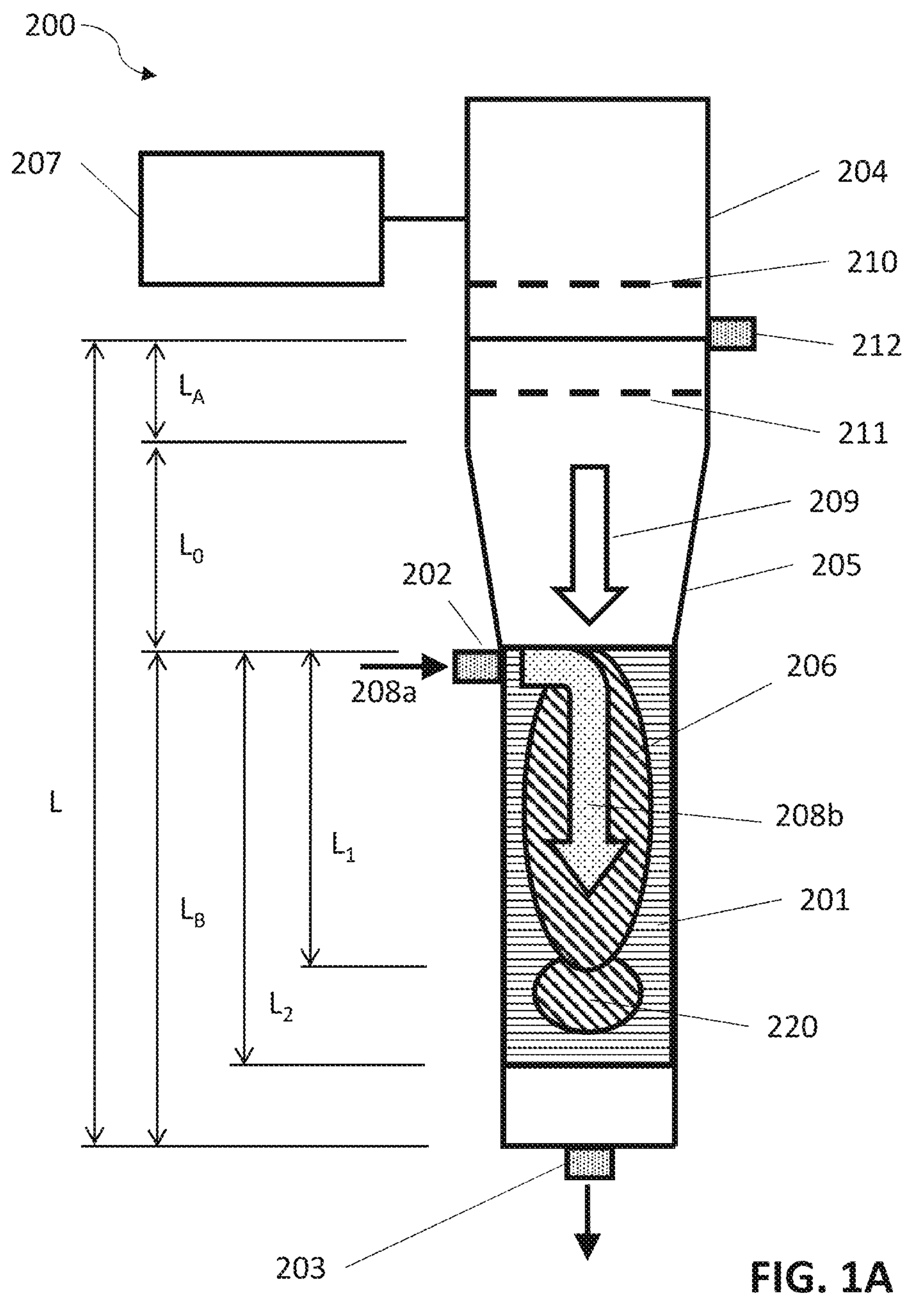
FIGS. 1A-1B are schematic diagrams of plasma reactors, in accordance with some implementations.

The present implementations disclose methods of fabricating carbon-resin composites through creation and functionalization of unique carbon materials using unique plasma reactors. Described in this disclosure are forms of carbon to be used in composite materials, methods of making carbon (including forming and functionalizing carbon materials), and methods of making carbon-resin composite materials. The carbon materials are incorporated into composite materials mixtures for customizing materials properties such as flexural modulus, tensile strength, compressive modulus, fracture toughness and interlaminar shear strength. These unique carbon additives can be tuned in their construction and concentration to provide final composite materials with desired properties. For example, the composite materials can be customized to have high strength and rigidity or to be semi-flexible. In another example, the composites can be tuned to have high moduli where minimal torsion and damaging relaxation is desired.

Implementations include methods for creating and processing carbon materials for composite material production in situ in a plasma reactor, enabling streamlined processes and reducing the need for wet chemistry techniques compared to conventional methods. In some implementations, carbon materials are created by a hydrocarbon cracking process in a microwave plasma reactor. Implementations may include additional reactor technology, such as thermal reactors, in conjunction with plasma reactors. In some cases, the produced carbon materials are also functionalized to be compatible with a resin in a functionalization process occurring in the same plasma reactor as used to produce the carbon materials. In some implementations, the created carbon materials are particles, with or without functionalization, which can be combined with resins in the reactor to form a composite material. The carbon particles that are used as starting materials for the present composite materials may include graphene, spherical carbons (carbon nano-onions (CNOs), which may also be referred to as multi-walled spherical fullerenes (MWSF) or multi-shell fullerenes), and/or carbon nanotubes (CNTs). The carbon particles may have a unique 3-dimensional (3D) structure in X, Y and Z dimensions, such as graphene structures that form a pore matrix (such as, void spaces, cavities or openings) and that include sub-particles of single layer graphene (SLG), few layer graphene (FLG) and/or many layer graphene (MLG). The pore matrix and high surface area of the present 3D structures enhance interlocking of the resin with the carbon materials, improving the interfacial strength and adhesion between the resin and carbon materials and thus improving properties of the resulting composite material.

In some implementations, the carbon particles are well-dispersed and highly integrated with the resin due to a 3D structure of the carbon materials and/or the functionalization of the carbon particles. For example, prior to being combined with the resin, the starting materials in various implementations can be functionalized in a reactor, such as by chemical doping (such as, using sulfur or metals) of the carbon particles or by attaching functional groups (such as, COOH, OH, epoxy, etc.) and maintaining a specific environment within and around the materials to ensure and promote carbon-polymer bonding. The functionalizing can promote bonding of the carbon particles to the resin via chemical bonding, such as covalent bonding, or ionic bonding, physical bonding such as, hydrogen and/or pi-pi bonding, frictional forces or the combination thereof. The reaction conditions and processes for the covalent functionalization methods are more challenging to achieve than those of physical and non-covalent bonding methods, however the complexity is warranted since the stability of the functional graphene obtained by doping and covalent bonding methods is strongly desired.

The carbon particles in various implementations can be initially supplied into the composite material as nanometer to micron size aggregates. In some implementations, the carbon aggregates or particles are broken into smaller particle sizes while being mixed with the resin, where newly-exposed carbon surfaces from the breaking up of the particles provide enhanced bonding to the resin compared to surfaces exposed to an ambient (non-resin) environment prior to being combined with the resin. In some implementations, the carbon particles can be engineered with defects to control the locations of fracture and the sizes of the fragmented particles, thus providing customization of properties of the composite material.

Implementations of the present composite materials may be any polymer system with the present carbon materials, and optionally with fiber reinforcement. In some implementations, fibers such as carbon composite fillers (CCFs) or non-CCF materials are added to the composite materials. Enhancements provided by the present composite materials include, for example, increased toughness compared to conventional composites and moldable carbon materials (with or without non-CCF or CCF additives). The carbon materials add value to CCF composites by providing a stronger, tougher, customizable modulus (such as, rigid versus flexible) than conventional CCF composites, and by providing injectable carbon matrix materials. In some implementations, the fibers serve as a reinforcing material in addition to carbon particle additives and provide an additional parameter that can be tuned to adjust the properties of the composite materials (such as, to form a carbon-resin composite material with anisotropic materials properties). In some implementations, the fibers are introduced into the reactor to provide sites onto which the carbon particle additives are grown, thereby forming an integrated 3D structure for combining with a resin.

The carbon-resin composites and methods of making composites of the present disclosure provide numerous benefits. Some implementations enable higher strength composites with improved qualities, such as toughened resins where plastic versus elastic behavior can be managed. In some implementations, high strength can be achieved without increasing viscosity of the uncured polymer-carbon mixture, in contrast to conventional composites in which higher reinforcement typically leads to a product of higher filler load, and thus higher viscosity of the uncured polymer-carbon mixture. In some implementations, the present methods and materials also enable tunability, such as an ability to fabricate a specific carbon structure or backbone to chemically bond other materials or elements to the carbon, or such as to provide a specific orientation of carbon particles with respect to the polymer chains within the resin structure. Some implementations enable the ability to engineer fracture planes into the carbon materials to allow for stress band orientation, leading to an end specification particle size that also enables customization of the composite material. In some implementations, 3D-structured carbon materials provide a 3D growth network which results in superior carbon-polymer bonding.

3D carbon materials created by the present methods can enable improved composite properties. In one example, modification of energy transfer—that is, the distribution of force or stress to the resin, fibers and carbon particles within the composite matrix—is achieved within fiber-reinforced composite systems. In other words, the stress/energy transfer is allowed to spread out across a broader area/volume and can be diffused across several reinforced fiber plies or a larger polymer area. In another example, energy dissipation within the system is managed to relieve or concentrate forces, such as by engineering structures to allow for energy movement into or along a specified plane. In a further example, crack propagation is mitigated by stress termination that is enabled by the present carbon materials. Toughened resins may also be formulated, where plastic versus elastic behavior can be managed. In some implementations, high strength can be achieved without increasing viscosity. This is in contrast to behaviors of conventional composites in which higher reinforcement typically results from higher viscosity.

Resin materials that may be combined with carbons to make the composite materials of the present disclosure include, but are not limited to, thermosets, thermoplastics, polyesters, vinyl esters, polysulfones, epoxies (including high viscosity epoxies such as novolacs, or others), rigid amines, polyimides, and other polymers systems or the combination thereof.

In this disclosure, the combined carbon and resin composite materials may be referred to as "carbon-resin composites," carbon-polymer composites," "composite materials," "composite materials systems," "matrix resin" or "composites." The terms "resin," "polymer" and "binder" shall be used interchangeably for the material to be combined with a type of carbon to form the composite material, in an uncatalyzed or pre-catalyzed state. The carbon particles that are mixed with the resin may be referred to as "starting particles," "added carbon particles", "carbon additives," or "filler." The terms "voids," "void spaces," "pores," or "pore matrix" shall be used interchangeably to mean spaces, cavities or openings within and around carbons, that may be through-holes or closed-end spaces and that form a continuous and/or discontinuous porous network or matrix.

Types of resin systems that may be combined with carbon to form the present composite materials include: resins in which a cross-linking agent or a hardening agent is used to cure the composite materials system; two-part systems in which a first is mixed with a second material that is a hardening agent; and thermoplastics that are above a glass transition temperature when the carbon is added. In some implementations, the present carbon materials are functionalized with a first material and then are added to a second material, such that the carbon serves as a vehicle to add the first material to the second material (where one material may be a resin and the other material which may be a catalyst and/or cross linker). Additionally, the carbon particles may have resin and/or hardener surrounding or bonded to them and the carbon particles can be supplied to the missing or additional components to make the complete final composites system.

In the present disclosure, the term "graphene" refers to an allotrope of carbon in the form of a two-dimensional, atomic-scale, hexagonal lattice in which one atom forms each vertex. The carbon atoms in graphene are predominantly $sp^2$-bonded. Additionally, graphene has a Raman spectrum with three main peaks: a G-mode at approximately 1580 $cm^{-1}$, a D-mode at approximately 1350 $cm^{-1}$, and a 2D-mode peak at approximately 2690 $cm^{-1}$ (when using a 532 nm excitation laser). In the present disclosure, a single layer of graphene is a single sheet of hexagonally arranged (such as predominantly $sp^2$-bonded) carbon atoms. It is known that the ratio of the intensity of the 2D-mode peak to the G-mode peak (such as, the 2D/G intensity ratio) is related to the number of layers in the graphene. A higher 2D/G intensity ratio corresponds to fewer layers in multilayer graphene materials. In different implementations of the present disclosure, graphene contains fewer than 15 layers of carbon atoms, or fewer than 10 layers of carbon atoms, or fewer than 7 layers of carbon atoms, or fewer than 5 layers of carbon atoms, or fewer than 3 layers of carbon atoms, or contains a single layer of carbon atoms, or contains from 1 to 10 layers of carbon atoms, or contains from 1 to 7 layers of carbon atoms, or contains from 1 to 5 layers of carbon atoms. In some implementations, few layer graphene (FLG)

contains from 2 to 7 layers of carbon atoms. In some implementations, many layer graphene (MLG) contains from 7 to 15 layers of carbon atoms.

In the present disclosure, the term "graphite" refers to an allotrope of carbon in the form of a two-dimensional, atomic-scale, hexagonal lattice in which one atom forms each vertex. The carbon atoms in graphite are predominantly $sp^2$-bonded. Additionally, graphite has a Raman spectrum with two main peaks: a G-mode at approximately 1580 $cm^{-1}$, and a D-mode at approximately 1350 $cm^{-1}$ (when using a 532 nm excitation laser). Similar to graphene, graphite contains layers of hexagonally arranged (such as, predominantly $sp^2$-bonded) carbon atoms. In different implementations of the present disclosure, graphite can contain greater than 15 layers of carbon atoms, or greater than 10 layers of carbon atoms, or greater than 7 layers of carbon atoms, or greater than 5 layers of carbon atoms, or greater than 3 layers of carbon atoms.

In the present disclosure, the term "fullerene" refers to an allotrope of carbon of carbon in the form of a hollow sphere, ellipsoid, tube, or other shapes. Spherical fullerenes can also be referred to as Buckminsterfullerenes, or buckyballs. Cylindrical fullerenes can also be referred to as carbon nanotubes. Fullerenes are similar in chemical structure to graphite, which is composed of stacked graphene sheets of linked hexagonal rings. Fullerenes may also contain pentagonal (or sometimes heptagonal) rings.

In the present disclosure, the term "multi-walled fullerene" refers to fullerenes with multiple concentric layers. For example, multi-walled nanotubes (MWNTs) contain multiple rolled layers (concentric tubes) of graphene. Multi-walled spherical fullerenes (MWSFs) which may also be referred to as multi-shell fullerenes (MSFs) contain multiple concentric spheres of fullerenes.

In the present disclosure, the term "particle" refers to a plurality of sub-particles or nanoparticles that are connected together by carbon-carbon bonds, Van der Waals forces, covalent bonds, ionic bonds, metallic bonds, or other physical or chemical interactions. Particles, which may also be referred to as aggregates, can vary in size considerably, but in general are larger than about 500 nm and are made up of a subset of particles, such as, primary particles. Throughout this disclosure, the terms "particle" or "particles" are generic terms that can include any size particles. Sub-particles can include one or more type of structure (such as, crystal structure, defect concentration, etc.), and one or more type of atom. The sub-particles can be any shape, including but not limited to spherical shapes, spheroidal shapes, dumbbell shapes, cylindrical shapes, elongated cylindrical type shapes, rectangular prism shapes, disk shapes, wire shapes, irregular shapes, dense shapes (such as, with few voids), porous shapes (such as, with many voids), etc.

Microwave Reactors

Methods of the present implementations utilize unique plasma reactors that enable creation of carbon particles, modification of the carbon particles to be resin-compatible and combining the carbon with the resin—all within the same reactor during the process in which the carbon particles are created. Although implementations shall be described using microwave energy as an example, the present disclosure applies generally to high-frequency plasma reactors that utilize radio frequencies, along with bands such as very high frequency (VHF, 30 MHz to 300 MHz), ultra-high frequency (UHF, 300 MHz to 3 GHz), or microwave frequency (such as, 915 MHz or above, such as 2.45 GHz, or 5.8 GHz). Furthermore, although implementations shall primarily be described in terms of plasma reactors, the present methods may include the use of other reactor technologies (such as, thermal reactors) in conjunction with the plasma reactors.

In some implementations, the present carbon materials are produced using microwave plasma reactors and/or methods as described in U.S. Pat. No. 9,812,295, entitled "Microwave Chemical Processing," or in U.S. Pat. No. 9,767,992, entitled "Microwave Chemical Processing Reactor," which are assigned to the same assignee as the present application, and are incorporated herein by reference as if fully set forth herein for all purposes.

In some implementations, microwave plasma chemical processing of process precursor materials (such as, hydrocarbon gases, or liquid mixtures) is used to produce the carbon particles, sub-particles (such as, nanoparticles) and aggregates described herein. More specifically, microwave plasma chemical processing of precursor materials using various techniques, including pulsing of the microwave radiation to control the energy of the plasma, can be used to produce the carbon particles and sub-particles described herein. The ability to control the energy of the plasma enables the selection of one or more reaction pathways in conversion of the precursor materials into specific separated components. Pulsed microwave radiation can be used to control the energy of the plasma, because the short-lived high-energy species that are created when a plasma ignites can be re-generated at the start of each new pulse. The plasma energy is controlled to have a lower average ion energy than conventional techniques, but at a high enough level to enable the targeted chemical reactions to occur at high precursor material flows and high pressures. In some implementations, a pressure within the waveguide is at least 0.1 atmosphere.

In some implementations, the process material is a gas. In some implementations, the process material is a hydrocarbon gas, such as $C_2H_2$, $C_2H_4$, $C_2H_6$. In some implementations, the process material is methane, and the separated components are hydrogen and nanoparticulate carbon. In some implementations, the process material is carbon dioxide with water, and the separated components are oxygen, carbon and water.

The microwave reactors used in the present implementations may utilize a "field-enhancing waveguide" (FEWG), which refers to a waveguide with a first cross-sectional area and a second cross-sectional area, where the second cross-sectional area is smaller than the first cross-sectional area and is farther away from the microwave energy source than the first cross-sectional area. The decrease in cross-sectional area enhances the field by concentrating the microwave energy, with the dimensions of the waveguide being set to maintain propagation of the specific microwave frequency being used. The second cross-sectional area of the FEWG extends along a reaction length that forms the reaction zone of the FEWG. There is a field-enhancing zone between the first cross-sectional area and the second cross-sectional area of a FEWG. That is, in some implementations, the field-enhancing zone of the FEWG has a decreasing cross-sectional area between a first cross-sectional area and a second cross-sectional area of the field-enhancing waveguide, where the second cross-sectional area is smaller than the first cross-sectional area. A reaction zone is formed by the second cross-sectional area extending along a reaction length of the field-enhancing waveguide. A microwave energy source is coupled to the field-enhancing waveguide and provides microwave energy into the first cross-sectional area of the field-enhancing zone, where the microwave energy propagates in a direction along the reaction length of the reaction zone. The microwave plasma reactor is absent of a dielectric barrier between the field-enhancing zone and the reaction zone.

Definitions and Use of Figures

Some of the terms used in this description are defined below for easy reference. The presented terms and their respective definitions are not rigidly restricted to these definitions—a term may be further defined by the term's use within this disclosure. The term "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application and the appended claims, the term "or" is intended to mean an inclusive "or" rather than an exclusive "or". That is, unless specified otherwise, or is clear from the context, "X employs A or B" is intended to mean any of the natural inclusive permutations. That is, if X employs A, X employs B, or X employs both A and B, then "X employs A or B" is satisfied under any of the foregoing instances. As used herein, at least one of A or B means at least one of A, or at least one of B, or at least one of both A and B. In other words, this phrase is disjunctive. The articles "a" and "an" as used in this application and the appended claims should generally be construed to mean "one or more" unless specified otherwise or is clear from the context to be directed to a singular form.

Various implementations are described herein with reference to the figures. It should be noted that the figures are not necessarily drawn to scale, and that elements of similar structures or functions are sometimes represented by like reference characters throughout the figures. It should also be noted that the figures are only intended to facilitate the description of the disclosed implementations—they are not representative of an exhaustive treatment of all possible implementations, and they are not intended to impute any limitation as to the scope of the claims. In addition, an illustrated implementation need not portray all aspects or advantages of usage in any particular environment.

An aspect or an advantage described in conjunction with a particular implementation is not necessarily limited to that implementation and can be practiced in any other implementations even if not so illustrated. References throughout this specification to "some implementations" or "other implementations" refer to a particular feature, structure, material or characteristic described in connection with the implementations as being included in at least one implementation. Thus, the appearance of the phrases "in some implementations" or "in other implementations" in various places throughout this specification are not necessarily referring to the same implementation or implementations. The disclosed implementations are not intended to be limiting of the claims.

Descriptions of Example Implementations

Figure 1B:
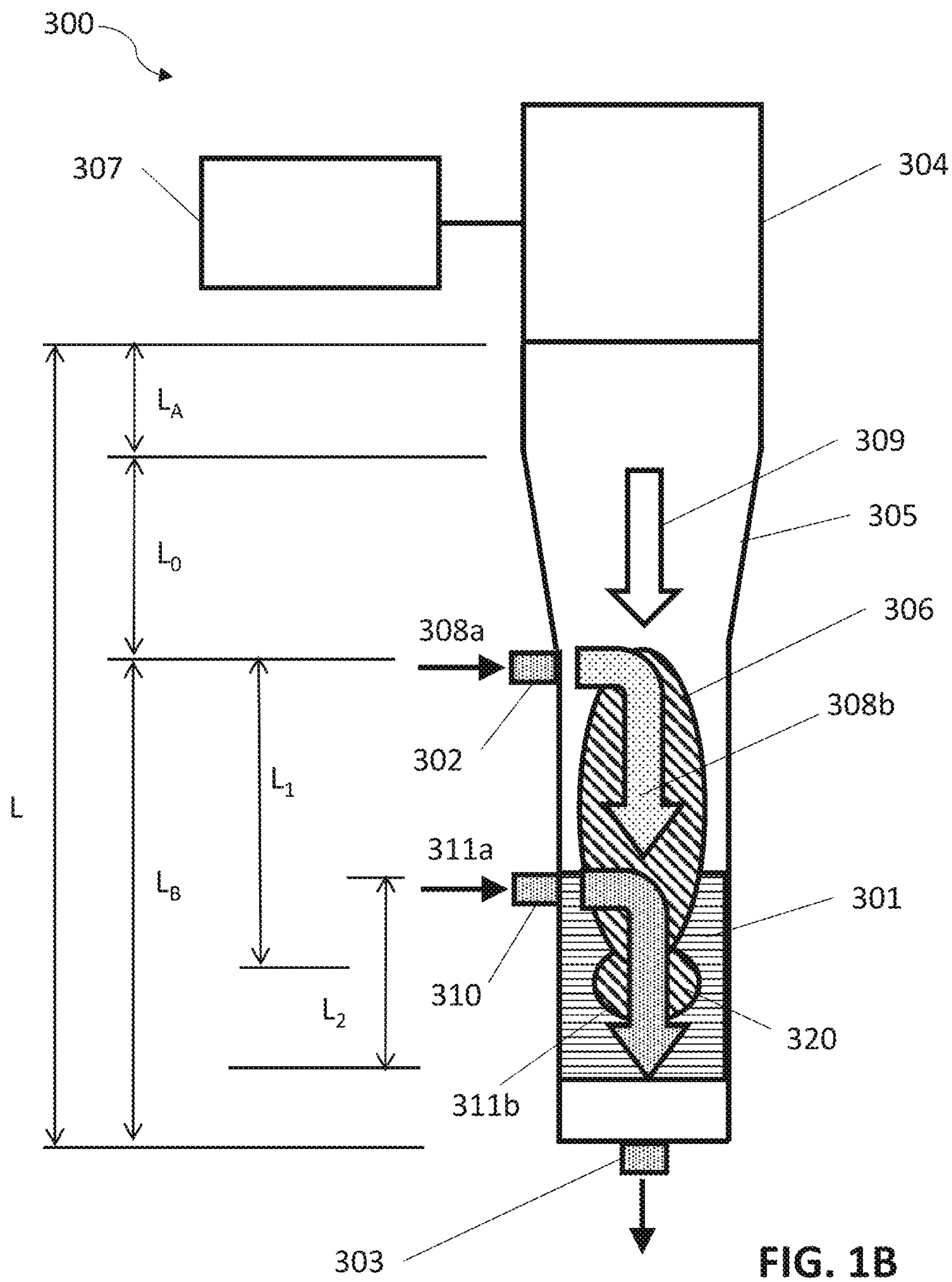

FIGS. 1A and 1B show implementations of microwave chemical processing systems of the present disclosure, in which a FEWG is coupled to a microwave energy generator (such as, a microwave energy source), a plasma is generated from a supply gas in a plasma zone of the FEWG, and a reaction length of the FEWG serves as the reaction zone to separate the process material into separate components. The present reactors as demonstrated by FIGS. 1A and 1B are absent of a dielectric barrier between the field-enhancing zone of the field-enhancing waveguide and the reaction zone. The absence of a dielectric barrier in the present reactors beneficially allows microwave energy to be directly transferred to the input materials (such as, hydrocarbon gases) that are being processed, enabling higher processing temperatures (such as, 3000 K and above)—and in particular, very high localized temperatures (such as, 10,000 K and above)—than conventional reactors. In contrast, the reaction zones of conventional systems are enclosed within a dielectric barrier such as a quartz chamber. Consequently, the microwave energy is used for indirect heating, being used to ionize a carrier gas into a plasma, but the microwave energy itself is not transmitted through the barrier. The direction of propagation of the microwave energy is parallel to the majority of the flow of the supply gas and/or the process material, and the microwave energy enters the waveguide upstream of the portion of the FEWG where the separated components are generated.

As shown in FIG. 1A, a microwave chemical processing reactor, in accordance with some implementations, generally includes a FEWG 205, one or more inlets 202 configured to receive supply gas and/or process material 208*a* flowing into the FEWG 205, and a microwave energy source 204 that is coupled to the FEWG 205, among other elements not shown for simplicity.

In some implementations, microwave circuit 207 controls a pulsing frequency at which microwave energy 209 from microwave energy source 204 is pulsed. In some implementations, the microwave energy 209 from microwave energy source 204 is continuous wave.

The FEWG 205 has a length L. The portion of the FEWG 205 with length $L_A$ (shown in FIG. 1A and FIG. 1B) is closer to the microwave energy generator than the portion of the FEWG with length $L_B$ (shown in FIG. 1A and FIG. 1B). Throughout this disclosure, different portions of the FEWG will be described by a capital L with a subscript denoting the certain portion of the FEWG (such as, $L_A$, $L_0$, $L_B$, $L_1$, $L_2$), and synonymously, the lengths of the different portions of the FEWG will also be described by a capital L with a subscript denoting the length of a certain portion of the FEWG (such as, $L_A$, $L_0$, $L_B$, $L_1$, $L_2$).

The cross-sectional area of the FEWG in length $L_B$ is smaller than the cross-sectional area of the FEWG in length $L_A$. The length of the FEWG $L_0$ is located between lengths $L_A$ and $L_B$ of the FEWG and has a decreasing cross-sectional area along the path of the microwave energy propagation. In some implementations, the cross-sectional area of the FEWG along length $L_0$ decreases in a continuous manner. In some implementations, the cross-sectional area of the FEWG along length $L_0$ decreases linearly between lengths $L_A$ and $L_B$. In some implementations, the cross-sectional area of the FEWG along length $L_0$ decreases non-linearly between lengths $L_A$ and $L_B$, such as decreasing parabolically, hyperbolically, exponentially or logarithmically. In some implementations, the cross-sectional area of the FEWG along length $L_0$ decreases in a or an abrupt manner between lengths $L_A$ and $L_B$, such as decreasing through one or more discrete steps. The decrease in cross-sectional area serves to concentrate the electric field, thus increasing the microwave energy density while still providing a significant amount of area in which plasma can be formed compared to conventional systems. The portion of the FEWG with length $L_B$ (shown in FIG. 1A and FIG. 1B) may have a rectangular cross-section of dimensions 0.75 inches by 3.4 inches when using a microwave energy frequency of 2.45 GHz. This cross-sectional area is much greater than conventional systems where the plasma generation area is generally less than one square inch. The dimensions of the different portions of the FEWG 205 are set according to the microwave frequency, in order to properly function as a waveguide. For example, for an elliptical waveguide the cross-sectional dimensions can be 5.02 inches by 2.83 inches for 2.1-2.7 GHz.

In conventional gas processing systems, the limited region in which plasma can form, such as less than one square inch as described above, constrains the volume in which gas reactions can occur. Also, in conventional systems the microwave energy enters the reaction chamber through a window (typically quartz). In these systems, dielectric materials (such as, particulate carbon) are coated on the window during processing leading to a decreased power delivery over time. This can be highly problematic if these separated components absorb microwave energy because they can prevent the microwave energy from coupling into the reaction chamber to generate the plasma. Consequently, a rapid build-up of by-products, such as carbon particles that are produced from the gas reactions, occurs and limits the run-time of the processing equipment. In the present implementations, the system 200 and system 300 (FIG. 1B) are designed without the use of a window in the reaction zone; that is, using a parallel propagation/gas flow system where the energy enters upstream from the reaction. As a result, more energy and power can be coupled into the plasma from the microwave energy source, enabling higher processing temperatures of hydrocarbon input materials. The lack of a window and the greater volume within the waveguide 205, compared to limited reaction chamber volumes in conventional systems, greatly reduces the issue of particle build-up causing limited run-times, thus improving production efficiency of the microwave processing system.

The microwave energy 209 in FIG. 1A creates a microwave plasma 206 in the supply gas and/or process material within a plasma zone with length $L_1$ (shown in FIGS. 1A-1B) of the length of the FEWG 205. The microwave energy 209 may also propagate into the reaction zone to directly interact with the process material flow 208*b*. The plasma zone with length $L_1$ is located within the portion of the FEWG $L_B$, where the cross-sectional area is smaller, and the microwave energy density is higher than in length $L_A$. In some implementations, a supply gas that is different from the process material is used to generate the microwave plasma 206. The supply gas may be, for example, hydrogen, helium, a noble gas such as argon, or mixtures of more than one type of gas. In other implementations, the supply gas is the same as the process material, where the process material is the material from which separated components are being created.

In some implementations, the supply gas and/or process material inlet 202 is located upstream from the portion of the FEWG $L_B$, or is located within the portion of the FEWG $L_0$, or is located within the portion of the FEWG $L_A$, or is located upstream of the portion of the FEWG $L_A$. In some implementations, the portion of the FEWG $L_1$ extends from a position along the FEWG downstream from the position where the supply gas and/or process material 208*a* enters the FEWG, to the end of the FEWG or to a position between the entrance of the supply gas and/or process material and the end of the FEWG 205. In some implementations, the portion of the FEWG $L_1$ extends from where the supply gas and/or process material 208*a* enters the FEWG, to the end of the FEWG or to a position between the entrance of the supply gas and/or process material and the end of the FEWG.

The generated plasma 206 provides energy for reactions to occur in process material 208*b* within a reaction zone 201 of the FEWG 205 having a reaction length $L_2$. In some implementations, reaction zone $L_2$ extends from where the process material 208*a* enters the FEWG 205, to the end of the FEWG 205 or to a position between the entrance of the process material and the end of the FEWG 205. Given the right conditions, the energy in the plasma 206 will be sufficient to form separated components from the process material molecules. Additional hydrocarbon cracking reactions and/or modifications of produced carbon materials may occur in high temperature plume 220, which may also be referred to as a plasma afterglow. In some implementations, further input materials may be introduced into the reactor at inlet 202. For example, elements may be introduced during or just after producing the carbon materials in order to functionalize the carbon materials (such as, to enhance bonding with a resin) or to add resins (such as, bond, embed) to the carbon materials. One or more outlets 203 are configured to collect the separated products out of the FEWG 205 downstream of the reaction zone portion 201 of the FEWG where reactions occur in the process material 208*b*. In the example shown in FIG. 1A, the propagation direction of the microwave energy 209 is parallel with the majority of the supply gas and/or process material flow 208*b*, and the microwave energy 209 enters the FEWG 205 upstream of the reaction zone 201 of the FEWG where the separated components are generated.

In some implementations, a pressure barrier 210 that is transparent to microwave energy can be located within the microwave energy source 204, near the outlet of the microwave energy source, or at other locations between the microwave energy source 204 and the plasma 206 produced in the FEWG. This pressure barrier 210 can serve as a safety measure to protect from potential backflow of plasma into the microwave energy source 204. Plasma does not form at the pressure barrier itself; instead, the pressure barrier is simply a mechanical barrier. Some examples of materials that the pressure barrier can be made of are quartz, ethylene tetrafluoroethylene (ETFE), other plastics, or ceramics. In some implementations, there can be two pressure barriers 210 and 211, where one or both pressure barriers 210 and 211 are within the microwave energy source 204, near the outlet of the microwave energy source, or at other locations between the microwave energy source 204 and the plasma 206 produced in the FEWG. In some implementations, the pressure barrier 211 is closer to the plasma 206 in the FEWG than the pressure barrier 210, and there is a pressure blowout port 212 between the pressure barriers 210 and 211 in case the pressure barrier 211 fails.

In some implementations, a plasma backstop (not shown) is included in the system to prevent the plasma from propagating to the microwave energy source 204 or the supply gas and/or process material inlet(s) 202. In some implementations, the plasma backstop is a ceramic or metallic filter with holes to allow the microwave energy to pass through the plasma backstop, but preventing the majority of the plasma species from passing through. In some implementations, the majority of the plasma species will be unable to pass the plasma backstop because the holes will have a high aspect ratio, and the plasma species will recombine when they hit the sidewalls of the holes. In some implementations, the plasma backstop is located between portion $L_0$ and $L_1$, or within portion $L_0$ upstream of portion $L_1$ and downstream of the inlet(s) 202 (in an implementation where inlet 202 is within portion $L_0$) and the microwave energy source 204.

FIG. 1B shows another implementation of a microwave chemical processing system 300 in which a supply gas and a process material are injected at different locations. The microwave chemical processing system 300, in accordance with some implementations, generally includes a FEWG 305, one or more supply gas inlets 302 configured to receive supply gas 308*a* flowing into the FEWG 305, one or more process material inlets 310 configured to receive process material 311*a*, and a source of microwave energy 304 that is coupled to the FEWG 305, among other elements not shown for simplicity. The location of process material inlet 310 is downstream of the location of supply gas inlet 302, where downstream is defined in a direction of the microwave energy propagation.

In some implementations, microwave circuit 307 controls a pulsing frequency at which microwave energy 309 from microwave energy source 304 is pulsed. In some implementations, the microwave energy from microwave energy source 304 is continuous wave.

The microwave energy 309 creates a microwave plasma 306 in the supply gas 308*b* within a plasma zone $L_1$ of the length L of the FEWG 305. In some implementations, portion $L_1$ extends from a position along the FEWG 305 downstream from the position where the supply gas 308*a* enters the FEWG 305, to the end of the FEWG 305 or to a position between the entrance of the supply gas and the end of the FEWG 305. In some implementations, portion $L_1$ extends from where the supply gas 308*a* enters the FEWG 305, to the end of the FEWG 305 or to a position between the entrance of the supply gas and the end of the FEWG 305. One or more additional process material inlets 310 are configured to receive process material flowing into the FEWG at a second set of locations downstream of the supply gas inlet(s) 302. The generated plasma 306 provides energy for reactions to occur within the reaction zone 301 of the FEWG 305 having a reaction length $L_2$. In some implementations, portion $L_2$ extends from where the process material 311*a* enters the FEWG 305, to the end of the FEWG 305 or to a position between the entrance of the process material and the end of the FEWG 305. Given the right conditions, the energy in the plasma will be sufficient to form separated components from the process material molecules. Additional hydrocarbon cracking reactions and/or modifications of produced carbon materials may occur in high temperature plume 320.

In some implementations, further input materials may be introduced into the reactor at process material inlet 310. For example, elements may be introduced during or just after producing the carbon materials in order to functionalize the carbon materials (such as, to enhance bonding with a resin) or to add resins (such as, bond, embed) to the carbon materials. One or more outlets 303 are configured to collect the separated products out of the FEWG 305 downstream of the portion 301 where reactions occur. In the example system 300 shown in FIG. 3, the propagation direction of the microwave energy 309 is parallel with the majority of the supply gas flow 308*b* and the process material flow 311*b*, and the microwave energy 309 enters the FEWG 305 upstream of the reaction portion 301 of the FEWG where the separated components are generated.

In some implementations, the FEWG (such as, 205 in FIG. 1A, and 305 in FIG. 1B) is configured to maintain a pressure from 0.1 atm to 10 atm, or from 0.5 atm to 10 atm, or from 0.9 atm to 10 atm, or greater than 0.1 atm, or greater than 0.5 atm, or greater than 0.9 atm. In many conventional systems, the microwave chemical processing is operated at vacuum. However, in the present implementations with the plasma being generated within the FEWG, operating in a positive pressure environment assists in preventing the generated plasma from feeding back into the microwave energy source (such as, 204 in FIG. 1A, and 304 in FIG. 1B).

The FEWG (such as, 205 in FIG. 1A, and 305 in FIG. 1B) may have a rectangular cross-section within length $L_B$ of dimensions 0.75 inches by 3.4 inches, to correspond to a microwave energy frequency of 2.45 GHz. Other dimensions of $L_B$ are possible for other microwave frequencies, and dependent upon waveguide mode these cross-sectional dimensions can be from 3-6 inches. The FEWG (such as, 205 in FIG. 1A, and 305 in FIG. 1B) may have a rectangular cross-section within length $L_A$ of dimensions 1.7 inches by 3.4 inches, for example, to correspond to a microwave energy frequency of 2.45 GHz. Other dimensions of $L_A$ are possible for other microwave frequencies. Notably, the FEWG serves as the chamber in which the plasma is generated and the process material reactions to occur, rather than having a separate waveguide and quartz reaction chamber as in conventional systems. Having the FEWG serve as the reactor chamber provides a much larger volume in which gas reactions can occur (such as, up to 1000 L). This enables high flow rates of process material to be processed, without being limited by a build-up of carbon particulate as occurs in conventional systems. For example, process material flow rates through the inlet (such as, 202 in FIG. 1A, and 310 in FIG. 1B) into the waveguide (such as, 205 in FIG. 1A, and 305 in FIG. 1B) may be from 1 slm (standard liters per minute) to 1000 slm, or from 2 slm to 1000 slm, or from 5 slm to 1000 slm, or greater than 1 slm, or greater than 2 slm, or greater than 5 slm. Supply gas flow rates through the inlet (such as, 202 in FIG. 1A, and 302 in FIG. 1B) into the waveguide (such as, 205 in FIG. 1A, and 305 in FIG. 1B) may be, for example, from 1 slm to 1000 slm, or from 2 slm to 1000 slm, or from 5 slm to 1000 slm, or greater than 1 slm, or greater than 2 slm, or greater than 5 slm. Dependent upon the gas plasma properties that result in sufficient plasma density (such as, secondary electron emission coefficient) the flows can be from 1 slm to 1000 slm and with pressures up to 14 atm.

In some implementations, multiple FEWGs may be coupled to one or more energy sources (such as, microwave energy sources). The FEWGs in these implementations can share some or all of the features of the systems described above. The supply gas and process material inputs in these implementations can also share some or all of the features described above. In some implementations, each FEWG has a reaction zone. In some implementations, a plasma is generated from a supply gas in a plasma zone in each of the FEWGs, and a reaction length of each of the FEWGs serve as reaction zones to separate the process material into separate components. In some implementations, the reaction zones are connected together, and the microwave chemical processing system has one outlet for the separated components. In some implementations, the reaction zones are connected together, and the microwave chemical processing system has more than one outlet for the separated components. In some implementations, each reaction zone has its own outlet for the separated components. Multi-chamber reactors in some implementations may allow for carbon materials to be produced and modified without additional processing, and/or to be directly input into a resin/polymer. Other examples of multi-component (such as, multiple reaction zones, multiple energy sources) are described in the aforementioned U.S. Pat. No. 9,767,992.

3D Carbon Structures

Figure 2:
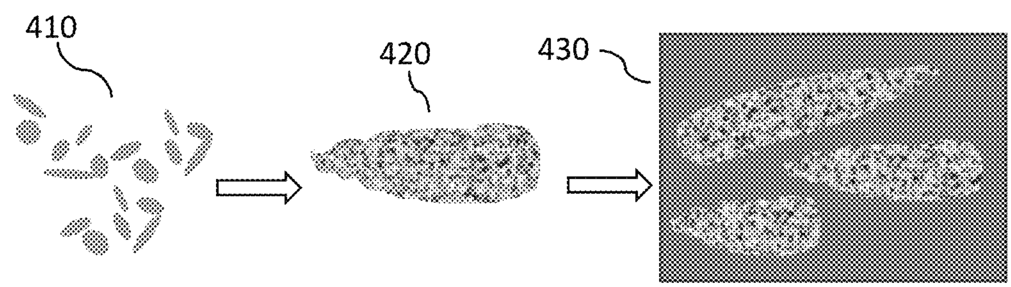
FIG. 2 is a schematic of forming a composite with graphene nanoplatelets, as known in the art.

The present composite materials and methods include creation of high surface area 3D carbon materials that include pore matrix structures (such as, voids or open spaces within and around sub-particles of a carbon particle) for incorporation into composite materials for strength and conductivity. Using graphene as an example type of carbon, conventional graphite or two-dimensional (2D) graphene nanoplatelet (GNP) materials are typically elongated shapes that have a planar surface and are on the order of 200 μm long. To form a conventional composite with GNPs as shown in the schematic of FIG. 2, the GNPs 410 are encased in a first resin to form particles 420, the particles 420 are dried, and then the particles 420 are added into a second resin to form a composite 430. Thus, in these conventional GNP-resin composites the GNPs are simply encased in the first resin, and the strength of the composite 430 is typically limited by the resin-to-resin bonds between the first resin that is used to form particles 420 and the second resin into which the particles 420 are dispersed. Conventional GNP composites (such as, without functionalized GNP) typically cannot be strengthened without affecting the elastic modulus, and delamination often occurs since the GNPs are not chemically attached to each other or to the bulk resin.

In contrast, 3D carbon structures, such as 3D graphene structures, of the present methods and materials have an innately 3D-connected matrix that form longer-range materials acting as 3D robust structures, adding strength in three dimensions. The 3D carbon structures enable polymer to penetrate into a pore matrix of the structure, providing mechanical interlocking between the carbon and polymer through both the geometry of the structures and high surface area. The 3D carbons may also be functionalized, as shall be described in more detail subsequently, promoting chemical connections through carbon-to-resin bonds. Additionally, composites formed from the 3D carbon materials can provide independent control of strength and modulus by tailoring geometry of the 3D structure of the carbons.

Figure 3A:
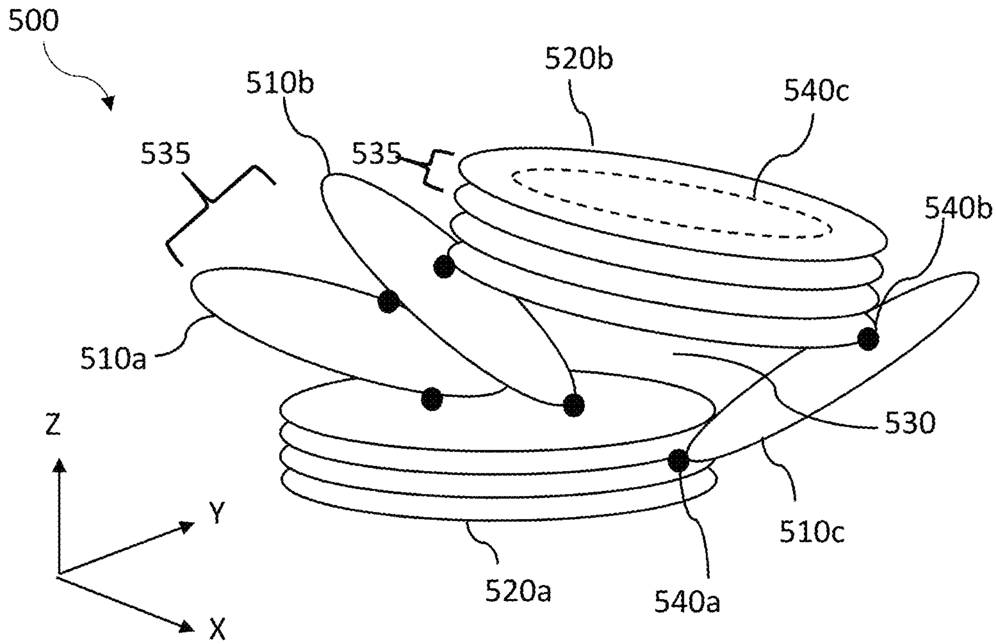
FIG. 3A is a schematic diagram of a 3D graphene particle, in accordance with some implementations.

FIG. 3A is a schematic diagram of a carbon particle 500 which is a 3D graphene particle according to some implementations. Unlike other 3D forms of carbon materials, the unique structure of the present plasma-created 3D carbon materials (such as, graphene nanoplatelets) is structured as a pore matrix. The 3D graphene particles may include graphene nanoplatelet sub-particles, where the sub-particles are in the form of single layer graphene (SLG) sub-particles, few layer graphene (FLG) sub-particles and/or many layer graphene (MLG) sub-particles. The carbon particle 500 is illustrated with SLG sub-particles 510*a*, 510*b*, 510*c* and FLG sub-particles 520*a*, 520*b*. The 3D graphenes of the present disclosure may contain only one form of graphene, such as only SLG, FLG, or MLG, or may be a combination of one or more forms, such as SLG and FLG or SLG and MLG. In some implementations, the 3D graphene may be predominantly FLG, such as greater than 50%, or greater than 70%, or greater than 90% FLG sub-particles in the carbon particle 500. In some implementations, the 3D graphene may be predominantly MLG or SLG, such as greater than 50%, or greater than 70%, or greater than 90% of MLG or SLG sub-particles in the carbon particle 500. Although the particle 500 is shown with only GNPs, the carbon particles of the present disclosure may include other allotropes of carbon such as, but not limited to, CNOs, CNTs and nanowires.

The graphene nanoplatelet sub-particles form a pore matrix by being grown and connected 3-dimensionally. That is, the 3D graphene particle 500 grows in an X-Y plane as well as Z-direction, where SLG sub-particles 510*a*, 510*b* and 510*c* and FLG sub-particles 520*a* and 520*b* grow at various angles relative to each other during formation of the sub-particles, such as orthogonally and at acute angles. For example, FLG sub-particle 520*a* may be formed first during hydrocarbon cracking, then SLG sub-particles 510*a*, 510*b* and 510*c* may be grown from edge and/or basal plane locations of FLG sub-particle 520*a*. FLG sub-particle 520*a* has graphene layers with growth primarily oriented in the X-Y plane, while SLG sub-particles 510*a*, 510*b* and 510*c* are grown with their basal planes oriented out of the X-Y plane and into the Z-direction.

Consequently, the overall growth of graphene particle 500 is in the X-Y plane as well as in the Z-direction. The various sub-particles of particle 500 are interconnected in a variety of edge and basal (planar surface) locations, where the connections 540*a*, 540*b* and 540*c* may be carbon-carbon bonds due to the connections being formed during formation of the graphene sub-particles. Connection 540*a* is in an edge-to-edge location between an edge of FLG sub-particle 520*a* and an edge of SLG sub-particle 510*c*, while connection 540*b* is in an edge-to-basal plane location between an edge of FLG sub-particle 520*b* and a basal plane of SLG sub-particle 510*c*. Connection 540*c* is in a basal plane-to-basal plane location between graphene nanoplatelet layers of FLG sub-particle 520*b*. These connections between sub-particles provide a pore matrix in a 3D manner that is beneficial for incorporation into composite materials. The connections between sub-particles may be, for example, through covalent or non-covalent bonds between the carbon lattices of two or more sub-particles, such as through the growth of one sub-particle that is initiated from a site in another sub-particle. The 3D graphene structure may also include curling, wrinkling or folding of the nanoplatelets, where these features are retained as three-dimensional geometries due to interconnections with surrounding sub-particles.

Figure 3B:
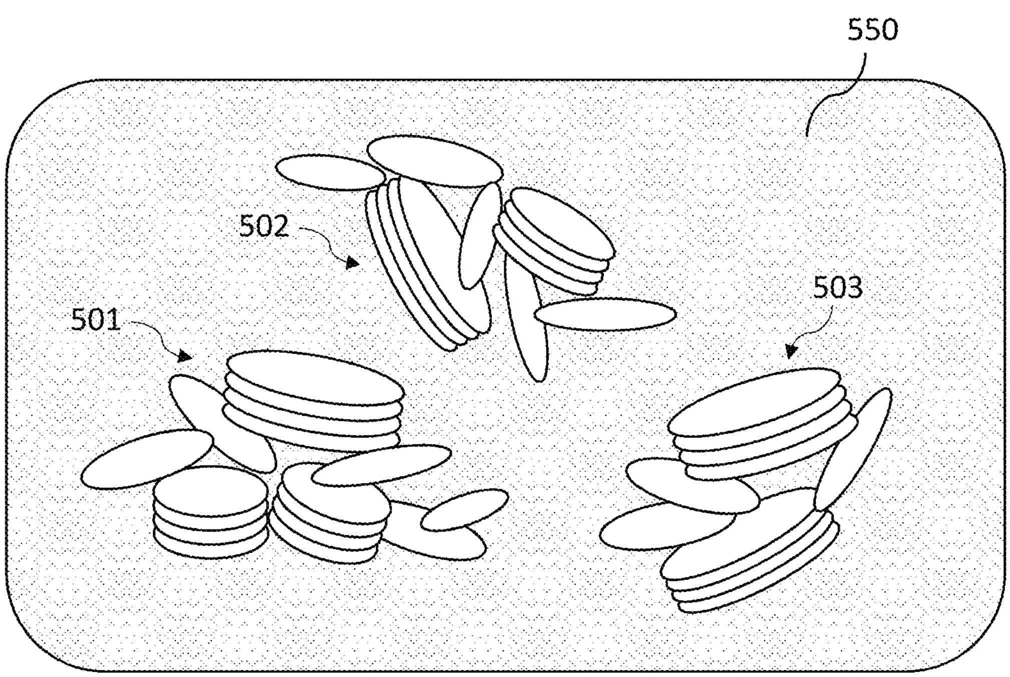
FIG. 3B is a schematic of a composite material of 3D graphene and a polymer, in accordance with some implementations.

FIG. 3B shows 3D graphene particles 501, 502 and 503 incorporated into a polymer 550, according to some implementations. The 3D graphene particles 501, 502 and 503 may be as-formed in a reactor or may be particles that have been reduced in size from a larger particle formed in a reactor. The particles 501, 502 and 503 are shown as being dispersed in the polymer 550, which may be facilitated by bonding of the particles 501, 502 and 503 with the polymer 550 through tailoring of the particles in the reactor (such as, by functionalization and/or mixing the polymer with the particle as shall be described elsewhere in this disclosure).

The 3D carbon structures of the present materials provide a pore matrix, serving as a scaffold structure into which resin can permeate and interlock. The pores may be between sub-particles as indicated by pore 530 or may be between layers of MLG or FLG as indicated by pores 535. Pores of the present 3D carbon materials may also be referred to as openings, holes, or recesses into which resin can penetrate and entangle with the carbon particles, such as to increase the mechanical strength between the carbon additives and polymer. The pores also provide a high amount of surface area for the carbon to bond to the resin. In some implementations, the pores may have a pore width of, for example, 1 nm to greater than 50 nm. The pores may be produced in bimodal or single mode, with very narrow pore widths. In some implementations, the carbon particles have a mesoporous structure with a wide distribution of pore sizes (such as, a multimodal distribution). For example, mesoporous particulate carbon can contain multimodal distribution of pores with sizes from 0.1 nm to 10 nm, from 10 nm to 100 nm, from 100 nm to 1μ, and/or larger than 1μ. For example, the pore structure can contain pores with a bimodal distribution of sizes, including smaller pores (such as, with sizes from 1 nm to 4 nm) and larger pores (such as, with sizes from 30 nm to 50 nm). Not to be limited by theory, such a bimodal distribution of pore sizes in a mesoporous carbon particle material can be beneficial in composite resin systems by enabling tuning of properties. For example, a greater number of larger pores can be used to increase tensile strength, while a greater number of smaller pores may be used to increase elastic modulus. In some cases, the void space distribution (such as, pore size distribution) within the structures can be bimodal or multi-modal, and various modes of the distribution of pore sizes can be tailored to the end composite product to customize (such as, maximize, minimize, or achieve a desired range of properties such as physical, mechanical, chemical and/or electrical properties). By way of a non-limiting example, the void spaces may comprise a significant percentage of larger void spaces (such as, 50% or greater), where larger void spaces break up easier than smaller void spaces allowing for the materials to reinforce in different ways.

The present 3D carbon materials provide benefits over conventional carbon materials. For example, conventional 3D graphene may consist of crumpled graphene sheets. Graphene sheets are typically desirable as the hexagonal carbon lattice structure is innately continuous along the plane of the sheets. Conventionally, graphene sheets are connected to each other from basal plane to basal plane, forming stacked layers where any gaps between layers of these long graphene sheets are likely to collapse. In contrast, connecting nanoplatelets together as in implementations of the present 3D carbon materials is counterintuitive as compared to a graphene sheet where the carbons are already connected. Yet, a 3D structure of graphene nanoplatelets connected at various locations provides a structure with a fixed open porosity in which the pores (such as, gaps or openings into which resin can permeate and bond with) are not likely to collapse (such as, be compressed or reduced in size). In addition, the connections between graphene layers and between sub-particles, in a variety of locations such as edge-to-edge, edge-to-basal plane and basal plane-to-basal plane, can provides larger pores than between stacked layers of essentially parallel sheets as in conventional graphenes.

Because carbon-to-carbon bonds connecting the sub-particles are formed during growth of the carbon particles (rather than non-carbon bonds between already-formed sub-particles, where the non-carbon bonds may also contain contaminants), properties such as electrical conductivity and thermal conductivity are improved in the present 3D carbon materials. Furthermore, in some implementations the locations and numbers of 3D interconnections between sub-particles may be customized to achieve certain characteristics. For example, having a combination of edge-to-edge, edge-to-basal plane and/or basal plane-to-basal plane connections may enable properties (such as, electrical and/or thermal conductivity) to be multi-directional (such as, X, Y and Z directions; 3-dimensional) instead of primarily in the X-Y plane as with conventional graphene sheets. This multi-directionality of properties may be useful in reducing the need to orient carbon materials within a composite material.

Not to be limited by theory, edge-to-basal plane connections between GNPs may reduce the energy levels need for electrons to jump between GNPs. In one example, an edge-to-basal plane connection may enable an electron that is traveling on a basal plane of a first GNP to reroute around a naturally-occurring defect (such as, vacancy) in the first GNP by jumping to a second GNP which is connected via a carbon-carbon bond at its edge to the basal plane of the first GNP. Thus, the 3D connections between GNPs enables electrons to be unconfined and travel out of the basal plane, resulting in a higher electrical conductivity than 2D electron flow paths of conventional platelets.

Figure 4A:
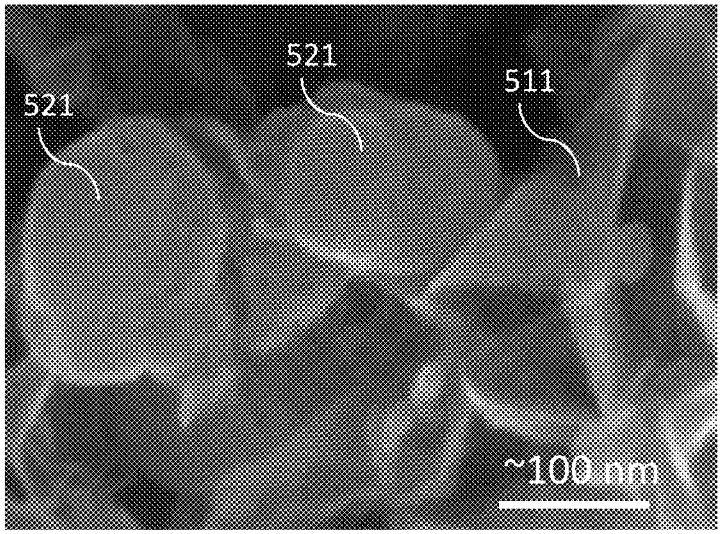
FIGS. 4A-4E are scanning electron microscope (SEM) images of carbon materials combined with resins, in accordance with some implementations.
Figure 4B:
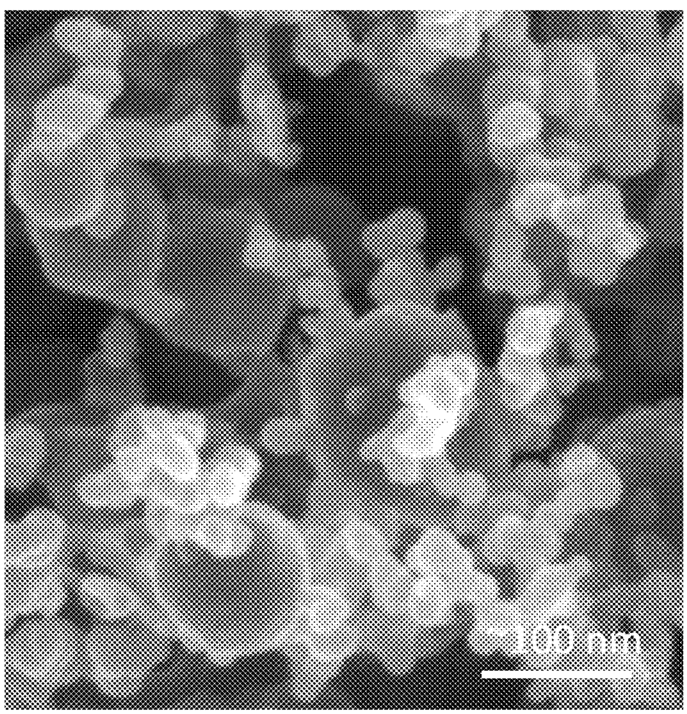

FIGS. 4A-4B are scanning electron microscope (SEM) images of examples of 3D graphene, according to some implementations. FIG. 4A shows FLG sub-particles 521 and SLG sub-particle 511 that are interconnected in a 3D manner (X, Y and Z directions), where SLG sub-particle 511 is also curled in this image, providing additional 3D geometry. FIG. 4B shows interconnected GNPs of various sizes, demonstrating that a distribution of sub-particle sizes can be formed and utilized in carbon particle materials in some implementations. FIG. 4B also demonstrates the ability to grow (such as, seed) carbon-carbon growth of different kinds onto each other, such as different allotropes of carbon.

Figure 4C:
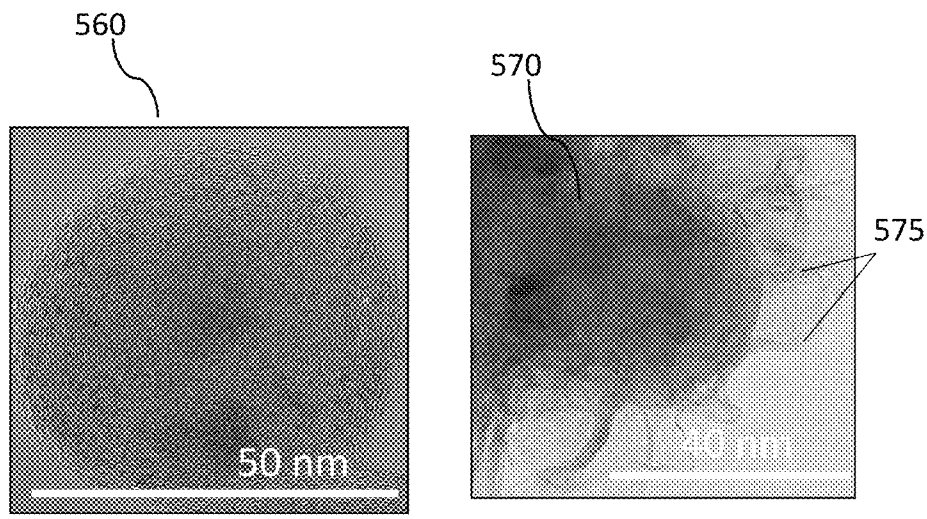

FIG. 4C shows examples of a multi-shell fullerene 560 and a multi-shell fullerene 570 with ligands 575, both of which may be incorporated into the present carbon materials individually or in combination in some implementations. Ligands 575 are carbon strands grown from and extending from the multi-shell fullerene 570, with ligand lengths ranging from approximately 5-20 nm. Ligands 575 are an engineered feature that allows for different end-size carbons to be mixed within a resin. In one implementation, the ligands 575 may break off (such as, in engineered locations as shall be described later in this disclosure) when combined with a resin and may provide a reinforcement differently to the resin than larger-sized multi-shell fullerene balls. In another implementation, the ligands 575 may be preserved such as to enable better anchoring into the polymer. Ligands 575 may provide benefits such as, for example, dispersion of energy and/or enabling a varied aspect ratio for improved bonding between the carbon and polymer.

Figure 4D:
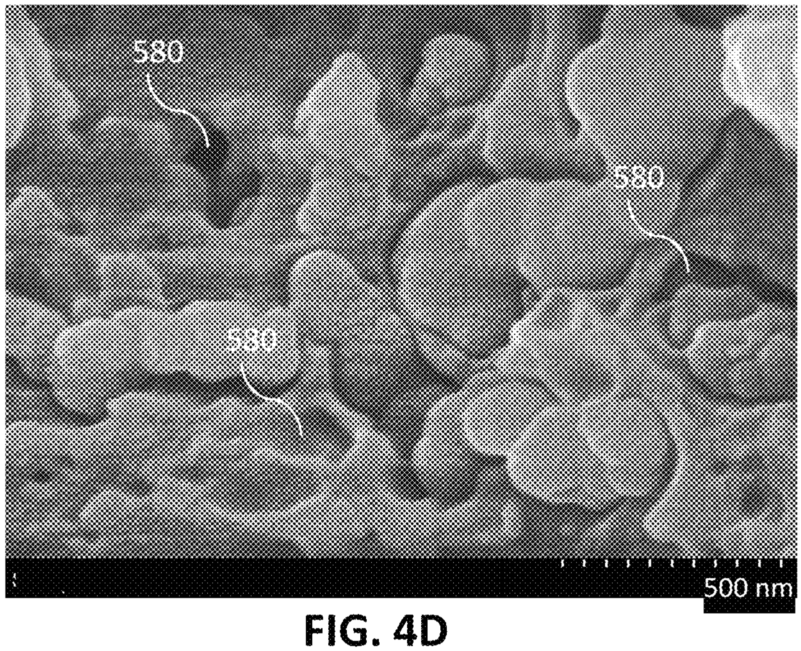
Figure 4E:
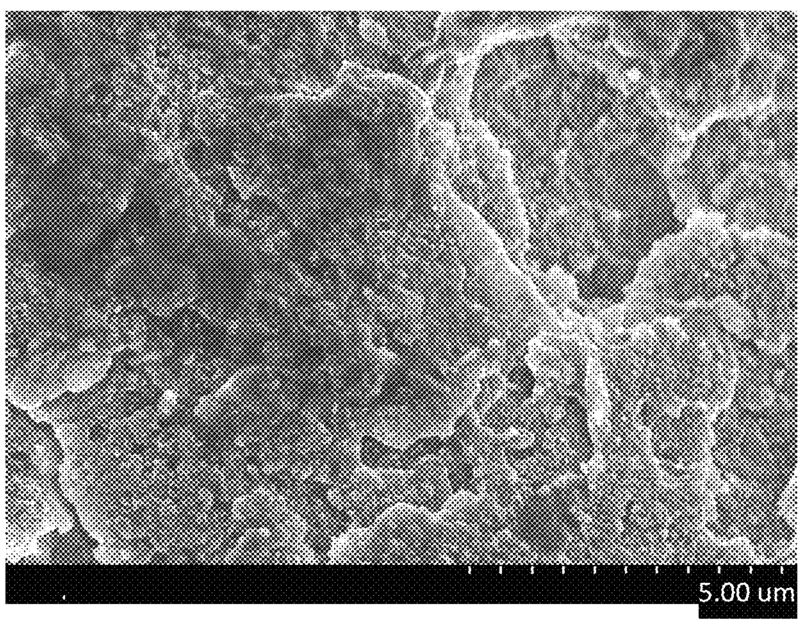

FIGS. 4D and 4E show example SEM images of carbon combined with resin, according to some implementations. FIG. 4D shows a carbon-resin system that is partially wetted, to enable visualization of voids 580 (such as, pores) in and around the carbon sub-particles and particles. FIG. 4E shows a more highly wetted carbon-resin system than FIG. 4D, demonstrating a high integration between carbon and resin that can be achieved in the present disclosure.

The 3D carbon structures of the present disclosure are made by plasma reactors as described herein that enable higher growth temperatures than conventional reactors. Because of the absence of a dielectric barrier between the high frequency energy source (such as, microwave source) and reaction zone in the present implementations, the high-frequency energy (such as, microwave energy) is able to apply direct heating to the species to be cracked. In contrast, in conventional reactors the high-frequency energy is an indirect heating source since the energy is applied to a carrier gas that ionizes, and then the ionized gas is applied to the hydrocarbon materials. Growth temperatures in the hydrocarbon cracking processes of the present implementations may be, for example, at least 3000 K with highly localized (such as, at the atomic level) temperatures of, for example, greater than 10,000 K or greater than 20,000 K. These extremely high temperatures lead to rapid decomposition of hydrocarbon gases where highly controlled vapor growth allows for 3D formation of the carbon materials. Furthermore, the high growth temperatures of the present implementations enable production of high phase purity carbon materials, such as greater than 95%, or greater than 97%, or greater than 99% phase purity of a particular phase, for example GNPs. Higher growth temperatures cause higher structure carbons (such as, more crystalline) to be grown, whereas amorphous carbon is preferentially grown at low temperatures and has a low growth rate at these high temperatures. Consequently, the present plasma reactors and methods are uniquely able to produce carbon materials of high phase purity, with very little to no amorphous carbon being created. In one example of how carbon growth can be uniquely controlled in some implementations, highly structured carbon materials may be grown in the highest temperature zone of a reactor, and then the highly structured carbon materials may be decorated with amorphous material in a lower temperature zone of the same or another reactor to aid in dispersion and/or promote a wettable surface along with favorable surface chemistry for the specific end polymer.

In addition to producing very pure fractions of highly structured carbon materials, the materials may be formed with 3D porous structures as described above. Formation of the 3D connections between sub-particles is made possible in the present reactors through control of process parameters that impact the growth rate of the carbon materials. One parameter that may be used to impact formation the 3D carbon particles of the present disclosure is partial pressure, where a decrease in the partial pressure of the process gas (such as, methane content versus content of the supply gas that is used to create the plasma) may cause the process gas to come out of a supersaturated condition. That is, the partial pressure of the process gas can be controlled to create a metastable condition such that the hydrocarbon species emerges out of the plasma. Adjusting the partial pressure of the process gas to change this metastable condition can be used to affect the growth of carbon particles. For example, a slower growth rate may be used to create larger sized particles and sub-particles. Conversely, a faster growth rate may be used to create smaller sized particles and sub-particles, such as creating GNPs that are connectedly grown from each other instead of creating long graphene sheets. The size of the particles being created consequently affects characteristics of the carbon material, such as a density of the overall 3D carbon particle structure. In another example, the power level can also be controlled to impact the growth rate, such as by changing temperatures in the reactor. The present plasma reactor systems, through aspects such as extremely high temperatures and control of various process parameters, enable production of unique carbon particles having sub-particles connected in a 3D manner that form a porous structure.

Fibers

In some implementations, the present composites include fibers as a reinforcing material in addition to the carbon additives (such as, graphene, MWSF, 3D carbon materials, 3D graphene) that are combined with a resin. The fibers provide benefits such as serving as additional 3D structures on which 3D carbon materials can be formed, providing a 3D geometry matrix for composite materials, and providing a high aspect ratio material which enables beneficial properties for composite materials (such as, high strength and/or anisotropic properties), Some implementations of composites involve carbon fibers (which may be referred to as carbon composite filler (CCF)) combined with resin and carbon particles. Some implementations of composites involve non-carbon fibers (such as, non-carbon composite filler (non-CCF) such as fiberglass) combined with resin and carbon particles. Some implementations of composite materials may utilize short chopped fibers added to resin and carbon particles. Types of fibers that may be used in some implementations include, but are not limited to, carbon fibers, glass (Si), aramid, polyethylene, boron, ceramic, Kevlar or other spun or woven materials.

Figure 5A:
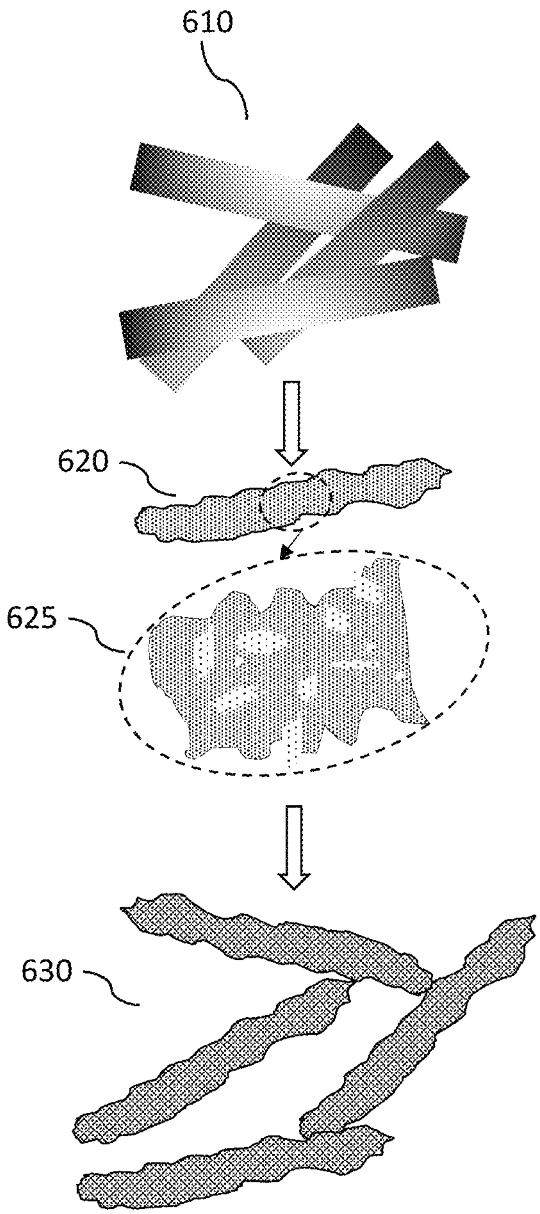
FIGS. 5A-5B are schematics of fibers for incorporation into carbon-resin composites, in accordance with some implementations.

FIG. 5A is a diagram of unique materials processing involving fibers, according to some implementations. Fibers 610 may be, for example, carbon, ceramic or metal fibers. In conventional composites, these fibers when combined with a resin binder will break away from the binder in the formed composite. In some implementations of the present disclosure, the fibers 610 may be introduced into a reactor, which may or may not be the same reactor in which carbon particles are to be produced, and the fibers are modified (such as, etched chemically or non-chemically, or surface-treated to roughen or change the surface chemistry of the fibers) in the reactor as indicated by fibers 620.

Detailed view 625 shows an implementation in which etching causes surface roughening of the fibers. The modifying of the fibers may create a higher interfacial bonding between the fiber and polymer as compared to an unmodified (such as, unetched) fiber. For example, etching may be performed by adding oxygen-containing groups to a plasma zone of a reactor, where in some implementations, a partial pressure of $O_2$ may be used, such as 0% to 21% or up to 100%. In a specific example, glass fibers may be etched using oxygen-containing groups, where Si—O—C bonds will be formed between resin and the glass fibers that are treated with $O_2$ and resin, or between carbon particles in the resin and the treated glass fibers.

Figure 5B:
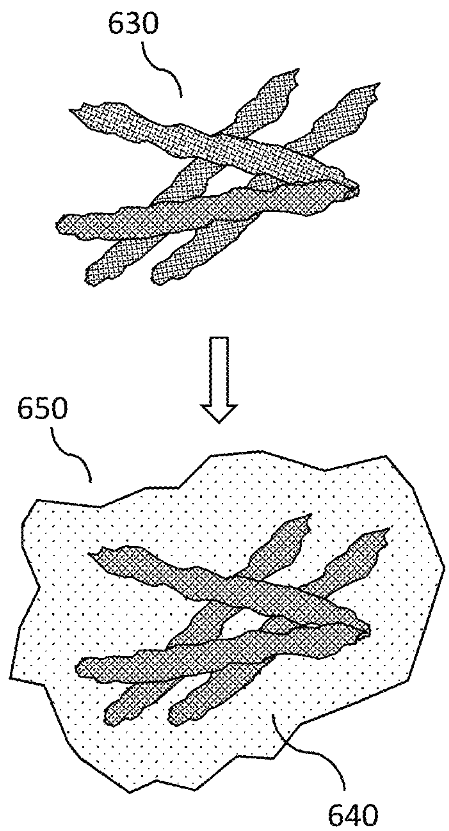

The modified fibers 630 are then used to form a composite material as illustrated in FIG. 5B, where the modified fibers 630 are added to a carbon-resin matrix 640 to form a composite material 650. The carbon-resin matrix 640 is a resin containing carbon filler particles, such as the 3D carbon materials disclosed herein. The resulting composite material 650 is an interconnected matrix of chemically bonded materials (fibers, carbon filler and resin) that provide improved properties such as higher strength than conventional resin-fiber composites.

In some implementations, fibers are integrated with carbon materials to create synthesized carbon matrix materials to be added to a carbon-resin composite material.

Figure 6:
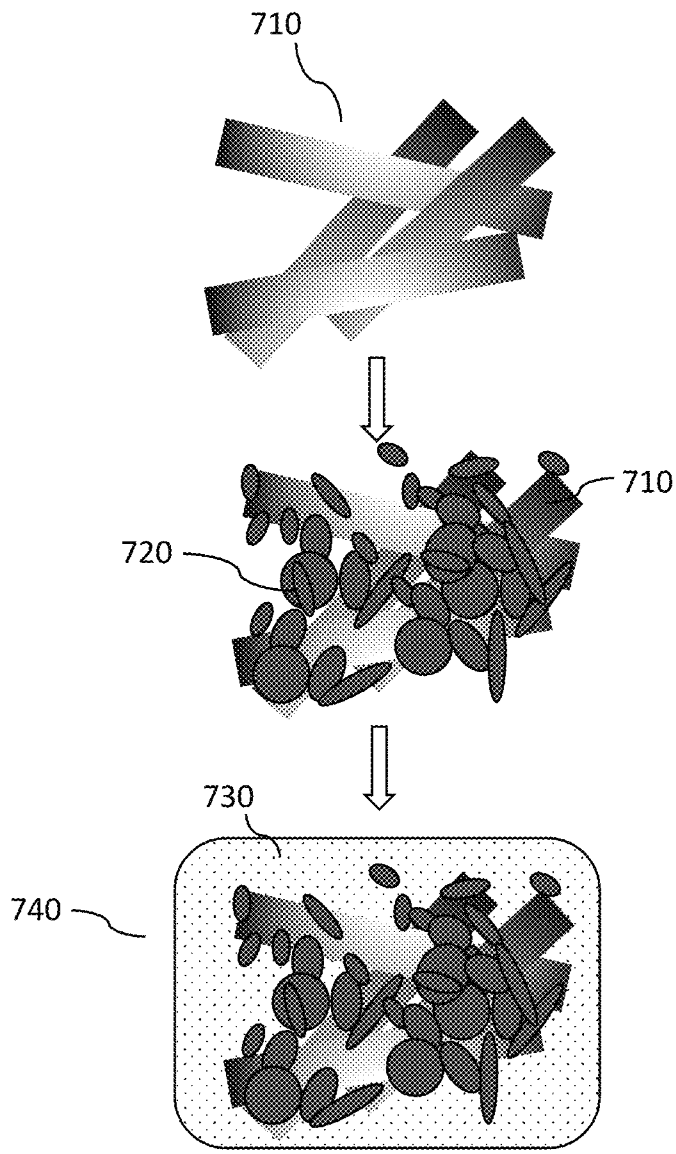
FIG. 6 is a schematic of carbon materials grown on fibers, in accordance with some implementations.

FIG. 6 illustrates incorporation of the present carbon materials, such as the 3D carbon structures described above, with fibers 710, in accordance with some implementations. For example, the present composite materials and methods may include high surface area 3D carbon material 720 that are integrated with the fibers 710 during composite materials processing, such as in situ in a microwave reactor, to provide improved properties to composite materials such as strength and conductivity. The resulting 3D carbon materials on a 3D fiber structure provides high surface area and pores (such as, between fibers, within the 3D carbon, and between fibers and 3D carbon) for mechanical interlocking and chemical bonding between a resin and the fiber-carbon structure. The fibers 710 may be various sizes in different implementations, depending on the end-use application of the composite. For example, fibers may be nano- or macro-scale materials, or may be on the order of fractions of an inch or inches in size ranging from, for example, 0.25 inch to 2 inch fibers. The fibers may be on the order of 0.001 inch to 0.3 inch in diameter but are not limited to nanometer to micrometer sizes in diameter depending on the end manufacturing technique (such as, injection molding, resin transfer molding, hand layup, etc.). In one example, the 3D carbon material 720 can be 3D graphene that is grown onto the fibers 710, creating an even higher reinforcement matrix for a composite material than 3D graphene particles alone. In some implementations, fibers 710 are modified (such as, etched) in the same reactor in which the 3D carbon material 720 is produced. In some implementations, a microwave plasma reactor is used in concert with an etching gas to etch the fibers 710 within the plasma and thermal high temperature plume of the reactor to promote nucleation sites for carbon growth directly onto the fibers 710. The ionic energy within the plasma etches the fibers and drives the gas phase cracking process, which grows layers and three-dimensional structures of carbon material 720 onto the surfaces of the etched fibers. The usage of a base fiber material such as metallic, dielectric rods, and tubes, coated (either completely or partially) with carbon matrix structures, can beneficially produce reinforcing materials with tunable properties that enable the formation of composite materials with tuned materials properties. The synthesized 3D carbon materials that are deposited onto the 3D fibers are combined with a resin 730 to form the final composite material 740.

Figure 7A:
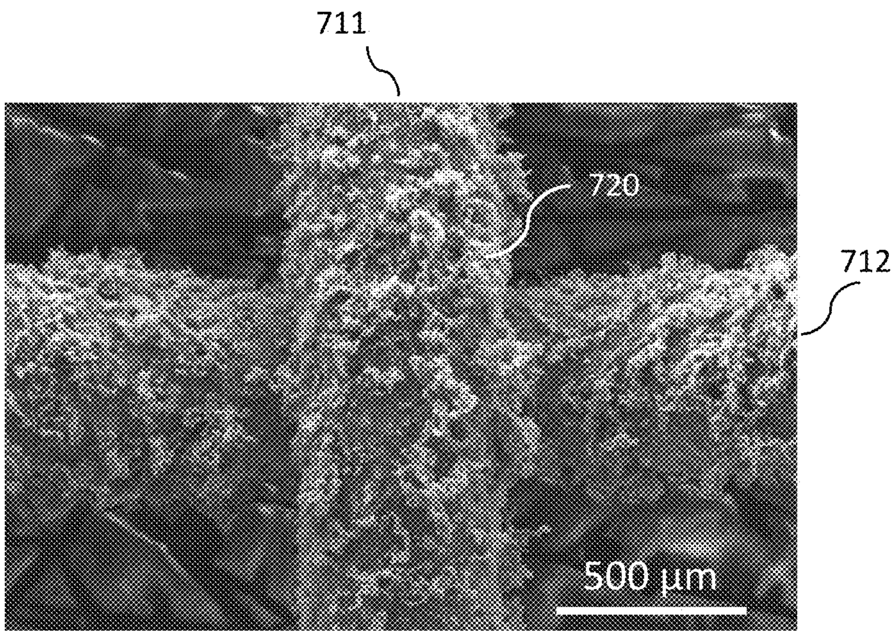
FIGS. 7A-7D are SEM images of carbon materials grown onto fibers, in accordance with some implementations.
Figure 7B:
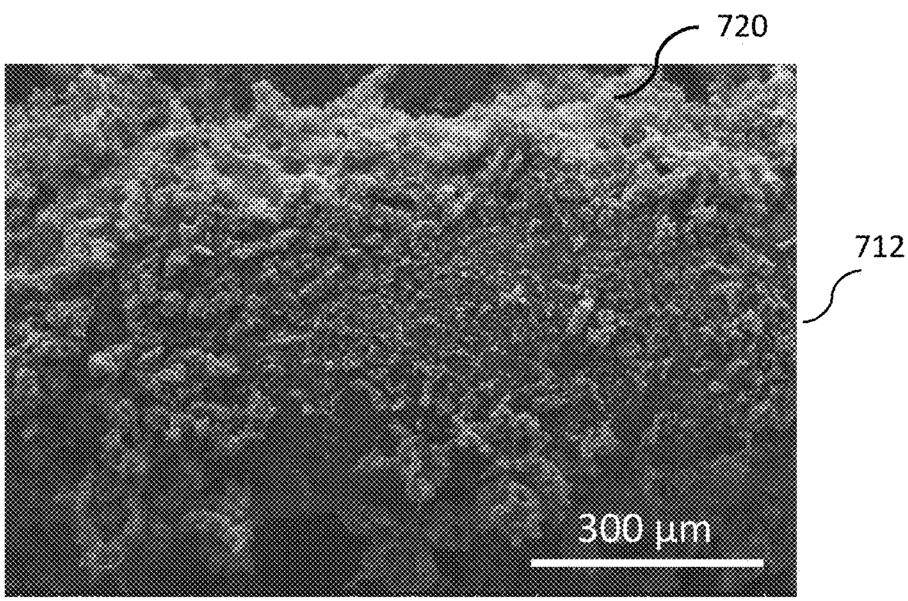
Figure 7C:
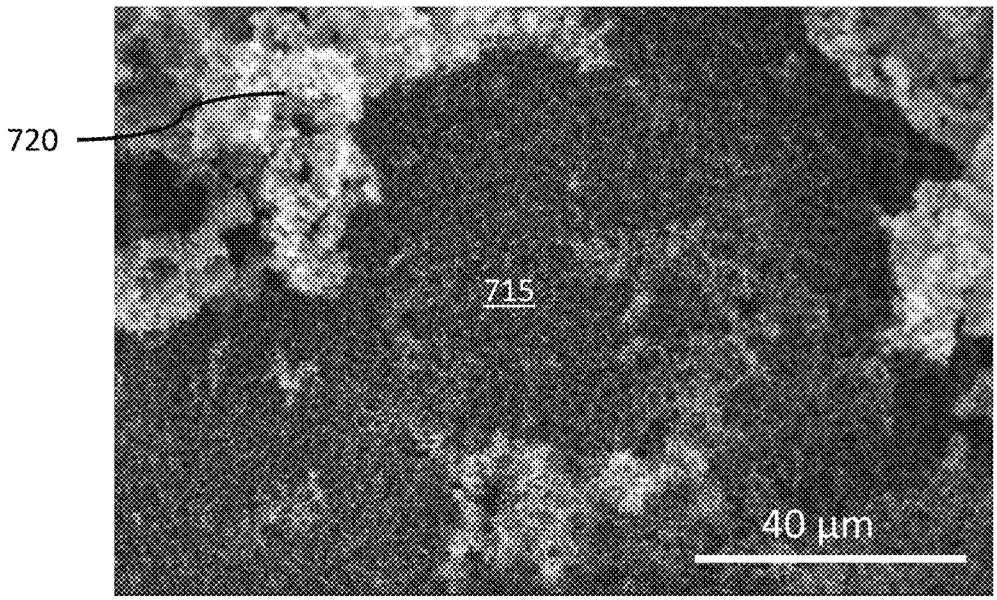
Figure 7D:
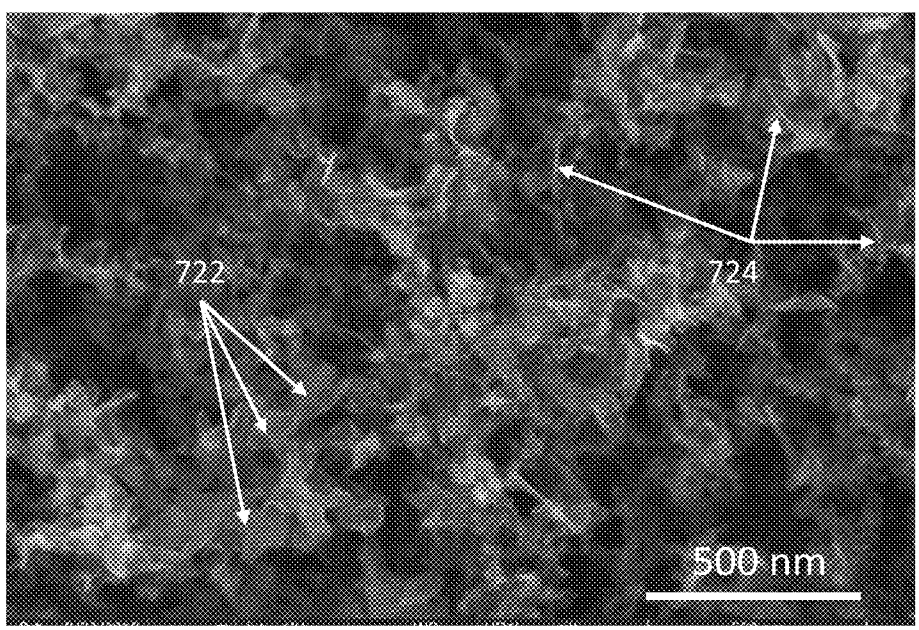

FIGS. 7A-7D show example SEM images of 3D carbon materials grown onto fibers using plasma energy from a microwave plasma reactor as well as thermal energy from a thermal reactor. FIG. 7A shows an SEM image of intersecting fibers 711 and 712 with 3D carbon material 720 grown on the surface of the fibers. FIG. 7B is a higher magnification image (the scale bar is 300 μm compared to 500 μm for FIG. 7A) showing 3D carbon growth 720 on the fiber 712. FIG. 7C is a further magnified view (scale bar is 40 μm) showing 3D carbon growth 720 on fiber surface 715, where the 3D nature of the carbon growth 720 can be clearly seen. FIG. 7D shows a close-up view (scale bar is 500 nm) of the carbon alone, showing interconnection between basal planes 722 and edge planes 724 of numerous sub-particles of the 3D carbon material 720 grown on the fiber. FIGS. 7A-7D demonstrate the ability to grown 3D carbon on a 3D fiber structure according to some implementations, such as 3D carbon on carbon fiber growth.

In some implementations, 3D carbon growth on fibers can be achieved by introducing a plurality of fibers into the microwave plasma reactor (such as, through an inlet 202 of the system 200 in FIG. 1A) and using plasma in the microwave reactor to etch the fibers. The etching creates nucleation sites such that when carbon particles and sub-particles are created by hydrocarbon cracking in the reactor, growth of 3D carbon structures is initiated at these nucleation sites. The direct growth of the 3D carbon structures on the fibers, which themselves are three-dimensional in nature, provides a highly integrated, 3D structure with pores into which resin can permeate. This 3D reinforcement matrix (including the 3D carbon structures integrated with high aspect ratio reinforcing fibers) for a resin composite results in enhanced material properties, such as tensile strength and shear, as compared to composites with conventional fibers that have smooth surfaces and typically delaminate from the resin matrix.

Functionalizing Carbon

In some implementations, carbon materials, such as 3D carbon materials described herein, can be functionalized to promote adhesion and/or add elements such as oxygen, nitrogen, carbon, silicon, or hardening agents. In some implementations, the carbon materials can be functionalized in-situ—that is, within the same reactor in which the carbon materials are produced—or in post-processing. For example, the surfaces of fullerenes or graphene can be functionalized with oxygen- or nitrogen-containing species which form bonds with polymers of the resin matrix, thus improving adhesion and providing strong binding to enhance the strength of composites.

Implementations include functionalizing surface treatments for carbon (such as, CNTs, CNO, graphene, 3D carbon materials such as 3D graphene) utilizing plasma reactors (such as, microwave plasma reactors) described herein. Various implementations can include in-situ surface treatment during creation of carbon materials that will be combined with a binder or polymer in a composite material, and/or surface treatment after creation of the carbon materials (but still within the reactor).

Figure 8A:
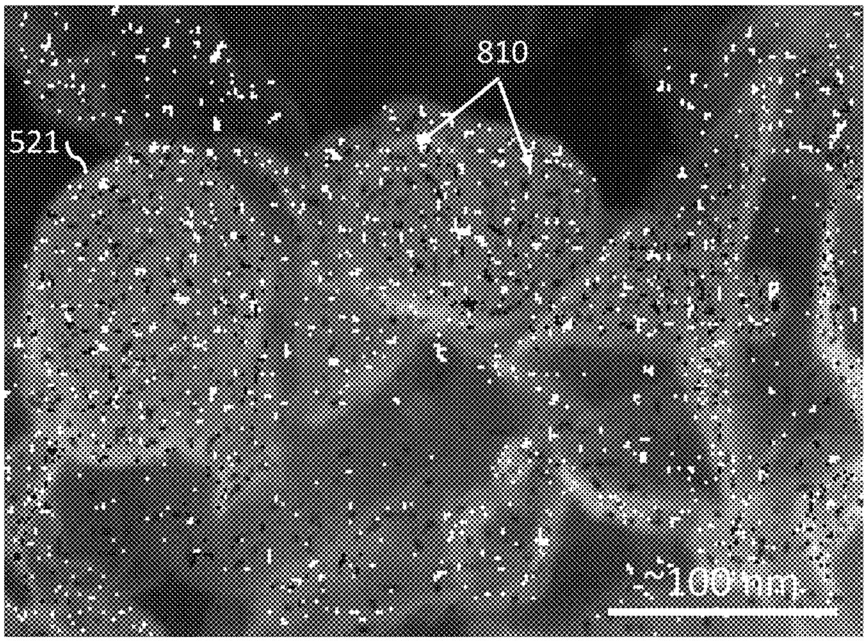
FIGS. 8A-8B are images illustrating functionalized carbon materials, in accordance with some implementations.
Figure 8B:
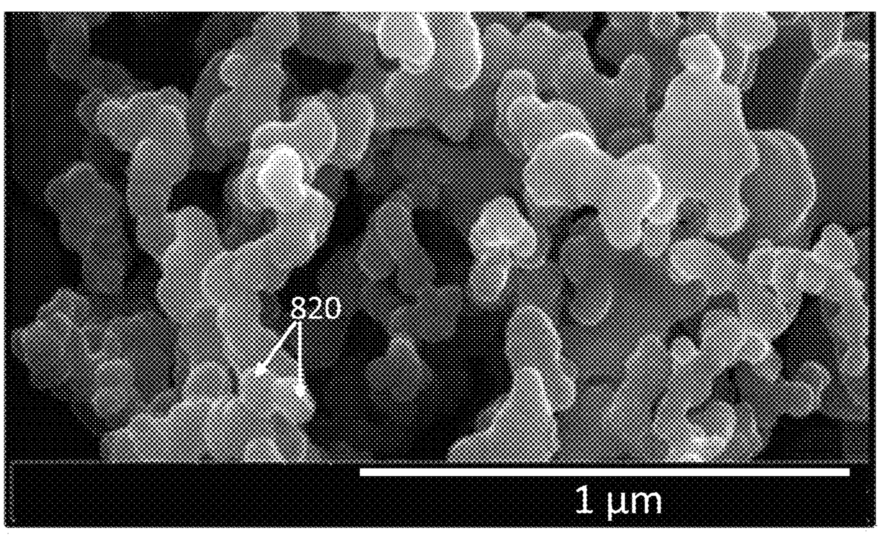

FIG. 8A is a diagram representing functionalized carbon, in which the 3D graphene of FIG. 4A, with FLG sub-particles 521, is illustrated as being modified with functionalized groups as symbolized by the black and white dots 810. FIG. 8B is an SEM of 3D carbon material functionalized with a Group 6 non-metal element in single percentage. Although functional elements are unable to be visualized in this SEM, the interconnection of GNP sub-particles 820 is clearly visible in FIG. 8B.

The functionalized carbon can be used to enhance bonding with a resin. In some implementations, functionalized carbon can be grown on a fiber matrix, such as described in relation to FIG. 6. In some implementations, carbon particles (alone or integrated onto fibers) are functionalized to be polymer-compatible in-situ in the reactor in which the carbon particles are produced. That is, in some implementations carbon particles are functionalized to be compatible with the resin by promoting chemical bonding, such as covalent bonding, and/or physical bonding, such as pi-pi interactions along with hydrogen bonding, between the carbon particles and the resin. For example, the functionalization may include surface oxidation or nitridation to hydroxylate or nitrogenate the carbons, to promote bonding with a resin. Furthermore, a surface preparation may be performed to clean and prepare the carbon surface to receive the polymer. The functionalization may also include surface doping or surface alloying, such as CxNy, AlxCy, SixCy, NiXCy, CuxCy, NxCy, or elements such as Be, Sc, Mg, Ti and Pt. In some implementations, the carbon may be functionalized with one or more of H, O, S, N, Si, aromatic hydrocarbons, Sr, F, I, Na, K, Mg, Ca, Cl, Br, Mn, Cr, Zn, B, Ga, Rb, Cs, amine groups, acid groups (such as, COOH, OH), or additional polymers.

In various implementations of the present carbon materials and composite materials, functionalizing the carbon surface can enhance surface wettability (such as, surface activity), allowing for enhanced wetting between carbon materials and resin. For example, carbons may be functionalized to increase wettability (such as, create a low contact angle with the resin) which improves integration of the carbons with the resin. In some implementations, chemical additives can be added into the carbon-resin system to allow for better anchoring of particles within the resin, which can also lead to increased mechanical properties of formed composite materials. This is because properly anchored materials will not settle out of the resin system and will stay fully suspended. Examples of chemical additives include, but are not limited to, non-ionic surfactants and dispersants containing polyethylene oxide chains and hydrophobic groups, which allow better chemical bonding of carbon to the polymer matrix.

In various implementations of the present composite materials, the mixture of resin and carbon remains in an unhardened state which can then be utilized as a raw material for various applications such as forming parts or being applied as a coating. The unhardened composite material may be types of resin systems such as two-part systems or systems in which a cross-linking agent or a hardening agent is added to initiate curing. In other implementations, the carbon/resin mixture can directly produce a hardened material, such as in implementations where the carbon starting particles are functionalized with a hardening agent, and the functionalized carbon initiates cross-linking when entering into the resin. The functionalized carbon particles having the hardening agent could be directly embedded into the resin in the reactor that is used to produce and functionalize the carbon, as shall be described in more detail in the next section. The resulting resin/carbon composite material in which the carbon includes a hardening agent may provide a composite material that is in a state ready for molding, for example. The carbon in such a molding scenario could be a carbon matrix material in which a functionalized graphene is designed to be both a strength-enhancing material and a hardener.

Figure 9:
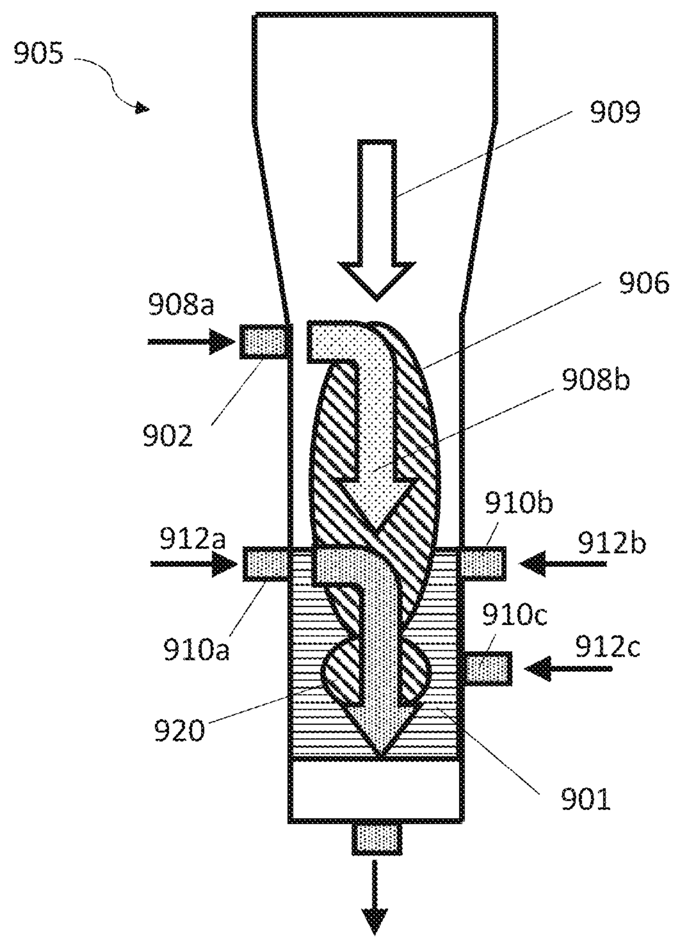
FIG. 9 is a schematic of a field-enhancing waveguide, in accordance with some implementations.

FIG. 9 is a schematic of a field-enhancing waveguide 905 a portion of a microwave plasma reactor, where other portions of the reactor are not shown for simplicity. The FEWG 905 includes a supply gas inlet 902 configured to receive supply gas 908*a* flowing into the FEWG 905, and process material inlets 910*a*, 910*b* and 910*c* configured to receive process materials 912*a*, 912*b* and optionally 912*c*. High-frequency energy 909 creates a plasma 906 in a supply gas 908*a* and/or process material 912*a*. The generated plasma 906 provides energy for reactions to occur in process material 908*b* within a reaction zone 901 of the FEWG 905. In some implementations, process material 912*a* is a hydrocarbon substance such as a gas, liquid, or colloidal suspension from which the carbon material will be produced by a cracking process. Process material 912*b* may be a substance, such as a gas or liquid, to produce functional groups for functionalizing the carbon in situ within the FEWG 905. Process material 912*c* may be a functionalization or doping material that is a different substance from process material 912*b*, or may be fibers (such as, a fiber matrix on which carbon particles will be grown) as described above. Process material inlets 910*a*, 910*b* and 910*c* are shown to be in different locations upstream and downstream from each other in FIG. 9 but in other implementations may all be in the same location or a combination of same and different locations. The locations of process material inlets 910*a*, 910*b* and 910*c* may be used to alter where reactions occur, such as within the plasma 906 and/or in an afterglow region 920, to customize properties of the carbon materials.

Functionalizing carbons using the present reactors and methods provides unique advantages over conventional reactors and methods by bringing additional gases or liquids (containing functional elements, doping materials and/or hardening agents) into the vicinity of the plasma in which carbon materials are being produced. This allows for hydrocarbon species to be cracked in the vicinity of the functionalizing materials during or slightly after the carbon materials are grown. Functional groups may be introduced directly into the plasma or the plasma afterglow, onto freshly made surfaces of the produced carbon, and creating stronger bonds than by functionalizing previously produced carbon particles. This is because carbon surfaces have a high surface energy when carbon is created. The functionalization is performed by gas-gas interaction; that is, in a vapor form instead of, for example, wet chemistry. Conventional methods such as plasma-enhanced chemical vapor deposition (PECVD) involve vapor forms; however, functionalizing within a hydrocarbon cracking plasma reactor is more difficult than standard PECVD because of the difficulty in adding other species into carbon cracking processes. Introducing other species creates a large number of process parameters, all of which interact with each other. In the present implementations, it has been found that functionalization during the carbon formation process is possible only in a small window of process parameters, such as to prevent the functional groups from growing on the surface of the reactor which would terminate the hydrocracking process.

Functionalization of carbon materials in-situ (in the reactor while the carbon material is being grown) is accomplished through control of aspects such as partial pressure, flow rate of supply gas and process gas, power level of the high-frequency energy, and use of a non-equilibrium plasma mode, along with utilizing reactors with different designs (such as, using various reactor zones or different temperature and energy zones). Additionally, functionalization may be performed in the plasma itself or in subsequent parts of the flow stream of the particles (such as, high temperature plume after the plasma) to further tailor chemical reactions between the functionalizing elements and carbon materials.

In some implementations, the reactor can comprise different zones, where creation of the carbon particles and functionalization of the carbon particles can occur in one or more zones. For example, creation and functionalization of the carbon particles can occur essentially simultaneously in one zone. In another example, carbon particles can be created in one zone of the reactor, and then functionalization can occur in a subsequent zone. In another example, (i) carbon particles can be created in a first zone of the reactor where the microwave plasma is present; (ii) a plurality of fibers can be introduced into the first zone within the plasma and/or into a second zone comprising a thermal high temperature plume of the reactor, where the fibers are etched and 3D carbon is grown onto the fibers and/or the fibers are adhered together at interconnection points; and (iii) functionalization of carbon can occur in a third zone.

In some implementations, the 3D carbon materials, whether functionalized or not, may beneficially provide anisotropic properties (such as, directional properties in one or more of the X, Y, Z dimensions) through a natural randomness of their structures. In some implementations, the 3D carbon materials, whether functionalized or not, maybe enhanced multi-directionality of properties, such as increasing electrical conductivity through 3D interconnection of carbon sub-particles.

Because of the carbon-resin bonds that are promoted by carbon functionalization, the reinforcing carbon fillers of the present composite materials are more dispersed (such as, are low-aggregating or less-aggregating dispersions) as compared to conventional composites, and high loadings of carbon filler material (such as, greater than 40% or greater than 50%) can be achieved within a resin system. In some implementations, the carbon filler particle sizes in the composite material have a small size, such as 200-400 nm, which aids in the dispersion. The resin loaded with carbon has processability (the rheology of a polymer-carbon mixture before curing) that is suitable for use in various applications, including but not limited to prepreg applications, molding applications, and extrusion processes. The carbon filler particles in the present carbon-resin mixtures are suspended, similar to a colloidal solution, due to a well-dispersed and fully wetted filler material where in some cases the filler can also be chemically bonded to the resin.

In some implementations, carbon-metal matrix materials are produced by doping or mixing the carbon with metal, such as by metal impregnation on carbon via chemical bonding using a plasma reactor. In some implementations, the carbon-metal matrix material particles can be reduced in size by mixing with a resin, resulting in carbon/metal interfaces such that the reduced-size carbon/metal particles within the resin composite can bind to metal supporting structures. Metal doping of carbon can be utilized to create organo-metallics, where carbon particles are functionalized with metal, to be compatible with a metal-based binder (such as, a carbon-infused metal, or a carbon-metal covetic material). The terms "organo-metallic" and "organometallic" are used interchangeably herein.

The bonding between carbon additives, resin, and fibers (if included) provide improved composite properties as compared to conventional materials. For example, functionalized carbon structures grown on fiber materials provides energy transfer modification such that energy applied to the composite material is distributed throughout all the sub-components of the fiber-reinforced composite systems. In another example, crack propagation is mitigated by stress termination (such as, termination of dangling bonds) that is enabled by functionalization and/or creation of carbon-carbon connections between sub-particles of the present carbon materials. Toughened resins may also be formulated, where plastic versus elastic behavior can be managed such as by adjusting the concentration of functional species and/or tuning the type of bonds between the carbon and polymer. In some implementations, high strength can be achieved without increasing viscosity due to functional groups being integrated into the carbon as the carbon is grown, in contrast to conventional composites in which higher reinforcement typically leads to higher viscosity.

In addition to the functionalization of carbon materials described in this section, other treatments of the carbon materials may be utilized to enhance incorporation of the carbons with resins. Example methods include etching of carbon surfaces, surface roughening, and/or treating the carbon surfaces to remove contaminants. In some implementations, a clean surface of the carbon that is non-exposed to an environment may itself serve as a functionalized surface, for example by directly injecting carbon into a resin composite system so as not to expose the carbon materials to ambient conditions (such as, a surface being exposed only to a resin after formation of the carbon). Other examples of modifications or treatments of carbon materials include, for example, structural or morphology modification, surface promotion (such as, through surface chemistry), and use of environmental constraints (such as, promoting bondability of the carbon materials to resins via creating specific environmental conditions in which the carbon materials are produced, such as different types of inert atmospheres in the reactor).

In Situ Resin Embedding

In some implementations, the carbon particles are produced in a reactor and are combined (such as, mixed) with a resin in a container. In other implementations, the carbon and resin are combined by directly embedding carbon particles (functionalized or non-functionalized) into the resin within the reactor that is used to grow (and optionally functionalize) the carbon particles, such that no contact from an external resource is required. That is, the resin and carbon can be combined within the reactor without the need for any human contact. For example, the resin may be flow-injected or liquid-injected into the reactor, creating vapor-vapor interaction between the carbon particles and polymer. In some implementations, the composites include producing graphene nano-particles (such as, 3D graphene) or carbon nano-onions that are injectable into a binder (such as, resin, polymer) to produce composite materials. Some implementations include injection molding or forging parts from the composite materials.

Returning to FIG. 9, in some implementations the process material 912*c* can be a resin that is introduced into inlet 910*c*. Types of resins into which carbon materials can be embedded include thermosets, thermoplastics, polyesters, vinyl esters, polysulfones, epoxies, such as novolacs or others, rigid amines, and polyimides. Process material 912*b* may be gases or liquids used to functionalize the carbon materials to be more compatible with (such as, enhance or promote bonding with or wetting with) the resin.

Directly embedding carbon particles into a resin in situ can provide benefits such as creating stronger bonds between the carbon and resin due to avoiding exposure of the carbon particles to an ambient environment (such as, air and moisture). This is because surfaces of carbon particles can be more reactive immediately after the particles are formed, as compared to after being exposed to an ambient environment (such as, oxygen) after being collected from a reactor. Consequently, combining carbon particles with polymer particles within the reactor in which the carbon particles are created, prior to the carbon particles existing the reactor, can provide enhanced bonding between the carbons and resin and improved composite materials properties. Integrating resins with carbon materials in-situ in a hydrocarbon cracking plasma reactor is counterintuitive to conventional practices because introducing additional species into the cracking processes greatly increases the complexity of determining process parameters which can be successfully used, as described above regarding in-situ functionalization. For example, introducing resins into the reactor without having the resins build-up on the reactor walls or without affecting desired growth characteristics of the carbon is extremely complex and not straightforward from conventional practices.

Additional Energy/Mixing

Figure 10A:
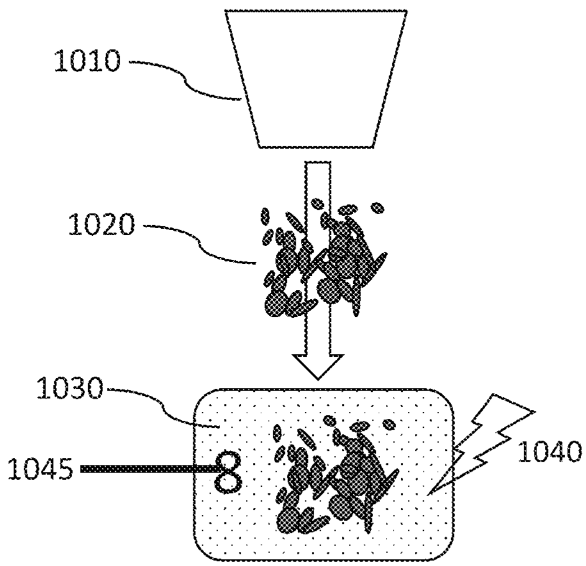
FIGS. 10A-10B are schematics of adding energy into a composite material, in accordance with some implementations.
Figure 10B:
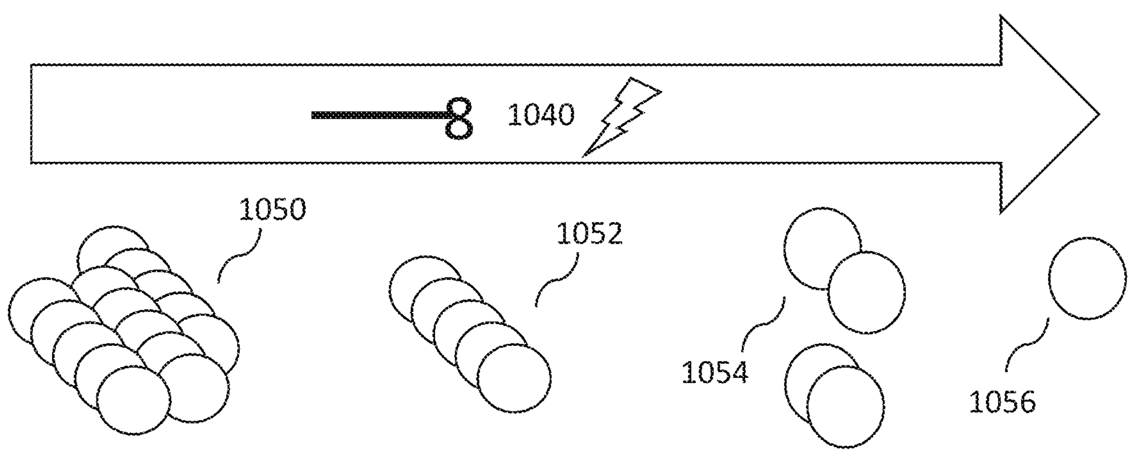

FIGS. 10A-10B are simplified schematics of implementations in which the sizes of the carbon particles may be reduced when combining the carbon particles with resin to produce a composite material. That is, the carbon particles are reduced in size from a starting particle size to a final particle size during the process of being incorporated with the resin. In FIG. 10A, carbon particles are produced in a reactor 1010, which may be, for example, the microwave plasma reactors as described herein. The produced carbon particles 1020, which can be modified (such as, functionalized) in the reactor 1010 or non-modified and can be of nanometer to micron size, such as on the order of 100μ, are used as starting particles and serve as a filler material to be combined with a resin 1030. In some implementations, the starting particles can be injected into an uncured or unhardened resin bath (such as, a volume of resin contained in a vessel). In other implementations, the mixing can be achieved by flow-injecting the resin into the carbon stream of the reactor, such as in the plasma zone and/or in the plasma afterglow. Energy 1040 is input into the carbon/resin mixture, where the energy 1040 may be mechanical mixing 1045 that applies mechanical forces, such as shear forces, to the particles within the resin. The energy-adding system may also include thermal or high frequency energy input to aid in the process, in addition to or instead of mechanical mixing 1045. For example, large particles can be injected into the resin and mechanical energy is added along with thermal and/or microwave energy. The additional energy 1040 (such as, mechanical, thermal, and/or high frequency) can serve various purposes including, but not limited to, aiding in the process of breaking up the carbon starting particles and helping to chemically bind the carbon to the polymer (resin). The supplemental energy 1040 can be supplied in the form of, for example, mechanical mixing 1045, thermal heating, and/or microwave heating.

FIG. 10B is a graphic illustration showing the effect of the supplemental energy 1040 on particle size, where energy can be, for example, mechanical (such as, mechanical mixing 1045) or thermal. Particles of the starting material can be aggregates 1050 of a size up to, for example, 100μ. Energy 1040 can be imparted to the particles via one or more of applying shear forces to the particles, homogenizing the particles, or mixing the particles. The mechanical or thermal energy breaks up the particles into smaller sizes 1052, 1054 and 1056, which consequently creates fresh surfaces for the resin (such as, polymer) to bind to. The smaller sizes 1052, 1054 and 1056 may involve breaking carbon particles into various-sized groups of sub-particles, such as groups of GNP sub-particles. As discussed earlier, newly exposed surfaces that have not been exposed to an ambient environment may provide increased bonding with polymer molecules.

In some implementations, mechanical shearing is used to break up the carbon (or formulated/functionalized carbon) particles, which facilitates dispersion of the carbon throughout the resin. The dispersion can be achieved with mechanical mixing, chemical methods (such as, adding an organic solvent or surfactant to promote a bonded carbon-organic-polymer), or a combination of these. Increased dispersion can be desirable for improved uniformity of material properties throughout the composite material, and improvements in the properties themselves. Examples of improved properties include, but are not limited to, mechanical strength, toughness, flexural modulus, electrical conductivity and density (such as, more lightweight). The increased number of small sheared surfaces of the carbon particles after mixing (which may remain as 3D carbon structures in some implementations) as compared to fewer larger surfaces of the starting carbon particles allows for a greater amount of resin/surface anchoring. This higher amount of surface binding can lead to, for example, improved electrical conductivity and/or mechanical properties. In general, the smaller particles resulting from the energy input into the resin/carbon mixture changes the surface area, structure, and surface activity as compared to the larger size of the starting carbon particles. Surface area refers to the total area of the carbon material surface, including that which is available to interact with the resin.

Particle size and shape can affect the surface area. Structure describes the shape of the particles. The structure can be affected by the number of particles (or sub-particles) fused together and the configuration of the particles within aggregated particles. Surface activity relates to the strength of the surface interaction between the carbon filler material and the resin/polymer. Surface activity can impact the dispersion properties of the carbon materials within the resin.

In further implementations, external energy can be applied in order to heat or cool the resin to modify the viscosity. For example, the resin viscosity can be modified during mixing in order to change the shear forces on the carbon particles. In another example, the viscosity of the resin can be modified to change the elastic modulus of the final composite (such as, an increased viscosity of the composite material may aid in suspending the carbon particles in the mixture). In some implementations, cooling or heating may be employed to aid in hardening or curing of the polymer.

Engineered Defects

In some implementations, the carbon materials of the present disclosure have engineered defects within the carbon particles to enable further tunability (such as, customization) of the carbon and consequently of the properties of the composite materials made from the defect-engineered carbon particles. Implementations include engineering defects into structured carbon materials—that is, carbon materials that are designed with defects specifically for incorporation with resins, such as 3D carbon structures and/or functionalized carbon materials. In some implementations, carbon particles are produced in a microwave reactor where defects are engineered into intentional defect locations between sub-particles in the carbon particles or between particles (which may also be referred to as an agglomerate), such that the particles or aggregates are broken down (such as, fragmented) from a starting particle size to a smaller, final particle size that is determined by the defect locations. In some implementations, energy dissipation within the system is managed to relieve or concentrate forces, such as by engineering 3D structures with pore matrix geometries and/or weakened bonds that allow for energy movement into or along a specified plane. This allows for varied interaction between the filler-filler and filler-polymer where the filler is a carbon-based material.

Figure 11A:
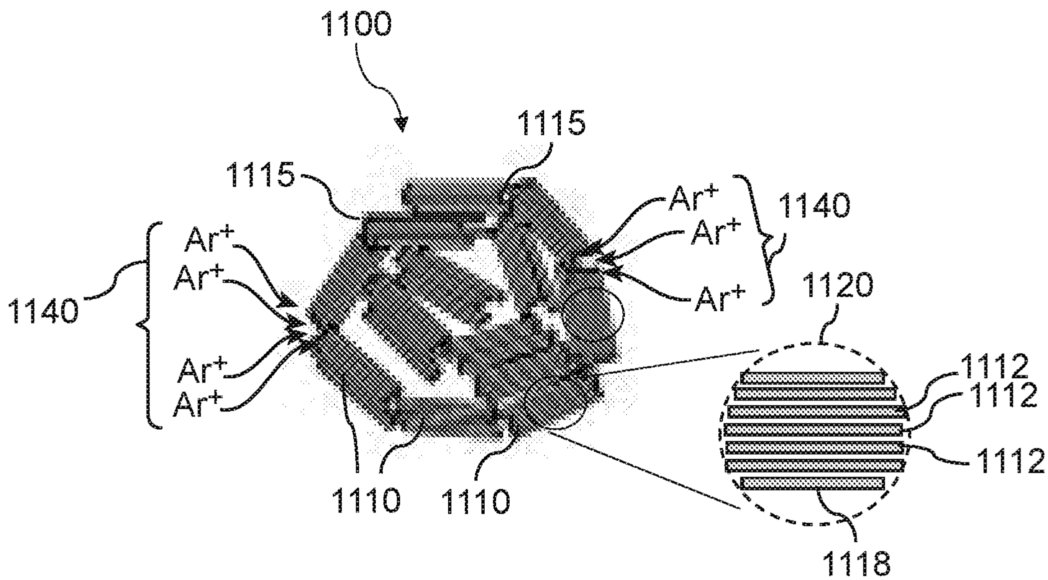
FIGS. 11A-11B are schematics of carbon materials with engineered defects, in accordance with some implementations.

FIG. 11A shows a schematic of engineered defects according to some implementations, using 3D graphene as an example carbon material. 3D graphene particle 1100 is made of a plurality of few layer graphene sub-particles 1110 (which may also be MLG and/or SLG sub-particles in various implementations), each sub-particle 1110 being made of up to graphene layers 1112 as shown in the detailed, cross-sectional view 1120. The FLG sub-particles 1110 are building blocks for the 3D graphene particle 1100 and are interconnected at various edges 1115 in this implementation, although the connections may also include edge-to-basal plane and basal plane-to-basal plane locations. The interconnected sub-particles 1110 form a 3D assembled structure that has open spaces (such as, pores) between the sub-particles 1110 as described previously in relation to FIG. 3. The sub-particles 1110 and interconnections are formed in a plasma reactor as described herein. The innate mechanical properties (such as, elastic modulus, tensile strength) of the single layer graphene (such as, layers 1112) are uncompromised or maintained—that is, having minimal basal plane defects—during creation of the particle 1100.

One example of engineered defects is creating selectively weakened sites within the particle 1100. In a post plasma process, such as in the high temperature plasma afterglow of the reactor, interconnection contact points between the FLG sub-particles 1110 can be selectively weakened by a focused and concentrated impingement of sputtering atoms 1140. The connection points are high angle contact points having sharp asperities or transitions which concentrate the sputtering energy while at the same time, minimize ion impingement onto the flat, low angle, basal plane surfaces 1118 of pure graphene. Sputtering atoms 1140 are depicted as argon in this implementation but may be other elements such as, but not limited to, nitrogen, oxygen, ammonia ($NH_4$), or other active and reactive species. In some implementations, a selective bias field can be applied to the 3D aggregate structure 1100 such that the bias fields are concentrated at the edges of the FLG sub-particles 1110 and correspondingly further focus the sputtering atoms at these selective sites. The location of the defects may be selectively chosen based on, for example, injection mode of the sputtering atoms, gas particle pressure and plasma temperature. The weakening of sites is caused by reducing the number of carbon-carbon bonds at the connection points. A greater number of weakened sites will result in the particle 1100 being fragmented into smaller particle sizes when, for example, a shear or mixing force is applied.

In some implementations, carbons may be grown to be weakly bonded from the start, or the carbons may be grown and then defects are added. In some implementations, the defects may be engineered into carbon particles using a plasma reactor with multi-stage reactor zones. High-frequency energy such as microwave energy can be targeted effectively in the location where the energy is applied, enabling selectivity in creation of defects in the present implementations. In contrast, thermal energy acts on bulk properties which can compromise the innate structure of the carbon material (such as, graphene). Use of high-frequency energy, such as microwave energy, beneficially preserves the characteristics or nature of the platelets, and can be targeted primarily at the interconnections between sub-particles, whether the connections are edge-edge, edge-basal or basal-basal types.

Figure 11B:
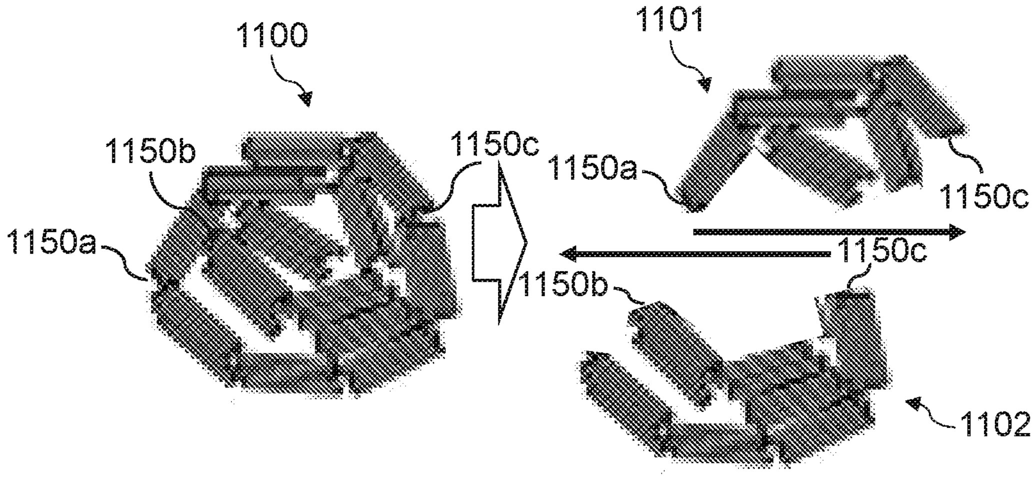

FIG. 11B shows a benefit of engineered defects in customizing the sizes of carbon particles for use in a composite material. In FIG. 11B, particle 1100 has multiple defects engineered into edges of sub-particles, such as at defects 1150*a*, 1150*b* and 1150*c*. A high energy shear process or any shear process that incorporates energy into the fluid, such as from energy applied during mixing of carbons with a resin, causes the particle 1100 to be broken up into smaller, fragmented particles 1101 and 1102 at the defect locations. Fragmented particles 1101 and 1102 have an average final particle size (which may be measured in dimensions or volume) that are smaller than the average starting particle size of particle 1100. The smaller particles 1101 and 1102 are readily dispersible fragments due to the creation of freshly cleaved, philic (wettable) surfaces at the sheared locations of defects 1150*a*, 1150*b* and 1150*c*. Thus, through the application of high energy shear forces during the mixing of particles within an uncured/unhardened resin, freshly cleaved surfaces become instantaneously in contact with the resin without contamination. At the same time, fracturing of the 3D particles during high energy shear process within a resin maintains the innate mechanical integrity of FLG sub-particles 1110.

The ability to engineer a structured carbon material to break down to a particular size is a unique and important ability of structured carbons that promote improvements to composite materials containing those materials. The materials are engineered to allow for minimal exposure to ambient conditions even when set aside for a period of time in ambient environments. The larger engineered material keeps the internal materials encapsulated for exposure only at specific moments in the processing (such as, when further energy such as is found in shearing or mixing when combining the carbons with a resin). The engineered materials have specifically tuned fracture planes, which in turn allows for specific behaviors in post-processing, so as to inure end use properties to carbon-resin composites.

In some processing recipes the structured carbon has at least one tuned fracture plane. Such structured carbons that have a tuned fracture plane are mixed with additional materials in quantities and formulations that are controlled based at least in part on application-specific end-component specifications. Moreover, the specific fracture planes of the structured carbons can be controlled during processing within the reactor. Strictly as one example, by using intra-reactor processing techniques, the structured carbons that are produced can be tuned to have fracture planes that are engineered for specific end-product characteristics. For example, in one formulation, the structured carbons produced in a microwave reactor are purposely not compressed before use in post-processing steps, where consequently, the only necessary post-process needed is a mixing step with resin that results in a compounded composite.

In some engineered formulations, the fracture planes within the present carbon materials are defined by the occurrence or absence of bonded/non-bonded carbon atoms. A fracture plane can be engineered by introducing weakly bonded area(s) into the lattice by introducing a gap or a hole, or by introducing a dangling bond. These weakly bonded area(s) can be purposely caused by introduction of non-carbon chemicals into the carbon system to form different bonds. For example, by introducing a measured amount of oxygen into the reactor during formation of the structured carbons, weaker C—O bonds (such as, weaker than C—C bonds) can be formed in the lattice. Since the energy associated with each type of bond is different, the planar structure of the lattice can be engineered for intentional failure at a specific location or plane or area.

In some implementations, defects (such as, lower energy bonds) are purposely engineered-in to ensure the critical length or geometry of the final material has a specific strength-to-length or strength-to-volume ratio. These lengths can be tailored for specific end-application uses of the resulting carbon-resin composite.

Purposely engineered-in defects result from tuning the growth of the carbon structure. Such tuning can be accomplished by controlling reactor process conditions such as gas flow rate, residence time, flow velocity, Mach number, hydrocarbon concentration and the like, to name but a few. Other process conditions that can be controlled so as to tune the growth of a lattice include plasma specific conditions such as plasma concentration, heat profile gradients, disorientation within the plasma energy, ionization energy potential, collision frequency, microwave wave modulations, and microwave frequencies.

These controls allow for specific types of localized structural growth and/or minimize the growth of carbon in a particle orientation. As one example of tuning growth within a reactor: (1) as a hydrocarbon atom enters into a plasma zone, it will start to break C—H, C—C bonds in a particular and calculated fashion; (2) as the molecule is broken down into many C and H bonds, they become highly reactive; then (3) the materials are exposed to a higher (or lower) energy state by modulation of microwave energy in the reactor. The higher (or lower) energy states correspond to a preferred growth path. Depending on the tuning of the growth, a lattice with some relatively stronger (or relatively weaker) planes is formed. In post-processing, the resulting structured carbon breaks down along the weaker planes. The breakdown along the engineered-in weaker planes of the structured carbons facilitates molecular combination with polymers, as described above, so as to result in high-performance carbon-containing elastomers.

Figure 12:
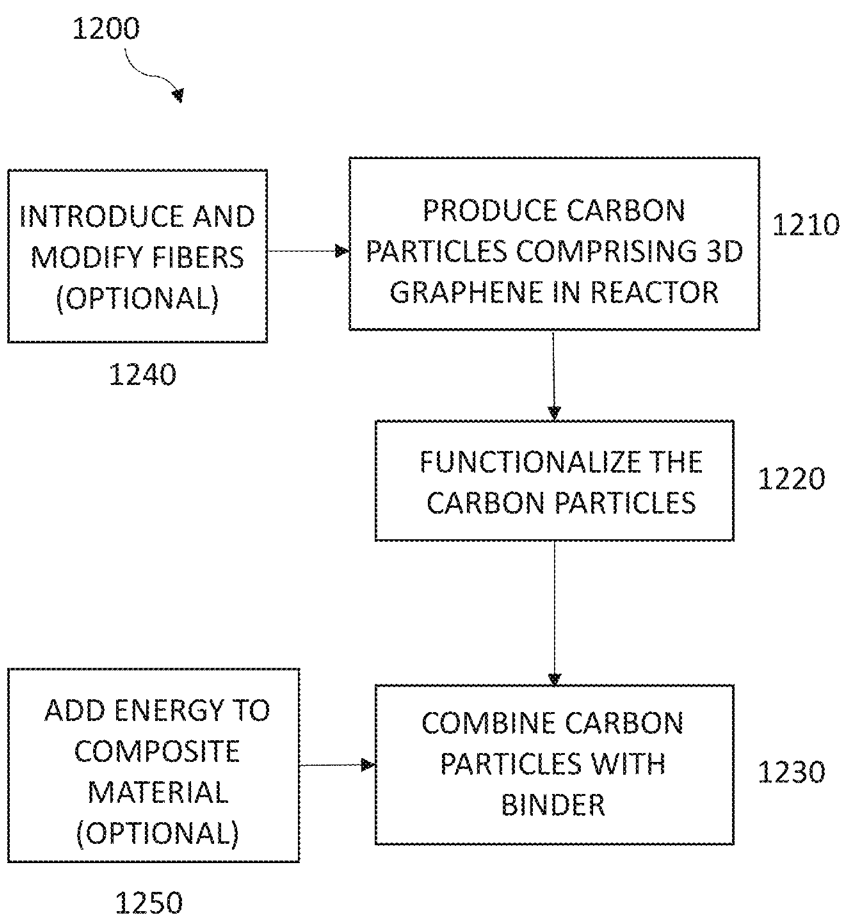
FIG. 12 is a flowchart of methods for producing composite materials, in accordance with some implementations.

FIG. 12 is a flowchart 1200 representing methods of producing composite materials, according to some implementations. Methods include producing a plurality of carbon particles in a plasma reactor in step 1210. In some implementations, the plurality of carbon particles comprises 3D graphene, where the 3D graphene comprises a pore matrix and graphene nanoplatelet sub-particles in the form of at least one of: single layer graphene (SLG), few layer graphene (FLG), or many layer graphene (MLG). The method of FIG. 12 also includes functionalizing the plurality of carbon particles in-situ in the plasma reactor to promote adhesion to a binder in step 1220 and combining the plurality of carbon particles with the binder to form a composite material in step 1230.

In some implementations, the plurality of carbon particles has a phase purity of graphene nanoplatelets of greater than 99%. The carbon particles, such as GNP sub-particles, may have a 3D structure in an X-Y plane and in a Z direction, where the graphene nanoplatelet sub-particles are connected to each other, forming the pore matrix. The 3D carbon particles may have sub-particles, such as GNP sub-particles, that are connected to each other with carbon-carbon bonds in a plurality of locations comprising edge-to-edge, edge-to-basal plane and basal plane-to-basal plane locations. The pore matrix includes voids or spaces between sub-particles or within sub-particles (such as, between layers of graphene nanoplatelets). For example, the pore matrix may include pores between the graphene nanoplatelet sub-particles or pores between layers of the FLG or MLG.

In some implementations, fibers may be introduced into the plasma reactor in step 1240 for incorporation into the carbon-resin composite. In some implementations, the fibers are modified, such as by being etched, and serve as a structure on which carbon particles are grown. For example, step 1240 may involve introducing a plurality of fibers into the plasma reactor (such as, a microwave plasma reactor), modifying the plurality of fibers within a plasma or a high temperature plume of the microwave plasma reactor, and growing the plurality of carbon particles on the modified plurality of fibers. In some implementations, the fibers may be modified in a different reactor than the reactor for in which the carbon particles are produced (such as, prior to being input into the plasma reactor). In some implementations, the carbon particles are 3D carbons, such as 3D GNPs that are grown on the fibers.

The producing of carbon particles in step 1210 may be performed using a plasma reactor as described in FIGS. 1A-1B and also may include use of other reactors such as thermal reactors to provide energy for growth of the carbon particles. In some implementations, the plasma reactor may be a high frequency plasma reactor, the high frequency being radio-frequency (RF), very high frequency (VHF), ultra-high frequency (UHF), or microwave frequency. For example, the plasma reactor may be a microwave plasma reactor having a field-enhancing waveguide and a microwave energy source, where the field-enhancing waveguide serves as a reaction chamber in which the plurality of carbon particles is produced. The field-enhancing zone has a decreasing cross-sectional area between a first cross-sectional area and a second cross-sectional area of the field-enhancing waveguide, where the second cross-sectional area is smaller than the first cross-sectional area. The reaction zone is formed by the second cross-sectional area extending along a reaction length of the field-enhancing waveguide. The microwave energy source is coupled to the field-enhancing waveguide and provides microwave energy into the first cross-sectional area of the field-enhancing zone, where the microwave energy propagates in a direction along the reaction length of the reaction zone. The microwave plasma reactor is absent of a dielectric barrier between the field-enhancing zone and the reaction zone. Methods may include inputting a hydrocarbon material (such as, gas, liquid) into the plasma reactor and controlling parameters such as plasma mode, cracking temperature and power level to control growth rate, sub-particle and particle sizes, and/or types of carbon that are grown in the reactor. Processing temperatures in the reactor to produce the carbon materials may be, for example, 3000 K or greater, with localized temperatures of 10,000 K or greater.

Methods may also include, during production of the carbon particles in step 1210, engineering defects into intentional defect locations in the carbon particles. Defects may be engineered by impinging the carbon particles with atoms (such as, by sputtering) to weaken bonds (such as, carbon-carbon bonds) between sub-particles (such as, edge-to-edge connections, edge-to-basal plane and/or basal plane-to-basal plane), where the impinging may be controlled by aspects such as an injection mode of sputtered atoms, gas particle pressure, plasma parameters (such as, plasma concentration), and microwave parameters (such as, microwave wave modulations, and microwave frequencies).

The functionalizing of carbon particles in step 1220 may include any of the methods and techniques described in this disclosure. In some implementations, the functionalizing is performed in a plasma of or a high temperature plume of the plasma reactor. In some implementations, the binder is a resin, and the plurality of carbon particles are functionalized to be compatible with the resin by promoting chemical bonding between the plurality carbon particles and the resin. Implementations may include, for example, adding functional groups to the carbon, performing surface doping or surface alloying, adding a hardening agent to the carbon particles, altering surface wettability or performing surface treatments.

In some implementations, the combining of carbon particles with a binder in step 1230 may be performed outside of the reactor after the carbon particles are produced. In some implementations, the combining of carbon particles with a binder may be performed within the reactor, during or after growth of the carbon particles. In some implementations, methods involve combining, within the plasma reactor, functionalized plurality of carbon particles with a resin to form a composite material. In some implementations, energy may be added to the composite material in step 1250 to further customize properties of the composite material. For example, methods may include adding energy to the composite material during the combining of step 1230, where the plurality of carbon particles has an average starting particle size and the energy causes the plurality of carbon particles to be reduced to an average final particle size that is less than the average starting particle size. The energy may be, for example, mechanical energy (such as, mixing), thermal energy, or high-frequency energy. Methods may also include, during production of the carbon particles in step 1210, engineering defects into intentional defect locations in the carbon particles, where the average final particle size (in adding energy to the composite material in step 1250) is determined by the intentional defect locations.

Figure 13:
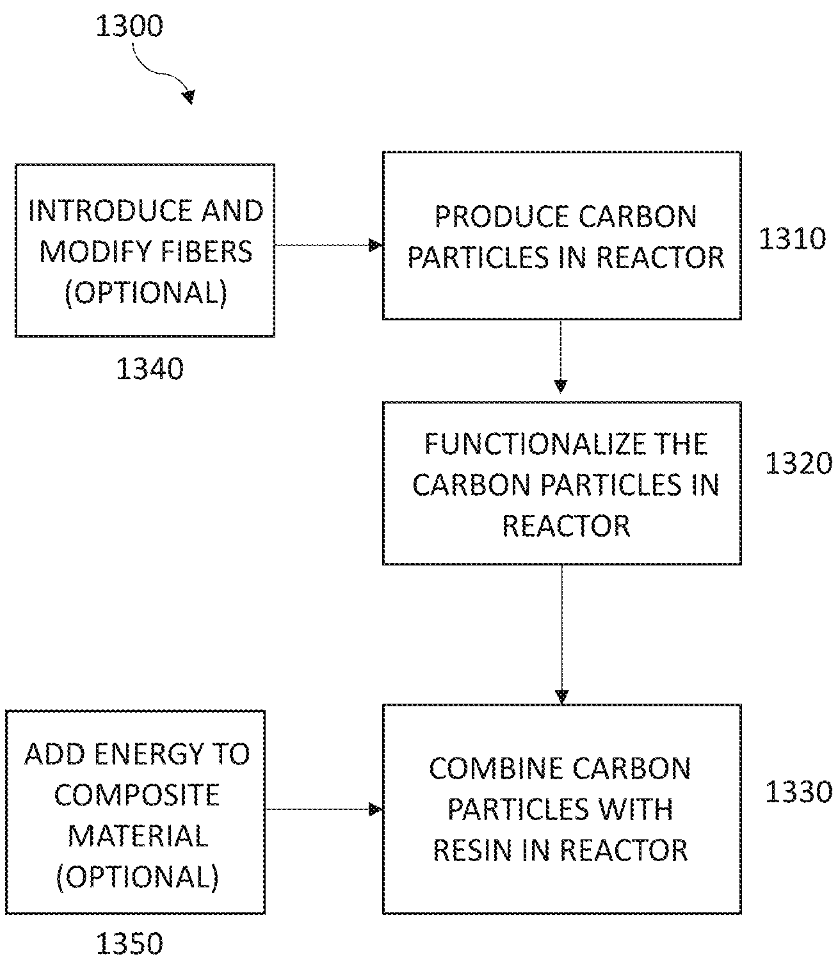
FIG. 13 is a flowchart of methods for producing composite materials, in accordance with some implementations.

FIG. 13 is a flowchart 1300 representing methods of producing a composite material, according to some implementations. Methods include producing a plurality of carbon particles in a plasma reactor in step 1310; functionalizing, in the plasma reactor, the plurality of carbon particles to promote chemical bonding with a resin in step 1320; and combining, within the plasma reactor, the functionalized plurality of carbon particles with the resin to form a composite material in step 1330. The carbon particles may be directly combined with the resin in the reactor, without contact from an external resource or without the need for human contact of the resin or carbon particles.

In some implementations, the functionalizing in step 1320 is performed in a plasma or a high temperature plume of the plasma reactor. In some implementations, the functionalizing includes oxidation, nitridation, surface doping, surface alloying, or adding a hardening agent. The functionalizing may include implementations as described in relation to FIG. 12 and throughout this disclosure.

In some implementations, step 1330 of combining carbon particles with a resin in a reactor is performed in a plasma or a high temperature plume of the plasma reactor. The combining of step 1330 may include implementations as described in relation to FIG. 12 and throughout this disclosure.

In some implementations, the plasma reactor is a microwave plasma reactor, and methods of flowchart 1300 include step 1340 of introducing a plurality of fibers into the microwave plasma reactor and modifying the plurality of fibers within a plasma or a thermal high temperature plume of the reactor, where the producing of step 1310 comprises growing the plurality of carbon particles on the modified plurality of fibers. The addition of fibers may include implementations as described in relation to FIG. 12 and throughout this disclosure.

The carbon particles produced in step 1310 may include various allotropes such as graphene, GNPs, MWSFs and CNTs, and may be 3D structured carbon materials including any of these allotropes. In some implementations, the carbon particles include 3D graphene, where the 3D graphene has a pore matrix and has graphene nanoplatelet sub-particles in the form of at least one of: single layer graphene (SLG), few layer graphene (FLG), or many layer graphene (MLG). The graphene nanoplatelet sub-particles are grown in an X-Y plane and in a Z direction, where the graphene nanoplatelets sub-particles are connected to each other. In implementations in which GNPs are produced, the plurality of carbon particles may have a phase purity of graphene nanoplatelets of greater than 99%.

In some implementations, energy may be added to the composite material in step 1350 to further customize properties of the composite material. The adding of energy in step 1350 may include implementations as described in relation to FIG. 12 and throughout this disclosure.

The producing of carbon particles in step 1310, the functionalizing in step 1320 and the combining in step 1330 may be performed using a plasma reactor as described in FIGS. 1A-1B and also may include use of other reactors such as thermal reactors to provide energy for growth of the carbon particles. As described in relation to FIG. 12, in some implementations, the plasma reactor may be a microwave plasma reactor having a field-enhancing waveguide and a microwave energy source, where the field-enhancing waveguide serves as a reaction chamber in which the plurality of carbon particles is produced. The field-enhancing zone has a decreasing cross-sectional area between a first cross-sectional area and a second cross-sectional area of the field-enhancing waveguide, where the second cross-sectional area is smaller than the first cross-sectional area. The reaction zone is formed by the second cross-sectional area extending along a reaction length of the field-enhancing waveguide. The microwave energy source is coupled to the field-enhancing waveguide and provides microwave energy into the first cross-sectional area of the field-enhancing zone, where the microwave energy propagates in a direction along the reaction length of the reaction zone. The microwave plasma reactor is absent of a dielectric barrier between the field-enhancing zone and the reaction zone.

In some implementations, methods may include formulating a monomer or choosing a resin customized to accept the plurality of carbon particles. For example, specific monomers or resins designed to bond with specific types of carbon particles (such as, graphenes, CNOs, CNTs, and 3D structures of one or more of these) and/or bond with certain functional groups may be formulated.

Some implementations include enhancing attachment of the present composite materials to a surface (such as, a metal substrate) using plasma torch systems. For example, a metal surface can be modified with carbon-infused metal layers that are created by a plasma torch to achieve a high carbon content interface to which carbon-polymer composites can be attached (such as, by fusing the metal to carbon-to-polymer bonding), thereby increasing structural strength. The carbon-infused metal layers include metal particles and carbon particles that are bonded together, which are created by ionizing at least some of the particles' atoms with a microwave plasma of a plasma torch and accelerating the metal particles and carbon particles toward the metal surface by a high electrical current. The created carbon-metal particles then deposit onto the metal surface and meld together, creating a compositionally infused bulk where carbon-metal particles continue to deposit and melt together. This carbon-loaded metal surface improves bonding of the carbon-resin composites to the metal substrate as compared to attachment of a carbon-resin composite to a metal-only surface.

Figure 14:
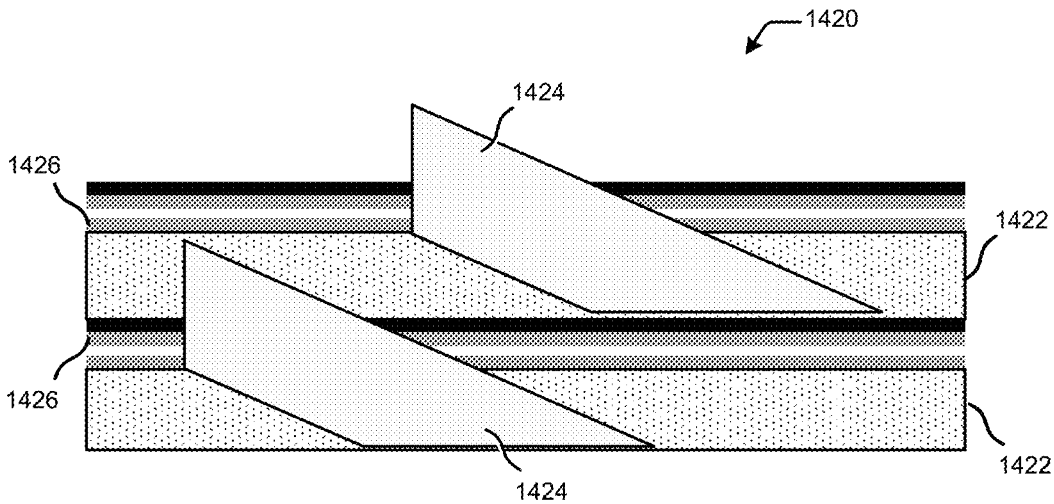
FIG. 14 shows schematics of metals incorporated with carbons for composite materials, in accordance with some implementations.

FIG. 14 represents implementations in which carbon-polymer composite materials may be used to create organo-metallic materials. Metals may be integrated onto or into the carbon structure during creation of the carbons, in which interfacial carbon is incorporated into a metal lattice. That is, the carbon structure may be within the interstitial spaces of the metal lattice structure, such as, the metals crystal structure, such as face-centered cubic or body-centered cubic crystal structures. Metals and polymers may be fused together using such organo-metallic structures, in which various percentages of carbon materials and metal can be used to create a bond between the metal and a polymer. Structure 1420 illustrates a use of such organo-metallic materials, in which carbon fiber layers 1422 are intersected by elements 1424 (such as, constructing the layers in an intersecting manner during fabrication of an end product). The elements 1424 can be metal and/or can be made of organo-metallic materials that have carbon within the crystal structure. The organo-metallic carbon-resin layers 1426 have carbon-metal integrated into resin to form a composite material, and the layers 1426 are sandwiched between the carbon fiber layers 1422 to provide a bond between the carbon fiber layers 1422 and elements 1424. With this structure, the carbon-resin layers 1426 provide an intermediary between the elements 1424 and carbon fibers 1422; that is, by creating a transition from metal to carbon-metal to polymer and promoting adhesion between the materials of structure 1420.

As indicated supra, structured carbons that substantially comport to a particular tuned size and/or a particular tuned pore size and/or a particular tuned morphology, and/or a particular phase purity promote and/or influence improvements to composite materials containing those structured carbons. Strictly as one example, a high phase purity of carbon in composite materials results in composite material performance that is substantially greater than composites made with lower phase purity of carbon.

Figure 15:
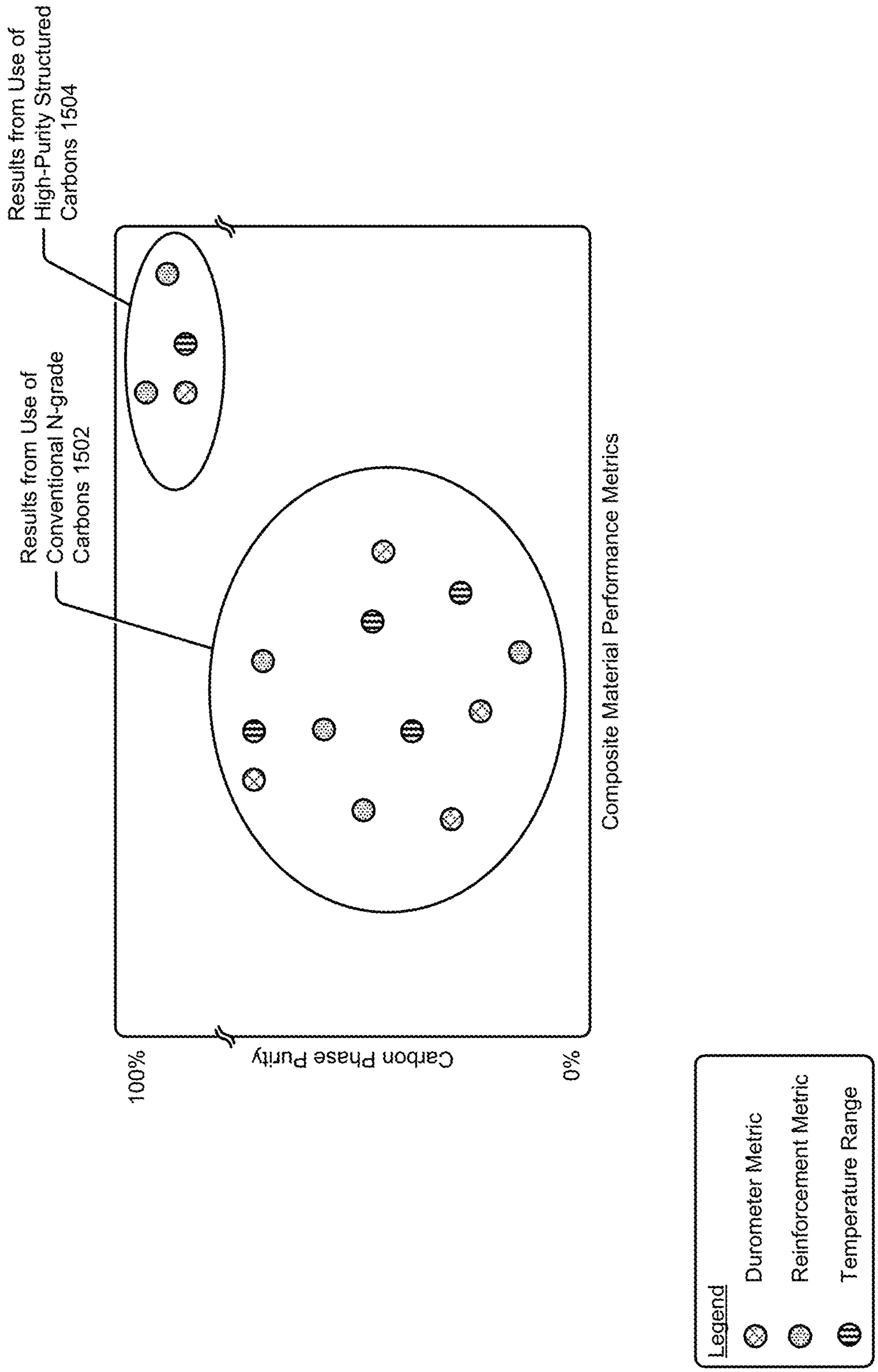
FIG. 15 shows results from use of structured, impurity-free carbons, in accordance with some implementations.

FIG. 15 shows results from use of structured, impurity-free carbons. Specifically, the chart shows a region of very high values of a reinforcement metric, of which high values correspond to a designed high purity level. As such, components manufactured using high-purity structured carbons 1504 perform significantly better as compared with components manufactured lower-purity carbons (such as, using N-grade carbons 1502).

The aspect of being impurity-free can be quantified. Specifically, the techniques such as are disclosed herein can produce impurity-free carbons to the extent that the carbon purity is 99% or greater. In some cases, the remaining 1% may contain various impurities and yet are quantifiably impurity free, at least to the 99% level of purity. One possible test to determine the total amount of impurities is to fully oxidize the sample and evaluate the affluent stream. This is further described in ASTM E2550 as well as ASTM D1619.

The lower left portion of FIG. 15 shows that lower grade carbons (such as, conventional N-grade carbons) do not provide the desired level of reinforcement. This is because conventional N-grade carbons present less surface area to support molecular interactions with the polymer. As is known in the art, the higher the interactions between polymers and carbons (such as, via site interactions, via available surface area, or via active surface area), the stronger the resulting polymer component.

One approach to increasing surface area for site interactions is to just increase surface area of conventional carbons by grinding or other mechanical processing. In practice, however, when employing grinding or other mechanical processing, the impurity level increases and thus compromises the cured elastomer. Strictly as one example, when sulfur is introduced (such as, as an unwanted impurity) the presence of sulfur inhibits curing. Incomplete or partial curing is accompanied by a decrease in crosslinking density, which in turn can lead to a less reinforcing system that can be observed (such as, by lower elastomer durometer measurements, by decreased bound rubber, by modified elongation at break, etc.).

Merely increasing surface area does not necessarily lead to an increased volume of interaction sites. This is shown and discussed as pertains to FIG. 16A

Relationship Between Surface Area and Volume of Interaction Sites

Figure 16A:
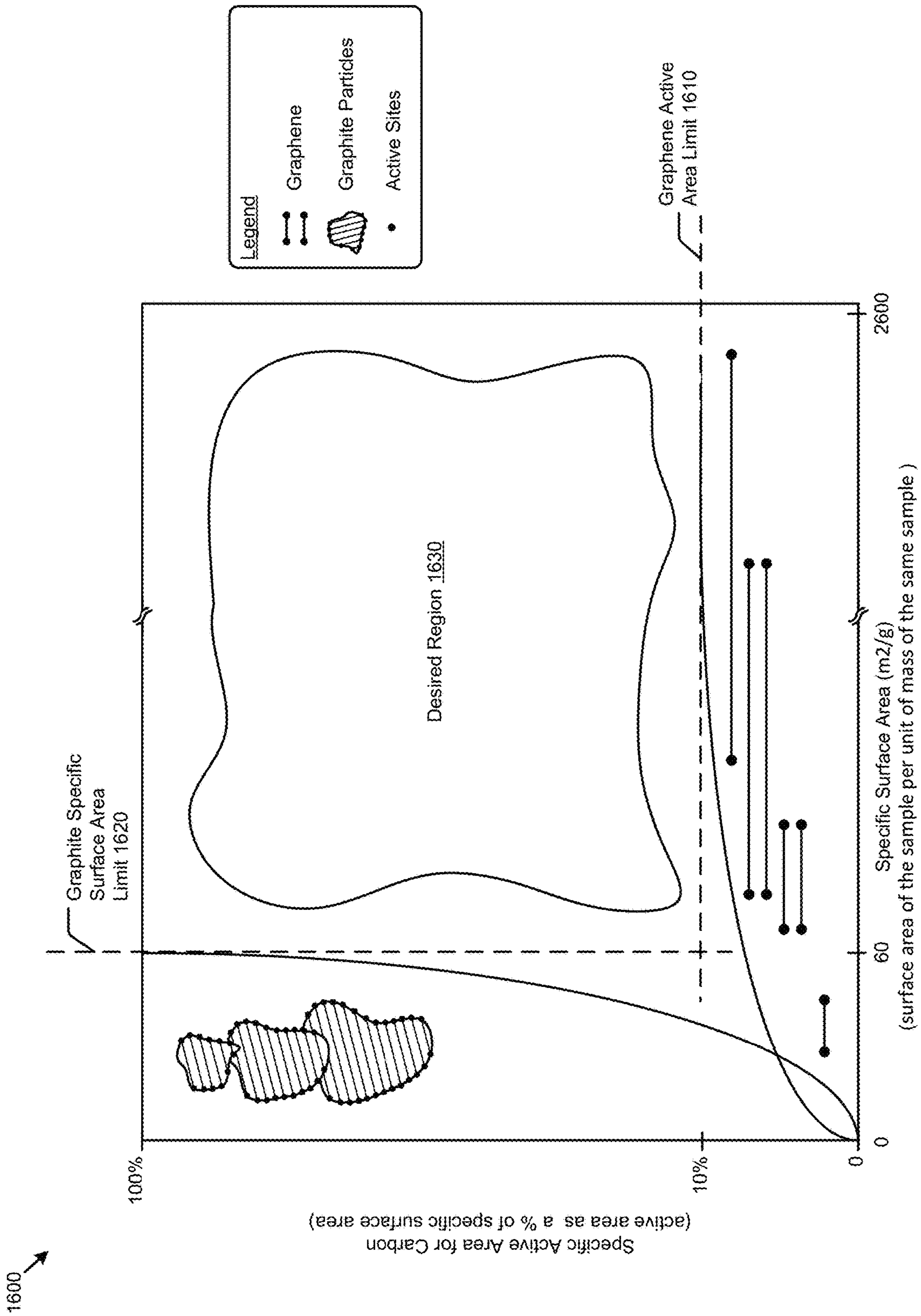
FIG. 16A shows a plot that relates a specific active area of a carbon to a given specific surface area, in accordance with some implementations.

FIG. 16A shows a bounded region on a plot 1600 that relates a specific active area (SAA) of a carbon (in any morphology) to a given specific surface area (SSA). As used herein, the specific surface area of a sample of a given material is defined as the total surface area of the sample per unit of mass of the same sample of the same material. As such, units are in area/mass. As used herein, the specific surface area of a carbon structure relates to the structure's geometry. As used herein, specific active area (SAA) of a carbon is the percentage of a corresponding SSA that is available for interaction (such as, interaction with the polymer, etc.) The figure depicts a desired region 1630 that lies above the shown graphene surface area limit 1610 and to the right of the shown graphite surface area limit 1620.

The abscissa (X-axis) represents a range of SSA to a large value corresponding to the theoretical limit of surface area of a graphitic particle, while the ordinate represents a range of SAA from 0% to 100%.

Intuitively, the specific active area of a sample of a given mass of material is defined as the total number of electrochemically-active sites in the sample divided by the total number of electrochemically-active sites that would be present in a sample of the same given mass if the mass were composed fully of single atoms of the given material. As such, values for specific active area are unitless and in the range from 0 to 1 or, equivalently, 0% to 100%.

The plot depicts graphene sheets of varying sizes. As shown, even though the specific surface area increases substantially over a range from 0 m2/g to ~2600 m2/g, no additional electrochemically active sites are formed since the electrochemically-active sites appear primarily only at the edges of the graphene sheets.

Also shown in plot 1600 are graphite particles. As shown, as the graphite particles decrease in size, they present more electrochemically-active sites. However, there is an empirical limit to the size of such graphite particles, and as such there is a limit to the surface area presented by the graphite particles. This empirical limit is shown as graphite surface area limit 1620.

On one hand, graphene can present an extremely large surface area, but is limited to a relatively small range of corresponding electrochemically active sites. On the other hand, graphite can present an extremely large number of electrochemically-active sites, but is constrained to an upper limit of surface area. Further characteristics are shown in Table 1 and Table 2.

TABLE 1

| Example 2D graphene | | |
|---|---|---|
| Material Morphology | Advantages (when used in composites) | Disadvantages (when used in composites) |
| Short sheet graphene | Good dispersion | Not enough electrochemical interaction sites to react with other materials of the composite |
| Long sheet graphene | Ease of incorporation/ handling | Poor dispersion as well as very poor electrochemical interaction with other materials of the composite |

TABLE 2

| Example 3D graphite | | |
|---|---|---|
| Material Morphology | Advantages (when used in composites) | Disadvantages (when used in composites) |
| Small particle graphite | Good dispersion | Not enough surface area to react with other materials of the composite. Also, often over-reactive and sometimes needs passivation |
| Large particle graphite | Ease of incorporation/ handling | Poor dispersion. Not enough surface area to react with other materials of the composite. Also, often over-reactive and sometimes needs passivation |

FIG. 16B1 depicts a system 1650 for synthesizing 3D carbons that are tuned to correspond to a desired morphology. As shown, a microwave chemical processing reactor is configured to interface with control system 1640. More specifically, pressures at supply gas inlet 302 and process material inlet 310 are controlled by flow control 1641, microwave energy source 304 is controlled by microwaving pulsing control 1642, temperatures in and around the FEWG 305 are controlled by temperature control 1644, and the backpressure at one or more outlets 303 are controlled by backpressure control 1645.

In addition to the foregoing examples of tunable reactor parameters 1646, multi-parameter controls 1648 are provided. The tunable reactor parameters and the multi-parameter controls serve to create conditions within the reactor. When the desired carbons exit out of one or more outlets 303, they are collected in collector 1660, after which the carbons can be used to form composites. Further details pertaining to how morphology control 1643 operates are given in FIG. 16B2, and FIG. 16B3.

FIG. 16B2 shows multi-parameter controls (such as, multi-parameter control $\mathbf{1648}_1$ and multi-parameter control $\mathbf{1648}_2$). Specifically, the figure shows a specific surface area control 1647 and a specific active area control 1649. These multi-parameter controls can be used to tune the morphology of the carbons that result from operation of the shown microwave chemical processing reactor. More specifically, carbon structures that exhibit a tuned specific surface area control and a tuned specific active area can be grown and assembled in the reactor, after which growth and assembly, the tuned morphology carbons are collected in an in-liquid collection facility 1661. The tuned morphology carbons that are intermixed within the liquid can be subjected to additional energy input (such as, microwave frequency, radio frequency, or similar energy input).

The particular implementation shown, the additional energy input is provided as microwave energy input 1671. The specific frequency and energy amplitude of the microwave energy input 1671 can be controlled using microwave frequency and energy control 1653. The microwave frequency can be controlled so as to apply energy to the tuned morphology carbons that are intermixed within the liquid without heating the liquid.

The liquid is specifically designed/chosen to support a particular chemistry. In this configuration, carbon materials can be suspended in low loss tangent fluids such that highly localized heating of aggregate materials can be achieved providing microwave energy into the collection facility for the purpose of thermal cracking of matrix materials so as to cause size reduction without causing damage to the morphological properties of the carbon materials.

The selection and concentration of dielectric loss tangent properties can be tuned to reduce the size of suspended agglomerates while not heating the fluids. This is because the suspended agglomerates are held together by weak Van der Waals or other weak forces, and thus can be easily broken apart into smaller agglomerates for subsequent dispersion.

Selective energy absorption by the materials in a collection vessel can be exploited to force one type of material or fluid onto another type of material or fluid, thus either (1) making new particles or (2) depositing particles onto existing materials. In some cases, changing the frequency of the microwave can lead to a second layer being deposited onto a first layer and so on. Controlling successive applications of energy into the collection vessel can lead to deposition of many layers of successively deposited materials.

In the implementation of FIG. 16B2, the specific surface area of the resulting carbon structure and the specific active area of the resulting carbon structure can be independently controlled through independent settings of specific surface area control 1647 and specific active area control 1649. However, in some implementations, the morphology of the carbons can be controlled through use of a multi-parameter control that coordinates the setting of the specific surface area control 1647 with the setting of the specific active area control 1649.

FIG. 16B3 shows a morphology selection technique 1670 that is implemented by one or more controls. The shown morphology control 1643 can be used to coordinate control of any one or more of the foregoing tunable reactor parameters 1646 (such as, flow control 1641, microwaving pulsing control 1642, temperature control 1644, backpressure control 1645, etc.) so as to modulate intra-reactor conditions for facilitation of a particular growth and assembly process within the reactor.

The morphology control serves to coordinate any/all of flow control 1641, microwave pulsing control 1642, temperature control 1644, and backpressure control 1645 so as to create conditions within the reactor that are conducive to formation of a particular desired morphology. Strictly as examples, morphology control 1643 might modulate intra-reactor conditions so as to facilitate a particular growth and assembly process within process material flow 311*b*.

As shown, the morphology control 1643 can be tuned to any point throughout a range from a minimum (such as, the shown “Min”) to a maximum (such as, the shown “Max”). When set to a minimum, intra-reactor conditions are conducive to forming flat graphene sheets 1651. When set to a maximum, intra-reactor conditions are conducive to forming small graphite particles. Other settings produce different morphologies throughout that range. For example, the intra-reactor conditions can be tuned to be conducive to forming graphite particles that are sized between the shown larger graphite particles 1656, and the shown smaller graphite particles 1658.

In a particular configuration, the setting of the morphology control 1643 can correspond to creation of intra-reactor conditions that are conducive to creation 3D carbon structures that exhibit a particular pore matrix and/or particular fractal dimensions that are tuned for a particular application (such as, for use in battery applications, for use in elastomer systems, for use in organometallic systems, etc.). In another particular configuration, the setting of the morphology control 1643 can correspond to creation of intra-reactor conditions that are conducive to creation 3D carbons that exhibit a scaffold structure and tuned fractal dimensions such as for use in resin-based composite applications.

Creation and Use of Crinkled Graphene Platelets

In yet another particular configuration, the setting of the morphology control 1643 can correspond to creation of intra-reactor conditions that are conducive to creation of “crinkled” (referring to the either purposefully or inadvertently organized or disorganized folding, compression, or some other type of orientation or configuration facilitating the exposure of additional active surfaces per unit of volume than in traditional substantially straight or curved graphene sheet configurations, alternative terms may also include “crumpled,” “compressed,” “compacted”, “corrugated” and/or the like) graphene platelets 1652, which are of particular benefit in thermoplastic and thermoset plastic composites. These crinkled graphene platelets 1652 are significantly different from the other shown morphologies. Use of crinkled graphene platelets 1652 thermoplastic and thermoset plastic composites yields significant performance improvements.

These crinkled graphene platelets 1652 are shown to be beneficial for thermoplastics. In part, this is because stress buildup due to coefficient of thermal expansion (CTE) mismatch between thermoplastic and a filler is lower when the polymer is mixed with crinkled graphene platelets.

Creation and Use of Ordered Carbon Scaffolds

Referring to yet another setting of the morphology control 1643, multiple reactor parameters can be controlled in coordination so as to create conditions within the reactor that are conducive to formation of ordered carbon scaffolds of varying morphological order.

One way to characterize an ordered carbon scaffold is through use of a fractal dimension metric. And one way to calculate a fractal dimension metric is by using a "box-counting" method. Specifically, and as used herein, the fractal dimension is derived by observing a certain area that is overlaid with boxes of certain sizes (box sizes). This fractal dimension is an indicator of shape complexity and surface irregularity. Larger fractal dimensions indicate more complex irregularities. The fractal dimension is defined by the following formula, where $N_\delta(F)$ is the number of square boxes of size $\delta$ necessary for covering a pattern F.

$$D = \lim_{\delta \to 0} \frac{N_\delta(F)}{\log \delta} \quad \text{(EQ. 1)}$$

To apply this equation to a SEM image, a cross-sectional SEM image of a scaffold composed of voids and carbons is divided into grid areas (such as, boxes) at regular spacing intervals of size $\delta$, and the number of boxes containing voids is counted. Then the value of $\delta$ is varied (such as, halved) and the SEM image is again divided into grid areas that are $\delta$ on edge. A double logarithmic graph is created with the number of boxes with voids counted being plotted on the vertical axis and the varying sizes of $\delta$ being plotted on the horizontal axis. The heretofore mentioned fractal dimension is determined from the slope of the curve on the double logarithmic graph.

FIG. 16B4 is a schematic showing a morphology of crinkled platelet composed of flat crystallites of various lengths (such as, La1, La2, etc.) fused together at platelet folds (such as, fold1, fold2, fold3, fold4, fold5). La is an average crystallite size estimated from Raman spectrum. The shown platelet has edges at edge1 and edge2.

FIG. 16C1 shows relationship between average crystallite size La and D:G intensities ratio of D- and G-bands in Raman spectra for several crinkle morphologies as compared to a reference. FIG. 16C2 shows relationship between average crystallite size La and 2D:G intensities ratio of 2D- and G-bands in Raman spectra for several crinkle morphologies as compared to a reference. Details of the data points on the plots of FIG. 16C1 and FIG. 16C2 are presented in Table 3.

TABLE 3

Raman Measurement Comparisons

| Carbon Sample | D:G | 2D:G | Crystallite Size La (nm) |
|---|---|---|---|
| Reference | 0.43 | 0.9 | 34.2 |
| CrinkleA | 0.39 | 0.68 | 23.89 |
| CrinkleB | 0.48 | 0.59 | 18.7 |
| CrinkleC | 0.56 | 0.49 | 14.58 |

The G-peak corresponds to the first order scattering of sp2 domains (such as, due to in-plane vibrations of carbon atoms). In contrast, the D-peak is due to the disordered regions containing sp3 carbons with associated out-of-plane vibrations. D/G intensities ratio of D- and G-bands in Raman spectra reflects a ratio of disordered regions with sp3-hybridized carbons to two-dimensional, atomic-scale, hexagonal lattice domains composed of sp2-hybridized carbons. For crinkled morphology graphenes, disordered regions are associated with the folds in the graphene sheet structure. Thus, D:G intensities ratio for such crinkled morphology graphenes reflects how crinkled the graphene sheet is.

The size of hexagonal lattice domains composed of sp2-hybridized carbons, or crystallite size La can be estimated from D:G intensities ratio. For crinkled morphology graphenes it reflects a size of domains with flat sheet morphology between disordered regions where folds occur. Larger in-plane size of sp2 domains with lower D:G ratio indicates a crinkled morphology with fewer folds.

Referring to FIG. 16C1, it represents a set of crinkled morphology graphene materials (CrinkleA, CrinkleB, CrinkleC) with different degrees of graphene sheet roughness obtained by tuning of production conditions as described above. It shows that D/G ratio drops linearly with increases in crystallite size indicating formation of fewer folds on the platelet for CrinkleA material as compared to others.

In contrast, the values for reference graphene don't follow the same trend of a decrease in D/G ratio with an increase in La. Such reference material with larger crystallite size La as compared to CrinkleA material is characterized by higher D/G ratio than CrinkleA material indicating a different morphology with increased disorder in the graphene sheet.

The 2D-band of Raman spectrum is regarded as an overtone of the D-peak. It is known that the ratio of the intensity of the 2D-mode peak to the G-mode peak (such as, the 2D/G intensity ratio) is related to the number of layers in the graphene. A higher 2D/G intensity ratio corresponds to fewer layers in multilayer graphene materials.

Referring to FIG. 16C2, it represents a relationship between average crystallite size La and 2D:G intensities ratio of 2D- and G-bands in Raman spectra for several crinkle morphologies as compared to a reference. 2D/G ratio increases linearly with increase in crystallite size indicating formation of larger crystallites with fewer layers fused together to form the platelet. The figure demonstrates that a crinkled morphology can be tuned by production conditions between less folded CrinkleA material with largest crystallite size La composed of fewer layers (highest 2D/G ratio) and more folded CrinkleC material with smallest crystallite size La composed of more layers (lowest 2D/G ratio).

Reference graphene material with larger crystallite size La compared to CrinkleA material is characterized by higher 2D/G ratio than CrinkleA material indicating a platelet morphology with longer crystallites, and even fewer layers. However as was described above and as illustrated by FIG. 16C1 this reference material composed of graphene layers with larger degree of disorder (such as, a higher D/G ratio).

There are many techniques for combining tuned morphology carbons with thermoplastic materials and/or thermoset epoxies. One particular processing flow for combining tuned morphology carbons with thermoplastic materials and/or thermoset epoxies is given in FIG. 17A.

Figure 17A:
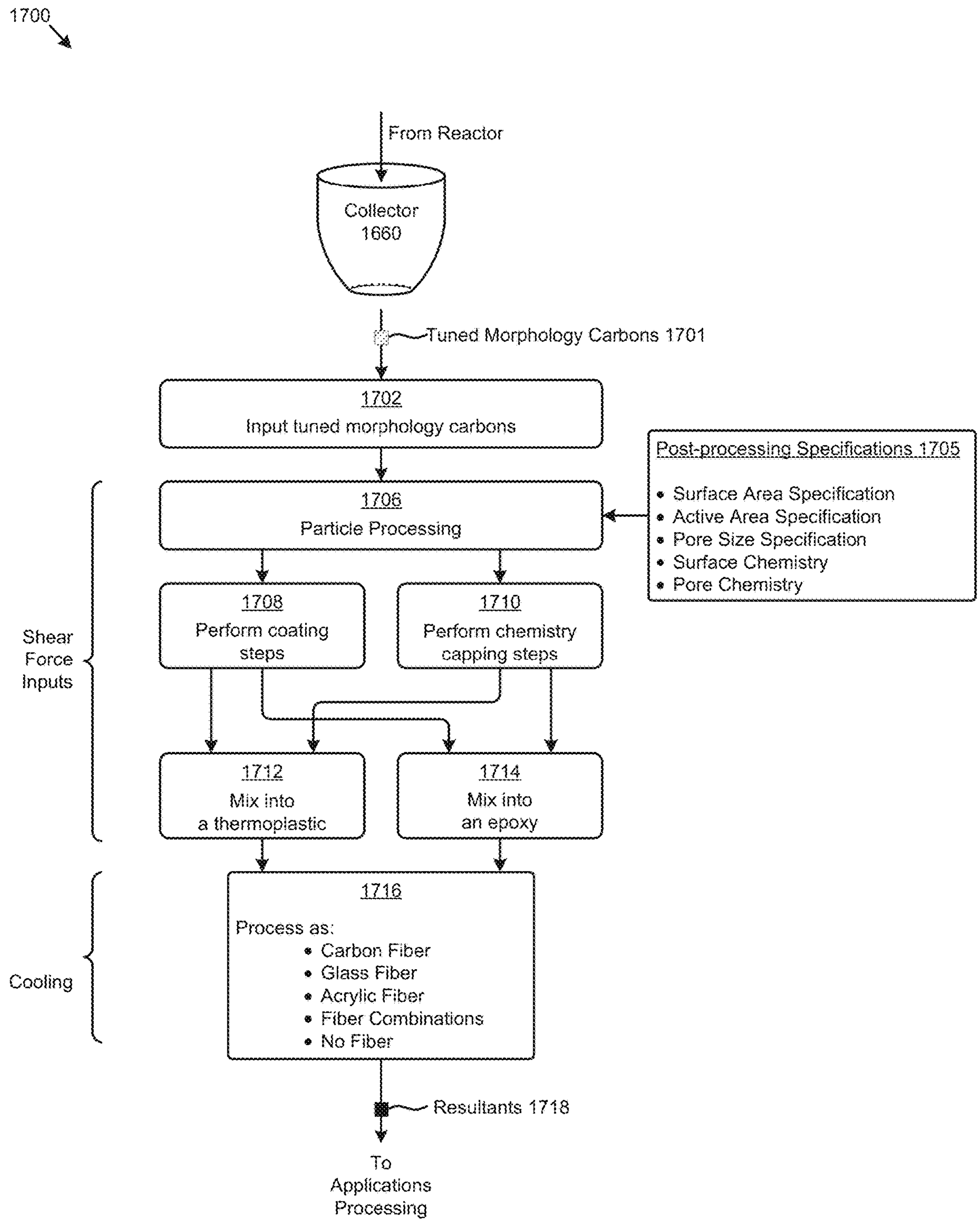
FIG. 17A shows a processing flow for processing carbon materials from a reactor and delivering composite materials for downstream processing, in accordance with some implementations.

FIG. 17A shows a processing flow 1700 for processing carbon materials from a reactor and delivering composite materials for downstream processing. As shown, tuned morphology carbons 1701 are input into the flow (step 1702). The carbons processed to achieve a specified particle size and/or a specified active area (step 1706) before being subjected to either chemical capping 1710 or coating 1708.

The processes to achieve a specified particle size and specified active area is based at least in part on post-processing specifications 1705, which may include one or more of a surface area specification, an active area specification, and/or a pore size specification.

If the flow is being carried out to result in a reinforced thermoplastic, then processing continues through step 1712. If the flow is being carried out to result in a reinforced thermoset polymer, then processing continues through step 1714. In both cases, however processing includes known-in-the-art processes (such as, processes 1716) for creating one or more of, carbon fiber (CFRES), glass fiber (GF), acrylic fiber (AF) reinforced composites, or combinations thereof. The shown flow ends as resultants 1718 (such as, reinforced thermoplastic materials or reinforced thermoset plastic materials) that are made available to various applications (such as, including but not limited to prepreg applications, molding applications, extrusion processes, etc.).

While carrying out the processing flow 1700 the materials may undergo shear forces (such as, during particle processing 1706 and during mixing). Furthermore, while carrying out the processing flow 1700 the materials may undergo cooling. The effects of applying shear forces to the materials and the effects of cooling are shown and described as pertains to FIG. 17B.

Figure 17B:
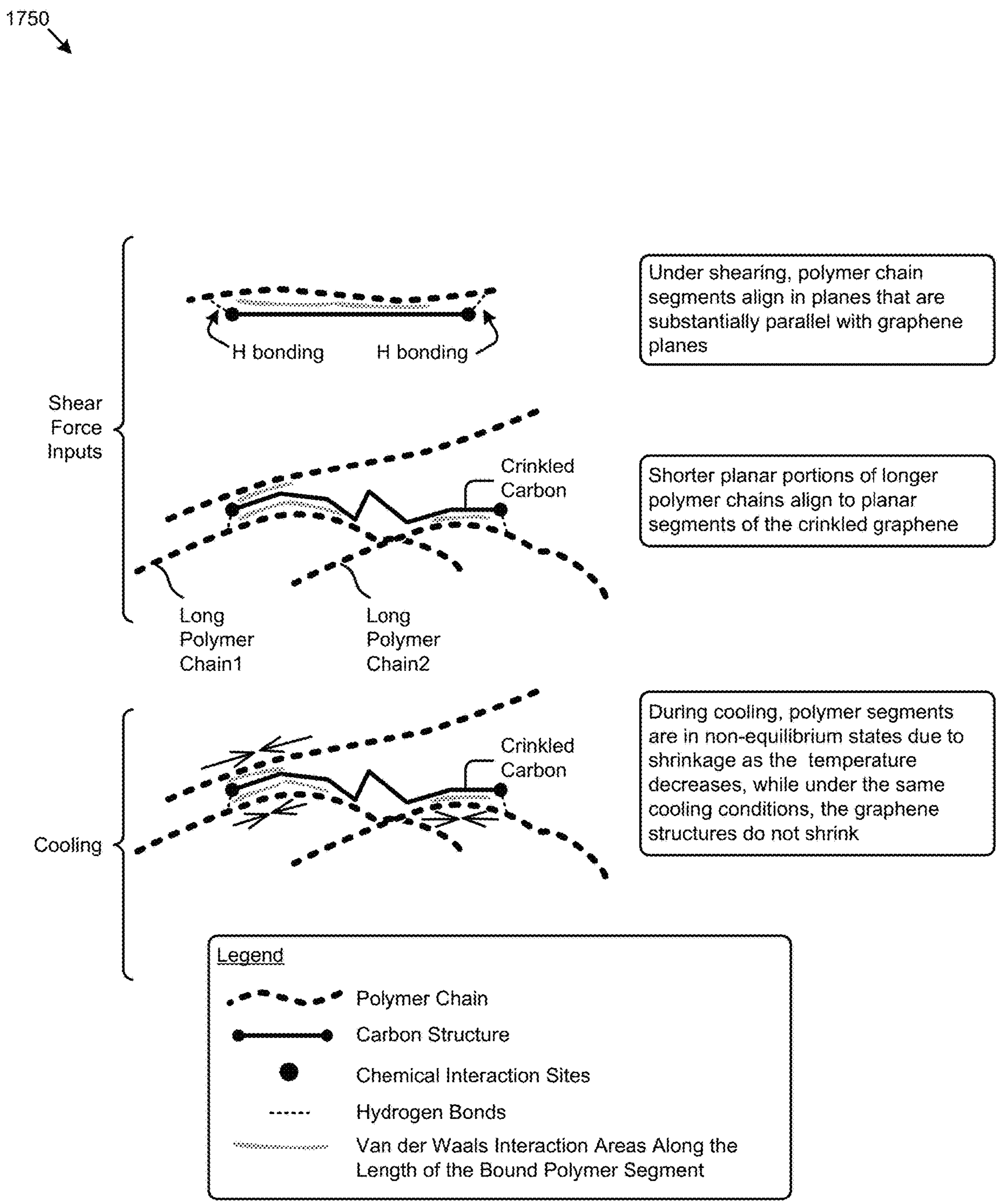
FIG. 17B shows how polymer chains and carbon structures interact when being subjected to shear force inputs and cooling.

FIG. 17B presents schematic 1750 that shows how polymer chains and carbon structures interact when being subjected to shear force inputs and cooling. Specifically, and as shown, as carbon structures (such as, graphene platelets) are being mixed with resin, polar groups at the edges of carbon structures become bound to the polar groups of the resin, usually via hydrogen bonding, or other types of bonding. Under shear force applied to the blend (such as, at milling), aggregates of the carbon material are broken into smaller aggregates, and down to the individual flakes level. For example, and as shown, highly energetic graphene surfaces freshly exposed to the resin become bound to polymer chain segments via Van der Waals interaction, thus immobilizing them on the surface. During this processing, polymer chain segments align with carbon structure's surface. For a flat platelet morphology such alignment occurs over extended area, leading to the immobilization of a long polymer chain segment. However, for crinkled morphologies, due to a change in the platelet's plane orientation at the folds, alignment occurs over much shorter areas between the platelet's folds, leading to a shorter length of the polymer chain segments bound to the surface. Thus, crinkled flake morphology leads to a shorter length of immobilized polymer chain segments.

Immobilization of the chain segments at the carbon structure's surface has significant impact on stress buildup for thermoplastics. As one example, after a thermoplastic has been blended with graphene material at temperatures above its transition temperature (Tg, meaning the glass temperature for amorphous plastics or Tc, meaning the crystallization temperature for crystalline plastics) of a given thermoplastic material, the prepared composite blend is placed into a mold, and then cooled below the aforementioned transition temperature so as to solidify the composite material. A coefficient of thermal expansion (CTE) is a measure of the volume change as material goes through transition temperature. The polymer matrix expands above its transition temperature and shrinks upon cooling. This causes re-arrangement of the chain segments, which trends toward an equilibrium chain conformation. However, if polymer chains segments are immobilized on the surface of the carbon structure, they cannot contribute to the re-arrangement, and thus remain stretched out in a non-equilibrium conformation. The remainder of the thermoplastic matrix contracts around the carbon structures, thus creating localized compression forces. However, the carbon structures do not shrink at cooling. Such mismatch in CTE of thermoplastic material and carbon structures leads to an unwanted stress concentration at the graphene/polymer interphase.

As described above and referring specifically to the case of flat platelet carbon structure morphology, long polymer chain segments are unwantedly immobilized over extended areas. Thus, it leads to unwanted large stress concentration areas that form at cooling below transition point. In contrast, in accordance with the herein-disclosed crinkled graphene platelets, and due to (1) shorter lengths of immobilized polymer chain segments, and (2) due to redistribution of polymer chain segments over the surface of crinkled graphene platelets. As such, crinkled graphene platelet morphologies serve to decrease the size of stress concentration areas, and to redistribute them over a larger volume. This, in turn minimizes stress cracks propagation under deformation, which in turn leads to improvement in mechanical properties of the resultant polymer-containing composite.

Figure 18A:
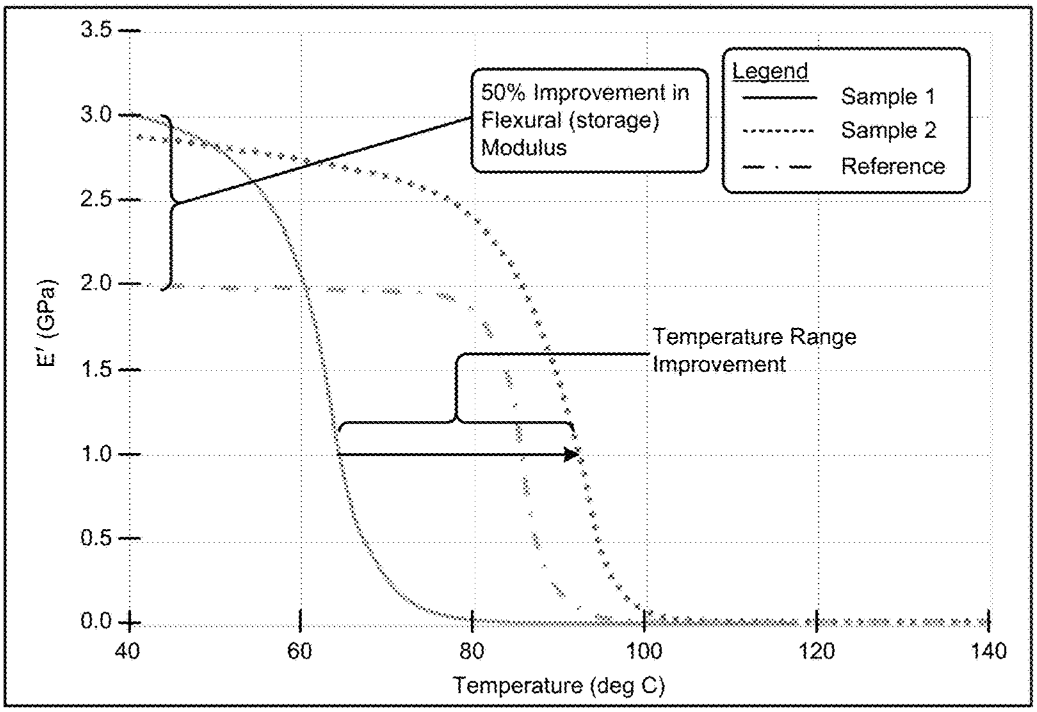
FIG. 18A and FIG. 18B show DMA analysis of samples of composites made with tuned carbons for comparison to a reference composite, in accordance with some implementations.
Figure 18B:
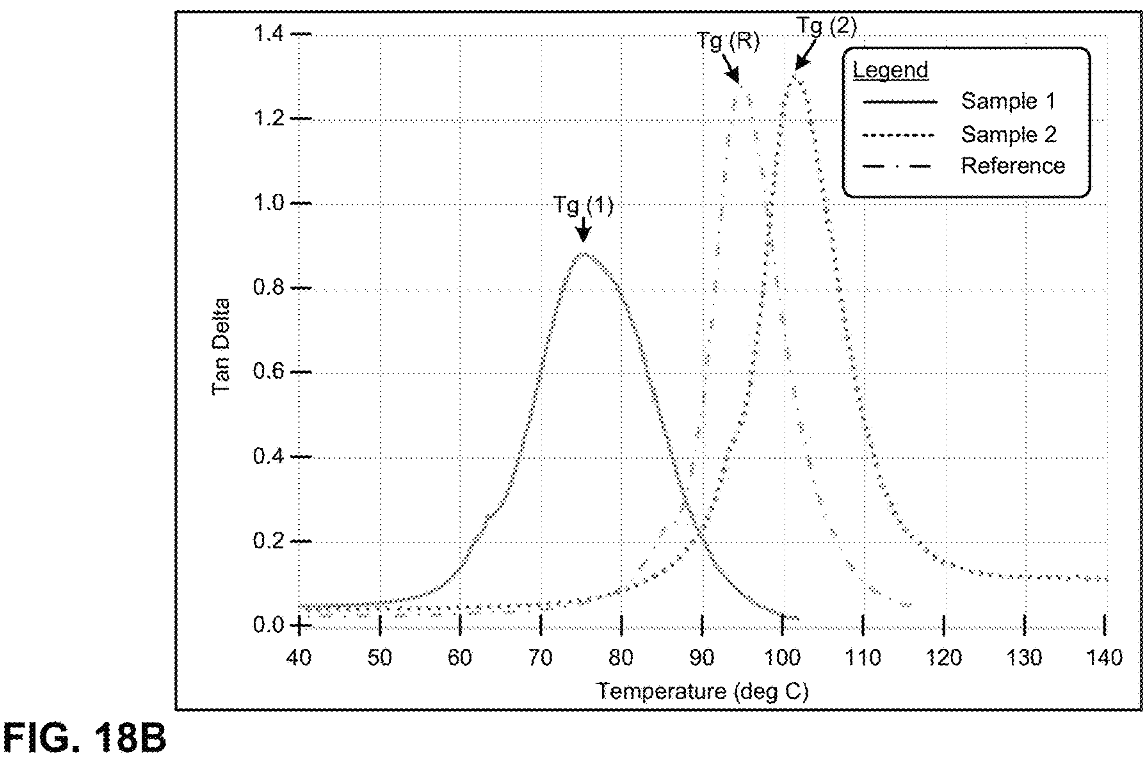

Some of such improvements in mechanical properties of the resultant polymer-containing composite are shown and discussed as pertains to FIG. 18A and FIG. 18B.

Improvement in Mechanical Characteristics of Sample Thermosets

FIG. 18A and FIG. 18B show DMA analysis of samples for comparison to a reference composite. The DMA analysis includes the viscoelastic properties and glass transition temperature of cured system as a function of temperature. FIG. 18A shows improvement in storage modulus over a reference sample when using carbons of the present disclosure. Specifically, and as shown, Sample 1 exhibits a flexural (storage) modulus of about 3.0 Gigapascals (GPa) which is a 50% improvement in flexural (storage) modulus as compared with a neat epoxy reference sample at 50° C. Sample 2 also exhibits approximately 50% improvement in flexural (storage) modulus as compared with a neat epoxy reference sample at 50° C., and this improvement is exhibited to varying degrees over a wide range of temperatures, at least up to about 100° C. However, while both sample 1 and sample 2 have almost similar storage modulus at the beginning of the test, later sample 1 starts to deform earlier and shows lower linear viscoelastic range compared with sample 2 with increasing temperature ramp. This is because the sample 2 has stronger filler/resin surface interaction due to a better dispersion of carbon particles in the resin. Such improved dispersion quality of the herein-disclosed 3D carbons is due to increased compatibility with the resin, leading to stronger resin/carbon interphase interactions.

FIG. 18B shows a change in glass transition temperature referred to as, Tg, over a reference sample when using carbons of the present disclosure. Higher Tg of sample 2 Tg(2) is associated with higher crosslinking density and lower free volume, as well as uniform dispersion of carbon particles in a matrix. These factors restrict polymer chain movement, and higher temperature required to provide enough kinetic energy to polymer chain segments to change conformation. However, the lower Tg for sample 1 Tg(1) can be a result of a plasticizing effect, or poor dispersion of carbon in the matrix. Incorporation of covalently, ionically, or Van der Waals bound steric stabilizing ligands at the surface of graphene in a form of only a few carbon atoms in length (n=about 5 to about 9), to oligomeric species with about 10 to about 20 carbon atoms in length would lead to improved dispersion stability, miscibility with epoxy resin, and improved curing degree. However, such steric stabilizers may soften the resin, effectively decreasing Tg transition. On the other hand, same decrease in Tg may be a result of poor carbon dispersion quality, because carbon aggregates where carbon particles loosely bound together, would deform easier under applied stress then a composite system with strong binding between resin and carbon particles.

As illustrated in FIG. 18B, and specifically as applies for Sample 2, a combination of good dispersion quality, minimized plasticizing effect (if steric stabilizers are used), high cross-linking degree and a low free volume is required for simultaneous improvement in E' (storage modulus) and Tg. The Sample 2 exhibits an improved operating range as compared to a neat epoxy reference sample. This is because, the herein-disclosed 3D carbons allow for increased compatibility of resin/catalyst/fiber interactions, which in turn results in densely cross-linked thermoset composite with optimal carbon dispersion within the said composite so as to increase (or in some cases, maximize) resin/carbon/fiber interphase interactions.

FIG. 18C1 shows improvements in both compressive and flex strength over a reference sample when using carbons of the present disclosure. Specifically, it represents the examples of carbon fiber reinforced epoxy composites wherein the carbon fiber material has an intermediate modulus 7 (IM7) 6,000 (6 k), filament count tow plain weave (PW) with a fabric average weight (F.A.W.) of 200 grams per square meter (gsm) along with a resin content (RC) of 35 weight %. As shown, the composite designated as "Epoxy Crinkle" exhibits both improved compressive strength and flex strength as compared to an "Epoxy Neat" reference sample. This is because, the herein-disclosed 3D carbons allow for increased compatibility with resin, catalyst, and fiber, leading to improved interactions.

FIG. 18C2 shows improvements in both interlaminar shear strength (ILSS) and flex strength over a reference sample when using carbons of the present disclosure. Specifically, and as shown, the composite made from carbons designated as Crinkle1 shows a few percent improvement in both interlaminar shear strength (ILSS) and flex strength, whereas the composite made from carbons designated as Crinkle3 shows a 5% to 12% improvement in both ILSSS and flex strength, whereas the composite made from carbons designated as Crinkle5 shows a 12% to 20% improvement in ILSSS and flex strength, respectively. This is because, the herein-disclosed 3D carbons allow for increased compatibility of resin/catalyst/fiber interactions, which in turn results in improved energy dissipation between the carbon fiber and polymer. This increased adhesion allows for multiple composite properties (such as, flex, ILSS, compression, etc.) to take place within the same system. Improvements can be directly correlated to the morphology of the graphene (such as, the crinkle characteristics), which in turn result from settings of the aforementioned tunable reactor parameters.

Improvement in Mechanical Characteristics of Sample Thermoplastics

Figure 19A:
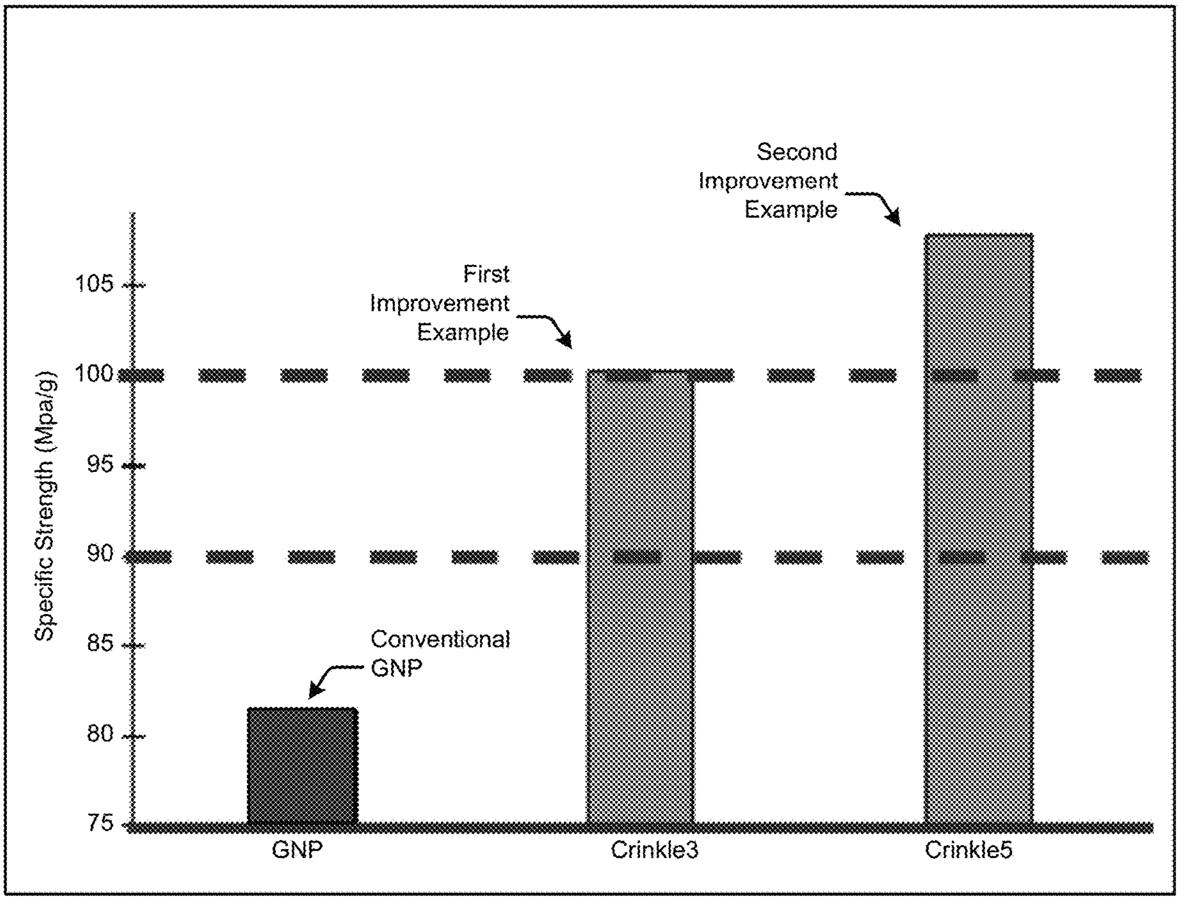
FIG. 19A shows improvements in mechanical characteristics of sample thermoplastics as relates to the selection of carbons having particular fractal dimension, in accordance with some implementations.

FIG. 19A shows improvements in mechanical characteristics of sample thermoplastics as relates to the selection of carbons having particular fractal dimension. Specifically, the specific strength of a resultant thermoplastic is highly correlated to the fractal dimension of the carbon that is added to a nylon system. In the first improvement example shown, carbon of type crinkle3 having a fractal dimension of approximately >2.5 is added to the nylon system. In the second improvement example shown, carbon of type Crinkle5 having a fractal dimension of approximately >2.5 is added to the nylon system. The first improvement example exhibits a 100 Mpa/g specific strength, whereas the second improvement example exhibits a 108 Mpa/g specific strength. For reference, a control nylon system has a specific strength of 75 Mpa/g along with the addition of prior art materials to increase the strength to ~82 Mpa/g.

FIG. 19B1 shows improvements in flex modulus as the carbon loading volume is increased. An increase in flexural modulus relates directly to good dispersion. That is, a set material additive with a specific modulus (along with other properties) of itself that is added to a lower modulus system, will increase the total system modulus if dispersion quality is good. Outside of the first order modulus of the filler material, such as, graphene, a key attribute is the dispersion quality of said material. Without adequate dispersion, a high modulus material added to a lower modulus material will not exhibit a significant increase in modulus. As seen in the graph 19B00, it can be seen that of the three materials that were added, the dispersion quality of Crinkle3 shows excellent dispersion at higher loadings than others. At around 5% loading, Crinkle1 shows superior dispersion with plateau suggesting the interfacial sites between graphene and polymer are saturated, such as, active surface area is set for the added material and not modifying during the processes.

FIG. 19B2 shows improvements in flex strength as the carbon loading volume is increased. Improvements in strength are specifically related to surface interaction, that is the surface of the graphene/graphene-type and/or combination thereof (or other materials) interacts well with the polymer. Interactions that could take place could be but not limited to, physical and/or chemical attractions. Within this diagram, Crinkle1 shows the highest increase in flexural strength owes to its superior surface interaction and minimal aggregation within the nylon system. The linear nature of Crinkle2 relates directly to the scaling of the available surface area to interact with the specific polymer system and it also shows minimal aggregation. The extent of increases in strength is a function of the modulus of the additive materials.

Figure 19C:
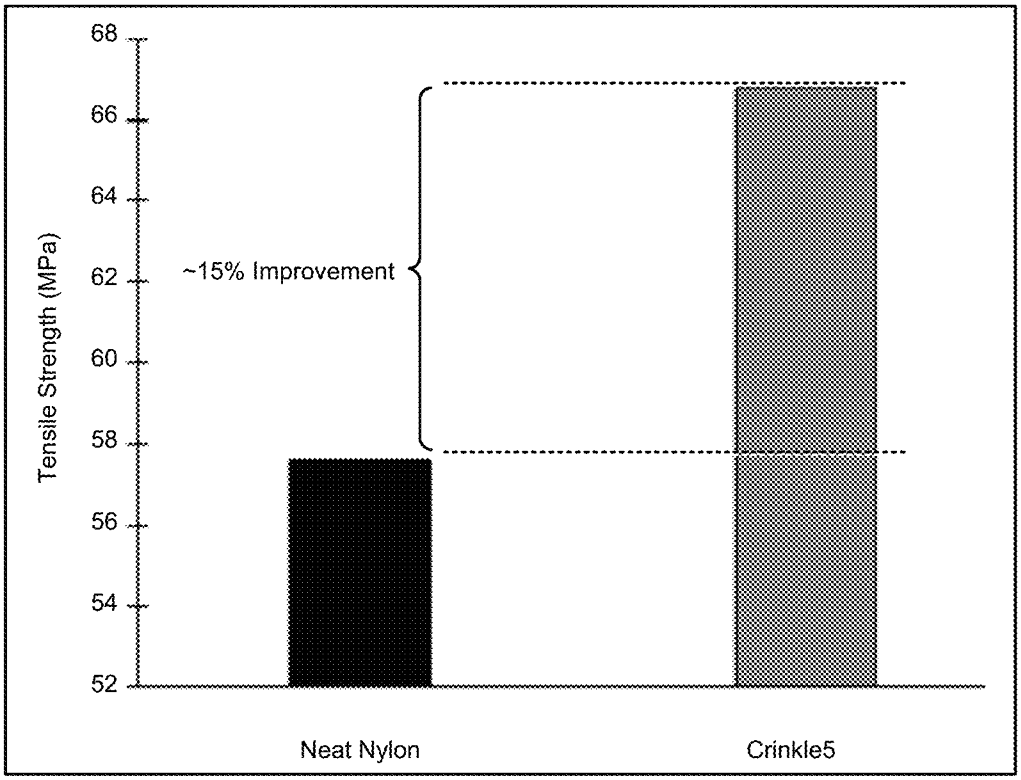
FIG. 19C shows improvements in tensile strength over a reference sample when using carbons of the present disclosure, and in accordance with some implementations.

FIG. 19C show improvements in tensile strength over a reference sample when using carbons of the present disclosure. Specifically, and as shown, the tensile strength of the composite materials is improved by about 15% over the reference sample using carbons of Crinkle5 type. This increase is related to the dispersion quality of the material. If dispersion quality is poor, additional voids and stress concentration sites would be added to the system, limiting the tensile strength. In addition, the increased thermal dissipation of the Crinkle5 modifies the cooling rate of the nylon system and recrystallizes the polymer, exhibiting an increase in tensile strength.

Figure 20:
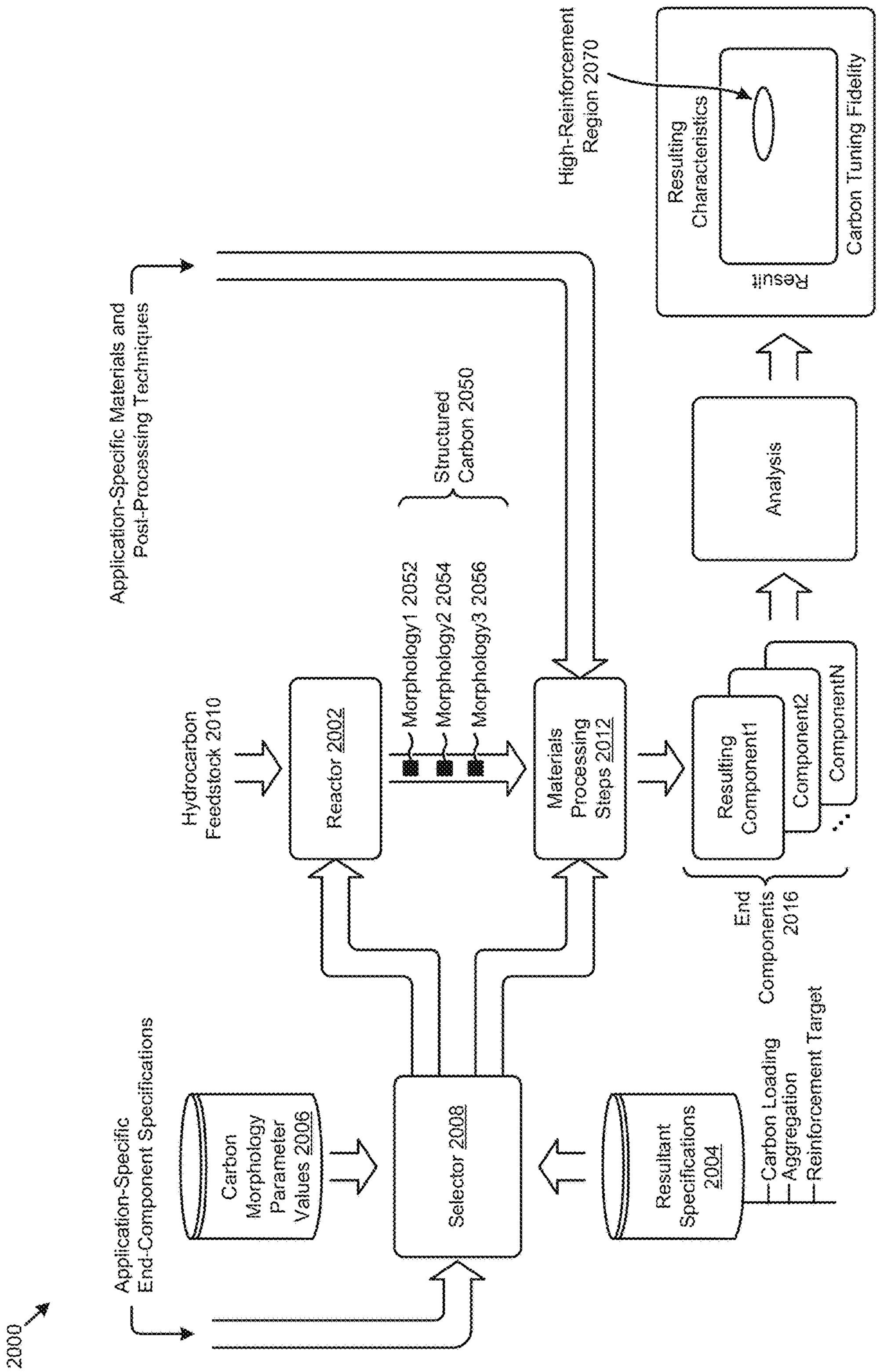
FIG. 20 presents a system for making carbons of a specified morphology and using them in composite systems, in accordance with some implementations.

FIG. 20 presents a system 2000 for making carbons of a specified morphology and using them in composite systems. Specifically, the system of FIG. 20 illustrates aspects pertaining to making carbon-containing materials that comport with a selected morphology.

In the example system shown, hydrocarbon feedstock 2010 is fed into reactor 2002. The reactor is controlled in whole or in part by carbon morphology parameters values 2006 that correspond to resultant specifications 2004, which resultant specifications and respective parameter values are determined in whole or in part by selector 2008. Selector 2008 can be controlled by a user and/or can be controlled by a processing recipe, and/or can be controlled by sets of one or more application-specific end-component specifications. The reactor produces structured carbon 2050, which structured carbon may be in the form of carbons of morphology1 2052, or of morphology2 2054, or of morphology3 2056 and/or any combinations thereof. The specific characteristics of the structured carbon 2050 can be controlled in whole or in part by foregoing tunable reactor parameters 1646 (see FIG. 16B1).

High Purity/Sulfur-Free Carbons

The foregoing carbon structures have no residual sulfur content. This characteristic is distinguished from furnace grades of carbon black because, unlike furnace grades of carbon black, the foregoing carbon structures are not derived from oil. Furthermore, the foregoing carbon structures are distinguished from thermal grades of carbon black even though thermal grades of carbon black are derived from natural gas. The foregoing carbon structures perform better than thermal black when used in various applications. Specifically, thermal black carbons exhibit poor reinforcement and tensile building properties when used in elastomer applications, whereas the foregoing carbon structures exhibit improved reinforcement and tensile building properties when used in elastomer applications.

The structured carbons are combined in various forms of materials processing steps 2012. Strictly as examples, the post processing can include mixing the structured carbons with other materials (such as, mixing with application-specific materials), and/or the post processing can include mixing the structured carbons using a myriad of post-processing techniques (such as, application-specific post-processing techniques). In some cases, the structured carbons are altered during the post processing. For example, structured carbons can shear during mixing.

The ability to engineer a structured carbon material to comport to a specific tunable morphology, is dominant in producing the improvements discussed herein.

In the shown system 2000, results of such post processing can include end components 2016 (such as, resulting component1, resulting component2, . . . , resulting componentN). Some or all of the end components are analyzed to determine resulting characteristics. Strictly as one example, resulting characteristics of the end components 2016 can include exhibition of extremely high reinforcement (such as, in the shown high-reinforcement region 2070).

The foregoing system can support many processes or recipes. In example implementations, steps include: (1) processing a hydrocarbon gas in a reactor to produce hydrogen and structured carbon (such as, wherein the structured carbon is at least 99% free of elements other than carbon or hydrogen), and (2) introducing the structured carbon into a mixture of additional materials to produce a composite material.

In some formulations, the mixture of the additional materials comprises any one or more of a polymer, a filler, a cure agent, or an acceptor.

In some processing recipes, the structured carbon has at least one tuned fracture plane. Such structured carbons that have a tuned fracture plane are mixed with additional materials in quantities and formulations that are controlled based at least in part on application-specific end-component specifications. Moreover, the specific fracture planes of the structured carbons can be controlled during processing within the reactor. Strictly as one example, by controlling intra-reactor conditions, the structured carbons that are produced can be tuned to have fracture planes that are engineered for specific end-product characteristics. For example, in one formulation, the structured carbons produced in the reactor 2002 are purposely not compressed before use in post processing.

In some engineered formulations, the fracture planes between molecules are defined by the occurrence or absence of bonded/non-bonded carbon atoms. A fracture plane can be engineered by introducing weakly bonded area(s) into the lattice by introducing a gap or a hole, or by introducing a dangling bond. These weakly bonded area(s) can be purposely caused by introduction of non-carbon chemicals into the system to form different bonds. For example, by introducing a measured amount of oxygen into the reactor during formation of the structured carbons, weaker C—O bonds (such as, weaker than C—C bonds) can be formed in the lattice. Since the energy associated with each type of bond is different, the planar structure of the lattice can be engineered for intentional failure at a specific location or plane or area.

Whereas in some formulations, defects are to be removed, in some formulations such as described above, defects (such as, lower energy bonds) are purposely engineered-in to ensure the critical length of the final material has a specific strength-to-length ratio.

Purposely engineered-in defects result from tuning the growth of the carbon structure. Such tuning can be accomplished by controlling process conditions such as gas flow rate, residence time, flow velocity, Mach number, hydrocarbon concentration and the like, to name but a few. Other process conditions that can be controlled so as to tune the growth of a lattice include plasma specific conditions such as plasma concentration, heat profile gradients, disorientation within the plasma energy, ionization energy potential, collision frequency, microwave wave modulations, microwave frequencies, etc.

These controls allow for specific types of localized structural growth and/or minimize the growth of carbon in a particle orientation. As one example of tuning growth within a reactor: (1) as a hydrocarbon atom enters into a plasma zone, it will start to break C—H, C—C bonds in a particular and calculated fashion; (2) as the molecule is broken down into many C and H bonds, they become highly reactive; then (3) the materials are exposed to a higher (or lower) energy state by modulation of microwave energy in the reactor. The higher (or lower) energy states correspond to a preferred growth path. Depending on the tuning of the growth, a lattice with some relatively stronger (or relatively weaker) planes is formed. In post processing, the resulting structured carbon breaks down along the weaker planes. The breakdown along the engineered-in weaker planes of the structured carbons facilitates molecular combination with polymers so as to result in high-performance carbon-containing elastomers.

Other Implementations

Implementation A is a composite material comprising (i) a polymer, (ii) additional reinforcement (such as, fibers), and (iii) a graphene-containing material that is mixed into the polymer, wherein the graphene-containing material exhibits a specific surface area of at least 20 m2/g and a specific active area of at least 2% of the specific surface area.

In a variation of implementation A, the composite material exhibits a tensile strength greater than 300 Megapascals. In another variation of implementation A, the composite material exhibits a compression strength greater than 400 Megapascals. In another variation of implementation A, the composite material exhibits a flexural strength of greater than 400 Megapascals. In another variation of implementation A, the composite material exhibits an in plain shear strength is less than 200 Megapascals. In another variation of implementation A, the composite material exhibits an interlaminar shear strength greater than 25 Megapascals. In another variation of implementation A, the composite material exhibits a flexural modulus of greater than 50 Gigapascals. In another variation of implementation A, the composite material exhibits an improvement in mechanical, thermal or electrical properties over the composite in absence of the graphene-containing material.

Implementation B is a composite material comprising (i) a polymer, (ii) additional reinforcement (such as, fibers), and (iii) a graphene-containing material that is mixed into the polymer, wherein the graphene-containing material exhibits a specific surface area of at least 40 m2/g and a specific active area of at least 4% of the specific surface area.

In a variation of implementation B, the composite material exhibits a tensile strength greater than 300 Megapascals. In another variation of implementation B, the composite material exhibits a compression strength greater than 400 Megapascals. In another variation of implementation B, the composite material exhibits a flexural strength of greater than 400 Megapascals. In another variation of implementation B, the composite material exhibits an in plain shear strength is less than 200 Megapascals. In another variation of implementation B, the composite material exhibits an interlaminar shear strength greater than 25 Megapascals. In another variation of implementation B, the composite material exhibits a flexural modulus of greater than 50 Gigapascals. In another variation of implementation B, the composite material exhibits an improvement in mechanical, thermal or electrical properties over the composite in absence of the graphene-containing material.

Figure 21:
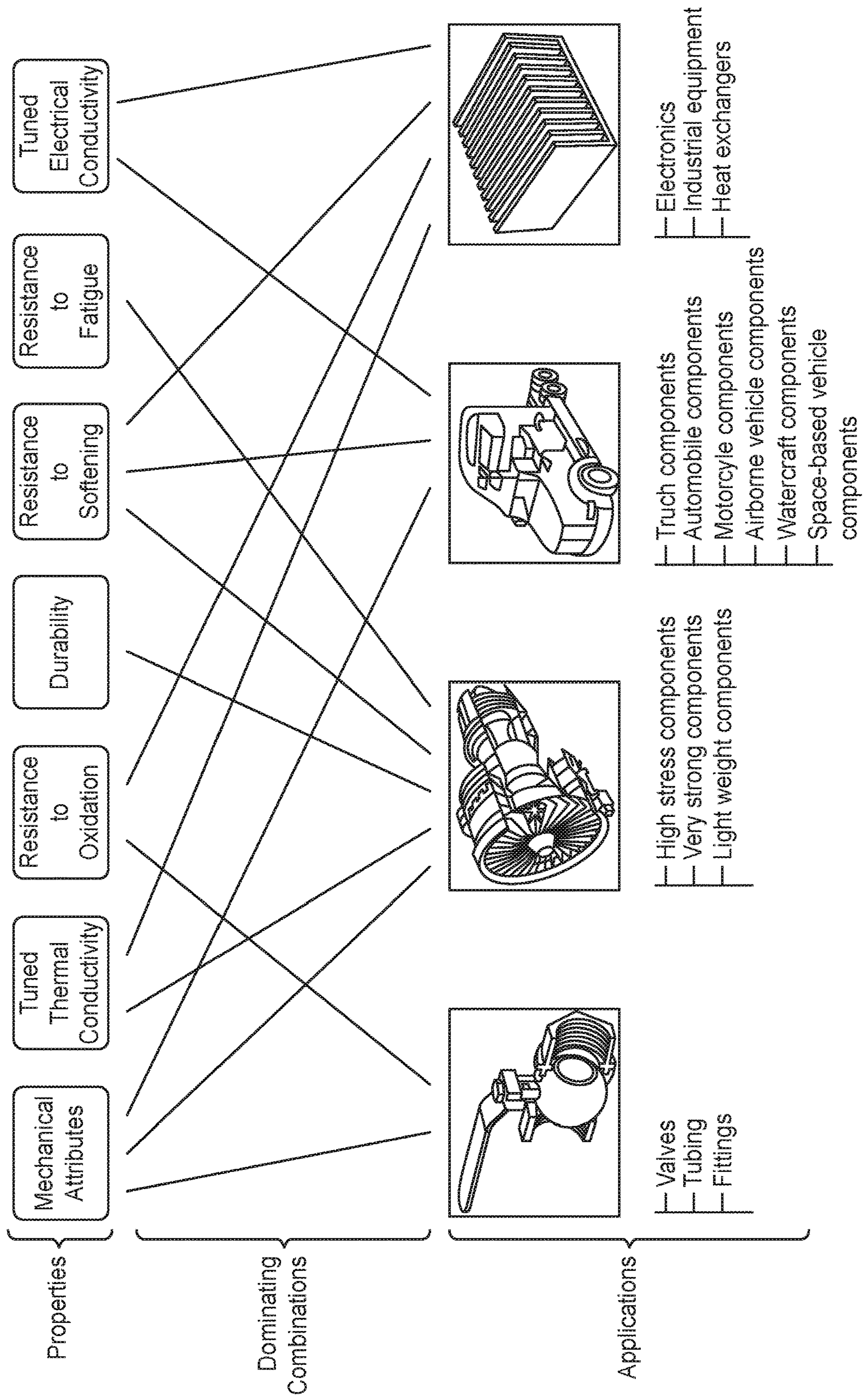
FIG. 21 depicts various properties of thermoplastics and thermosets as used in the shown applications, in accordance with some implementations.

FIG. 21 depicts various properties of thermoplastics and thermosets as used in the shown applications. The shown properties include mechanical attributes, thermal conductivity, resistance to oxidation, durability, resistance to softening at high temperatures, resistance to fatigue, and electrical conductivity. Individual ones and/or combinations of these parameters become dominant when selecting a particular thermoplastic or thermoset for a particular application.

Strictly as an example, resistance to oxidation might be a dominant parameter when selecting a thermoplastic or thermoset for use in making corrosion-resistant valves. As another example, when selecting particular thermoplastics and thermosets to be used in the manufacture aircraft components, mechanical attributes such as a strength-to-weight ratio might be a dominating mechanical attribute. The component might also need to exhibit a very high resistance to system fatigue.

Typically, thermoplastics and thermosets exhibit not only the aforementioned properties but also are less dense than alternative materials. A lower density of a carbon-loaded thermoplastic often corresponds to a lower weight for a formed component as compared with the same component made from the of the same thermoplastic without carbon loading. As such, truck parts (such as cab components, as shown), automobile parts (such as doors fenders, roof panels, etc.), motorcycle parts, bicycle parts as well as various components (such as structural members) of airborne vehicles, and/or watercraft, and/or space-based vehicles or platforms can avail of the lower weight-to-strength ratio of thermoplastics and thermosets of the present disclosure.

As another example, thermoplastics and thermosets often exhibit exceptionally low thermal conductivity such that structural members formed of thermoplastics and thermosets can be used in high-temperature applications (such as heat sinks for electronics, industrial heat exchangers, etc.) where thermal isolation is demanded.

In certain implementations, one set of properties may dominate other properties. For example, the surface of a space-based vehicle (such as a satellite) might be required to be highly-reflective to a range of electromagnet, while at the same time, the surface of the space-based vehicle might be required to be thermally isolating (such as thermally non-conducting). The foregoing tuning techniques accommodate such situations where a particular desired property (such as reflectivity) dominates the tuning of the microwave reactor so as to produce a substantially reflective surface, even at the expense of other properties.

The properties as shown and described as pertains to FIG. 21 are merely examples. Additional properties and/or combinations of properties might be demanded or desirable in various applications, and these additional properties are exhibited in resultant materials based on tuning of inputs and controls of the microwave reactor. Strictly as examples of the foregoing additional properties, such properties and/or combinations of properties might include or be related to a strength-to-weight metric, and/or a specific density, and/or mechanical toughness, and/or sheer strength, and/or flex strength, etc.

Additionally, in implementations of the present disclosure, processing steps and materials made from a combination of a thermal reactor and a microwave reactor may enable even further materials properties of high value. Additional implementations include injection molding of 3D carbon-resin materials. Such implementations include injection processing for composite 3D carbon matrix materials, injection processing for functionalized 3D carbon matrix materials, and injection processing for functionalized 3D carbon matrix materials mixed with nanomaterials. Other implementations include functionalized 3D carbon matrix materials in energy storage devices, such as those used in batteries for high capacity, in fuel cells for high efficiency, and in flow batteries for high efficiency.

Each example has been provided by way of explanation of the present technology, not as a limitation of the present technology. In fact, while the specification has been described in detail with respect to specific implementations of the invention, it will be appreciated that those skilled in the art, upon attaining an understanding of the foregoing, may readily conceive of alterations to, variations of, and equivalents to these implementations. For instance, features illustrated or described as part of one implementation may be used with another implementation to yield a still further implementation. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A composite material comprising:

a polymer; and a graphene-containing material having a specific surface area (SSA) of at least approximately 60 $m^2/g$, at least 1% of the SSA combined into the polymer, wherein the composite material has a glass transition temperature that is at least 10% greater than a glass transition temperature of the polymer in absence of the graphene-containing material.

2. The composite material of claim 1, wherein the composite material has a storage modulus of at least approximately 2.5 GPa at approximately 50 degrees Celsius.

3. The composite material of claim 1, wherein the composite material has a maximum tan delta of approximately 1.5.

4. The composite material of claim 1, wherein the composite material has a maximum tan delta greater than approximately 0.25.

5. The composite material of claim 1, wherein the composite material has a 30% higher storage modulus than the polymer in absence of the graphene-containing material.

6. The composite material of claim 1, wherein the composite material has a glass transition temperature higher than approximately 30 degrees Celsius.

7. The composite material of claim 1, wherein the composite material has a glass transition temperature that is at least equal to a glass transition temperature of the polymer independent of the graphene-containing material.

8. The composite material of claim 1, wherein the graphene-containing material has a fractal dimension greater than approximately 1.0.

9. The composite material of claim 1, wherein the graphene-containing material has an individual platelet layer count between approximately 2 and 25 layers.

10. The composite material of claim 1, wherein the graphene-containing material has D/G ratio of Raman band intensities between approximately 0.3 and 1.

11. The composite material of claim 1, wherein the graphene-containing material has oxygen-containing species between approximately 0.2% and 5%.

12. The composite material of claim 1, wherein the graphene-containing material has oxygen-containing species of less than approximately 10%.

13. The composite material of claim 1, wherein the graphene-containing material has particle sizes between approximately 100 nanometers and 1.0 micron.

14. The composite material of claim 1, wherein the graphene-containing material has particle sizes between approximately 200 nanometers and 5 microns.

* * * * *